United States Patent
Fukuzaki et al.

(10) Patent No.: US 8,847,141 B2
(45) Date of Patent: Sep. 30, 2014

(54) PHOTOELECTRIC CONVERSION ELEMENT, PRODUCTION METHOD THEREOF, PHOTOSENSOR, IMAGING DEVICE AND THEIR DRIVING METHOD

(75) Inventors: Eiji Fukuzaki, Kanagawa (JP); Kimiatsu Nomura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 427 days.

(21) Appl. No.: 13/376,089

(22) PCT Filed: Jun. 3, 2010

(86) PCT No.: PCT/JP2010/059409
§ 371 (c)(1),
(2), (4) Date: Dec. 2, 2011

(87) PCT Pub. No.: WO2010/140645
PCT Pub. Date: Dec. 9, 2010

(65) Prior Publication Data
US 2012/0080585 A1 Apr. 5, 2012

(30) Foreign Application Priority Data

Jun. 3, 2009 (JP) .................................. 2009-134017
Jan. 28, 2010 (JP) .................................. 2010-017477
Mar. 31, 2010 (JP) .................................. 2010-084412

(51) Int. Cl.
*H01L 51/46* (2006.01)
*H01L 27/146* (2006.01)
(Continued)

(52) U.S. Cl.
CPC ...... *H01L 27/14632* (2013.01); *H01L 27/1462* (2013.01); *H01L 51/0094* (2013.01); *B82Y 10/00* (2013.01); *H01L 51/4253* (2013.01); *H01L 51/0047* (2013.01); *H01L 51/0074* (2013.01); *H01L 51/005* (2013.01); *H01L 51/0072* (2013.01); *H01L 51/0073* (2013.01); *H01L 27/14647* (2013.01)

USPC .......................................... 250/214.1; 257/40

(58) Field of Classification Search
USPC .............. 250/214.1, 214 R; 257/40, E51.012, 257/E51.026; 438/82; 540/576; 544/102; 546/104; 548/406, 440; 549/4
See application file for complete search history.

(56) References Cited

U.S. PATENT DOCUMENTS 6,649,772 B2    11/2003   Lin et al.
7,683,365 B2 *   3/2010   Nii ................... 257/40
(Continued)

FOREIGN PATENT DOCUMENTS

CN          1762182 A      4/2006
EP          1 970 976 A1   9/2008
(Continued)

OTHER PUBLICATIONS

Extended European Search Report dated Apr. 12, 2013 in European Application No. 10783427.7.
(Continued)

*Primary Examiner* — Seung C Sohn
(74) *Attorney, Agent, or Firm* — Sughrue Mion, PLLC

(57) ABSTRACT

To provide a photoelectric conversion element capable of functioning as a photoelectric conversion element when a compound having a specific structure is applied to the photoelectric conversion element, causing the element to exhibit a low dark current, and reducing the range of increase in the dark current even when the element is heat-treated, and an imaging device equipped with such a photoelectric conversion element. A photoelectric conversion element having a photoelectric conversion film which is sandwiched between a transparent electrically conductive film and an electrically conductive film and contains a photoelectric conversion layer and an electron blocking layer, wherein the electron blocking layer contains a compound having, as a substituent, a substituted amino group containing three or more ring structures.

18 Claims, 2 Drawing Sheets

(51) Int. Cl.
  *H01L 51/00* (2006.01)
  *B82Y 10/00* (2011.01)
  *H01L 51/42* (2006.01)

(56) References Cited

U.S. PATENT DOCUMENTS

| | | | |
|---|---|---|---|
| 8,022,395 B2 * | 9/2011 | Hioki et al. | 257/40 |
| 8,378,336 B2 * | 2/2013 | Kitamura | 257/40 |
| 8,378,339 B2 * | 2/2013 | Nomura et al. | 257/40 |
| 2003/0157364 A1 | 8/2003 | Senoo et al. | |
| 2005/0221124 A1 | 10/2005 | Hwang et al. | |
| 2006/0180806 A1 | 8/2006 | Arakane et al. | |
| 2007/0063156 A1 | 3/2007 | Hayashi | |
| 2007/0085051 A1 | 4/2007 | Sohn et al. | |
| 2008/0035965 A1 | 2/2008 | Hayashi et al. | |
| 2008/0220285 A1 | 9/2008 | Vestweber et al. | |
| 2009/0050881 A1 | 2/2009 | Hayashi | |
| 2009/0096360 A1 | 4/2009 | Tanaka et al. | |
| 2011/0063485 A1 * | 3/2011 | Nomura et al. | 348/294 |

FOREIGN PATENT DOCUMENTS

| | | |
|---|---|---|
| JP | 11-35532 A | 2/1999 |
| JP | 3508984 B2 | 1/2004 |
| JP | 2005-290000 A | 10/2005 |
| JP | 2007-081203 A | 3/2007 |
| JP | 2007-123707 A | 5/2007 |
| JP | 2008-72090 A | 3/2008 |
| JP | 2008-545630 A | 12/2008 |
| JP | 2009-49278 A | 3/2009 |
| TW | 200417279 A | 9/2004 |
| WO | WO 2004/066685 A1 | 8/2004 |
| WO | 2007-115665 A1 | 5/2007 |
| WO | WO 2007/077810 A1 | 7/2007 |
| WO | WO 2008/035571 A1 | 3/2008 |
| WO | WO 2008/090912 A1 | 7/2008 |

OTHER PUBLICATIONS

International Search Report (PCT/ISA/210) dated Sep. 21, 2010, issued in International Application No. PCT/JP2010/059409.
Written Opinion (PCT/ISA/237) dated Sep. 21, 2010, issued in International Application No. PCT/JP2010/059409.
Office Action dated Feb. 26, 2013 in Japanese Patent Application No. 2011-068257.
Office Action dated Feb. 26, 2013 in Japanese Patent Application No. 2011-068258.
Keiji Noine et al, "Bifluorene compounds containing carbazole and/or diphenylamine groups and their bipolar charge transport properties in organic light emitting devices", Organic Electronics, vol. 11, 2010, pp. 717-723.
Office Action dated Feb. 18, 2014 issued by the Japanese Patent Office in counterpart Japanese Patent Application No. 2010-127391.
Jiun-Yi Shen, et al., "Ambipolar Conductive 2, 7-Carbazole Derivatives for Electroluminescent Devices," Advanced Functional Materials, Feb. 5, 2007, vol. 17, Issue 6, pp. 983-995.
Office Action dated Oct. 25, 2013 issued by the State Intellectual Property Office of P.R. China in corresponding Chinese Application No. 201080024598.8.
Office Action dated Apr. 21, 2014 issued by the State Intellectual Property Office of People's Republic China in counterpart Chinese Patent Application No. 201080024598.8.
Office Action from the Japanese Patent Office dated May 13, 2014, in Japanese application No. 2010-127391.
Office Action issued on Jun. 6, 2014 from Taiwanese Patent Office in a Taiwanese Application No. 99117958.

* cited by examiner

PHOTOELECTRIC CONVERSION ELEMENT, PRODUCTION METHOD THEREOF, PHOTOSENSOR, IMAGING DEVICE AND THEIR DRIVING METHOD

TECHNICAL FIELD

The present invention relates to a photoelectric conversion element, a production method thereof, a photosensor, an imaging device and their driving method. The present invention also relates to a compound useful as a material for photoelectric conversion elements.

BACKGROUND ART

As for the solid-state imaging device, there is widely used a flat light-receiving device where photoelectric conversion sites are two-dimensionally arrayed in a semiconductor to form pixels and a signal generated by photoelectric conversion in each pixel is charge-transferred and read out through a CCD or CMOS circuit. The conventional photoelectric conversion site generally used is a photodiode part formed using PN junction in a semiconductor such as Si.

In recent years, fabrication of a multipixel device is proceeding, and the pixel size and in turn, the area of a photodiode part become small, which causes problems of reduction in the aperture ratio, reduction in the light collection efficiency and the resulting reduction in the sensitivity. As for the measure to increase the aperture ratio and the like, studies are being made on a solid-state imaging device having an organic photoelectric conversion film using an organic material.

A technique of introducing a bulk heterojunction structure using a fullerene or a fullerene derivative into the organic photoelectric conversion film so as to bring out high photoelectric conversion efficiency (high exciton dissociation efficiency) is known. For example, Patent Document 1 discloses a photoelectric conversion film containing a fullerene or a fullerene derivative.

The organic photoelectric conversion element used in a solar cell has a purpose of collecting electric power and therefore, an external electric field is not applied, but the photoelectric conversion element used as a visible light sensor of a solid-state imaging device needs to maximize the photoelectric conversion efficiency and a voltage is sometimes externally applied so as to improve the photoelectric conversion efficiency or enhance the response speed.

When a voltage is externally applied so as to improve the photoelectric conversion efficiency or enhance the response speed, injection of a hole or an electron from an electrode is generated due to an external electric field, and this disadvantageously increases the dark current.

Many of materials usually used as an electrode in a photoelectric conversion element have a work function (WF) of around 4.5 eV (for example, ITO) and, for example, in the case of using a fullerene ($C_{60}$) as the material of the photoelectric conversion film, an energy gap between WF of the electrode and LUMO of the fullerene ($C_{60}$) becomes small, as a result, particularly an electron is liable to be injected from the electrode into the photoelectric conversion film and a significant increase of dark current is caused.

As regards the prevention of an increase in the dark current due to an injected current, a technique of providing a charge blocking layer to suppress the injection of an electric charge into the photoelectric conversion layer, thereby efficiently blocking an injected carrier and reducing the dark current, is disclosed (Patent Document 2).

In Patent Documents 1 and 2, heat resistance becoming an important factor in practice is not referred to, and a chemical structure having high heat resistance is not sufficiently described.

Patent Documents 3 to 6 disclose an organic material having a hole transporting property, such as fluorene and carbazole, but are silent on a photoelectric conversion element and also lacking sufficient description regarding dark current and heat resistance.

Patent Document 7 discloses an organic material having a fluorene skeleton, but this material is used in a dye-sensitized solar cell and since the characteristics required of a solar cell differ from those required of a photoelectric conversion element aiming at an imaging device component, unlike the present invention, description regarding dark current and heat resistance is insufficient.

Also, in the case of producing a film by using the compound described in Patent Document 7, generation of a grain boundary by crystallization due to low amorphous property and formation of unevenness on the film surface may occur, and this material is not suited as a material of a photoelectric conversion element aiming at a photosensor, an imaging device or the like.

PRIOR ART DOCUMENTS

Patent Documents

Patent Document 1: JP-A-2007-123707 (the term "JP-A" as used herein means an "unexamined published Japanese patent application")
Patent Document 2: JP-A-2008-72090
Patent Document 3: JP-A-2005-290000
Patent Document 4: Japanese Patent 3,508,984
Patent Document 5: JP-A-2005-290000
Patent Document 6: U.S. Pat. No. 6,649,772
Patent Document 7: JP-A-2007-115665

SUMMARY OF THE INVENTION

Problems that the Invention is to Solve

In order to realize high photoelectric conversion efficiency and high-speed responsivity, the material for a photoelectric conversion element is required to have not only a blocking ability to the injection of an electric charge from the electrode for reducing the dark current but also high charge transportability enabling transfer of an electric charge generated in the photoelectric conversion film to the electrode. In a photoelectric conversion element using a material with poor charge transportability, a photocurrent is not observed. Furthermore, considering the storability and application to a production process including a heating step such as placement of a color filter, placement of a protective film or soldering of the element, the material for a photoelectric conversion element needs to have high heat resistance.

That is, in the case of a photoelectric conversion element material having a diarylamine partial skeleton utilizing hole transport, the material must be designed to satisfy small Ea (electron affinity) value, high hole transporting property and high heat resistance, and the configuration is greatly restricted so as to satisfy these requirements.

In addition, molecular design for allowing the position of energy level to take a preferred value must be considered so that the material can be appropriately used in the element configuration.

When a material with a small Ip (ionization potential) value and a material with a large Ea value (for example, fullerene $C_{60}$) are put into contact, an electric charge (electron, hole) is generated in LUMO of the material layer having a large Ea value from HOMO of the material layer having a small Ip value within the photoelectric conversion element due to thermal excitation, as a result, a dark current causing noise is increased. The Ip of the electron blocking layer in contact with fullerene $C_{60}$ must be sufficiently large and at the same time, needs to be small enough to receive a hole without barriers from HOMO of the material transporting a hole in the bulk heterojunction layer of fullerene $C_{60}$. That is, the Ip of the electron blocking layer must be designed to be a fairly limited value, and a large restriction has to be further set on the material design whose latitude is originally narrow.

The present invention has been made to improve these problems, and an object of the present invention is to provide a photoelectric conversion element capable of functioning as a photoelectric conversion element when applied to a photoelectric conversion element, exhibiting a low dark current and reducing the range of increase in the dark current even when the element is heat-treated, and an imaging device equipped with such a photoelectric conversion element.

Another object of the present invention is to provide a compound suitable for formation of an electron blocking layer in a photoelectric conversion element capable of decreasing the increase of dark current and reducing the range of increase in the dark current even when the element is heat-treated.

Means for Solving the Problems

As a result of intensive studies, the present invention has found that the above-described object can be attained by using a compound having a specific structure.

The compound represented by formula (F-1) is a compound where fused diarylamines (the substituent represented by formula (A-1)) are connected through the following divalent linking group (D-1). Conventionally, a structure where fused diarylamines are connected through a linking group (D-2) has been studied as an electron blocking layer material, and the conventional electron blocking layer material has high charge collection efficiency, high-speed responsivity and low dark current characteristics but lacks sufficient heat resistance. In order to improve the heat resistance, a technique of, for example, increasing the molecular weight to strengthen the interaction between molecules (intermolecular force), or introducing many fused ring structures to decrease the degree of freedom of molecules, is generally employed. However, in a material having large interaction or a material taking a fused ring structure, a p-conjugated system is widely spread and the material readily interacts with a photoelectric conversion layer containing a material having deep Ea (large Ea) to form a source charge at the interface and increase the dark current. Also, for suppressing the intermolecular interaction and increasing the molecular weight, a steric hindrance may be imparted, but an excessively bulky substituent working out to a steric hindrance leads to reduction in the charge transportability, and the high-speed responsivity of the obtained device is impaired. For this reason, containing many bulky substituents is supposed to be undesired. However, in the present invention, condensed diarylamines (the substituent represented by formula (A-1)) are connected through the following divalent linking group (D-1), whereby the heat resistance can be enhanced without impairing high charge collection efficiency, high-speed responsivity and low dark current characteristics.

The compound represented by formula (F-1) where fused diarylamines are connected through the linking group (D-1) can increase the molecular weight and enhance the heat resistance, compared with an electron blocking material where fused diarylamines are connected through (D-2). Also, the bond between skeletons is twisted to break the conjugated system and this is presumed to allow for no interaction with the photoelectric conversion layer and keep the dark current low. Furthermore, the diarylamine structure as a charge transport unit is introduced not into the inside of the molecular but into both ends and therefore, the compound is considered to have high charge transportability.

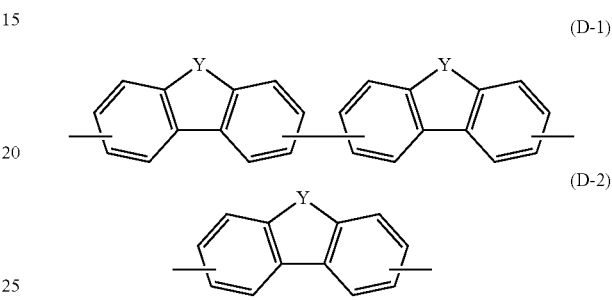

(wherein each Y independently represents a carbon atom, a nitrogen atom, an oxygen atom, a sulfur atom or a silicon atom, which may further have a substituent).

In addition, the positions to which the linking group (D-1) and the substituent represented by formula (A-1) are connected, and the substitution position and kind of the substituent (alkyl group) have been studied to increase the heat resistance of the electron blocking layer without causing reduction in the response speed. It is considered that by finding the optimal points of connection position, substitution position and kind, a strong effect of suppressing the interaction with the photoelectric conversion layer and increasing the molecular weight to strengthen the intermolecular force between compounds represented by formula (F-1) is obtained and the heat resistance is enhanced.

That is, the objects above can be attained by the following techniques.

[1] A photoelectric conversion element having a photoelectric conversion film which is sandwiched between a transparent electrically conductive film and an electrically conductive film and contains a photoelectric conversion layer and an electron blocking layer, wherein the electron blocking layer contains a compound represented by the following formula (F-1):

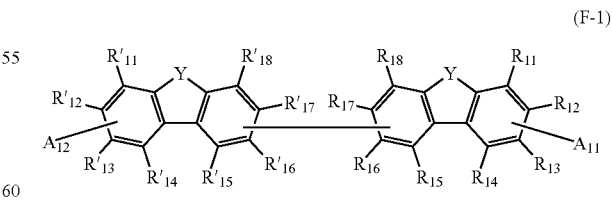

(wherein each of $R_{11}$ to $R_{18}$ and $R'_{11}$ to $R'_{18}$ independently represents a hydrogen atom, a halogen atom, an alkyl group, an aryl group, a heterocyclic group, a hydroxyl group, an amino group or a mercapto group, which may further have a substituent, any one of $R_{15}$ to $R_{18}$ is connected to any one of $R'_{15}$ to $R'_{18}$ through a single bond, each of $A_{11}$ and $A_{12}$ independently represents a substituent represented by the following formula (A-1) and substitutes as any one of $R_{11}$ to $R_{14}$ and $R_{11}$ to $R'_{14}$, and each Y independently represents a carbon atom, a nitrogen atom, an oxygen atom, a sulfur atom or a silicon atom, which may further have a substituent);

Formula (A-1)

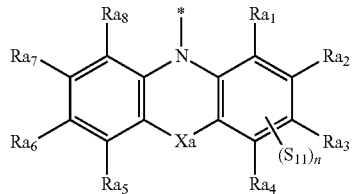

(wherein each of $Ra_1$ to $Ra_8$ independently represents a hydrogen atom, a halogen atom, an alkyl group, an aryl group or a heterocyclic group, which may further have a substituent, * represents the bonding position, Xa represents a single bond, an oxygen atom, a sulfur atom, an alkylene group, a silylene group, an alkenylene group, a cycloalkylene group, a cycloalkenylene group, an arylene group, a divalent heterocyclic group or an imino group, which may further have a substituent, each $S_{11}$ independently represents the following substituent ($S_{11}$) and substitutes as any one of $Ra_1$ to $Ra_8$, and each n independently represents an integer of 0 to 4);

Substituent ($S_{11}$)

(wherein each of $R_1$ to $R_3$ independently represents a hydrogen atom or an alkyl group).

[2] The photoelectric conversion element as described in [1], wherein the compound represented by formula (F-1) is a compound represented by the following formula (F-2):

(F-2)

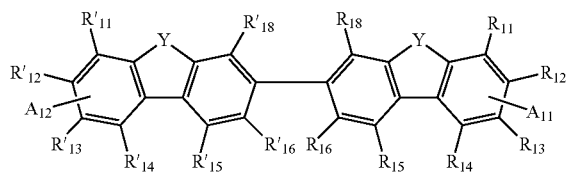

(wherein each of $R_{11}$ to $R_{16}$, $R_{18}$, $R'_{11}$ to $R'_{16}$ and $R'_{18}$ independently represents a hydrogen atom, a halogen atom, an alkyl group, an aryl group, a heterocyclic group, a hydroxyl group, an amino group or a mercapto group, which may further have a substituent, each of $A_{11}$ and $A_{12}$ independently represents a substituent represented by formula (A-1) and substitutes as any one of $R_{11}$ to $R_{14}$ and $R'_{11}$ to $R'_{14}$, and each Y independently represents a carbon atom, a nitrogen atom, an oxygen atom, a sulfur atom or a silicon atom, which may further have a substituent).

[3] The photoelectric conversion element as described in [1] or [2], wherein in formula (F-1) or formula (F-2), each of $R_{12}$ and $R'_{12}$ independently represents the substituent represented by formula (A-1).

[4] The photoelectric conversion element as described in any one of [1] to [3], wherein in formula (A-1), n represents an integer of 0 to 2.

[5] The photoelectric conversion element as described in any one of [1] to [4], wherein in formula (A-1), at least either one of $Ra_1$ and $Ra_6$ each independently represents the substituent ($S_{11}$).

[6] The photoelectric conversion element as described in any one of [1] to [5], wherein in formula (F-1) or formula (F-2), Y represents —N($R_{20}$)— (wherein each $R_{20}$ independently represents an alkyl group, an aryl group or a heterocyclic group, which may further have a substituent).

[7] The photoelectric conversion element as described in any one of [1] to [6], wherein in formula (F-1) or formula (F-2), Y represents —C($R_{21}$)($R_{22}$)— (wherein each of $R_{21}$ and $R_{22}$ independently represents an alkyl group, an aryl group or a heterocyclic group, which may further have a substituent).

[8] The photoelectric conversion element as described in any one of [1] to [7], wherein the ionization potential (Ip) of the compounds represented by formulae (F-1) and (F-2) is from 4.9 to 5.8 eV.

[9] The photoelectric conversion element as described in any one of [1] to [9], wherein the molecular weight of the compounds represented by formulae (F-1) and (F-2) is from 500 to 2,000.

[10] The photoelectric conversion element as described in any one of [1] to [9], wherein the photoelectric conversion layer contains an n-type organic semiconductor.

[11] The photoelectric conversion element as described in [10], wherein the n-type organic semiconductor is a fullerene or a fullerene derivative.

[12] The photoelectric conversion element as described in any one of [1] to [11], wherein the photoelectric conversion film contains a compound of the following formula (I):

Formula (I)

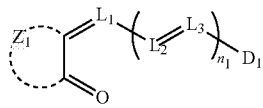

(wherein $Z_1$ represents an atomic group necessary for forming a 5- or 6-membered ring, each of $L_1$, $L_2$ and $L_3$ represents an unsubstituted methine group or a substituted methine group, $D_1$ represents an atomic group, and $n_1$ represents an integer of 0 or more).

[13] The photoelectric conversion element as described in any one of [1] to [12], wherein the electrically conductive film, the electron blocking layer, the photoelectric conversion layer and the transparent electrically conductive film are stacked in this order.

[14] A method for producing the photoelectric conversion element described in any one of [1] to [13], comprising a step of depositing each of the photoelectric conversion layer and the electron blocking layer by vacuum heating deposition.

[15] A photosensor comprising the photoelectric conversion element described in any one of [1] to [13].

[16] An imaging device comprising the photoelectric conversion element described in any one of [1] to [13].

[17] A method for driving the photoelectric conversion element described in any one of [1] to [13], the photosensor described in [15], or the imaging device described in [16], comprising applying a voltage by using an electrode in contact with said electron blocking layer as a cathode and another electrode as an anode.

[18] A compound represented by the following formula (F-1):

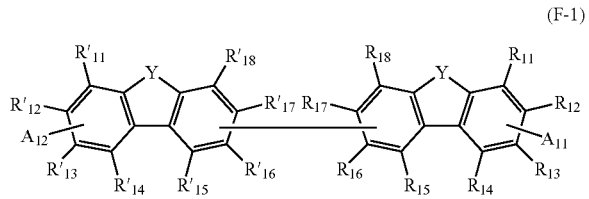

(F-1)

(wherein each of $R_{11}$ to $R_{18}$ and $R'_{11}$ to $R'_{18}$ independently represents a hydrogen atom, a halogen atom, an alkyl group, an aryl group, a heterocyclic group, a hydroxyl group, an amino group or a mercapto group, which may further have a substituent, any one of $R_{15}$ to $R_{18}$ is connected to any one of $R'_{15}$ to $R'_{18}$ through a single bond, each of $A_{11}$ and $A_{12}$ independently represents a substituent represented by the following formula (A-1) and substitutes as any one of $R_{11}$ to $R_{14}$ and $R'_{11}$ to $R'_{14}$, and each Y independently represents a carbon atom, a nitrogen atom, an oxygen atom, a sulfur atom or a silicon atom, which may further have a substituent);

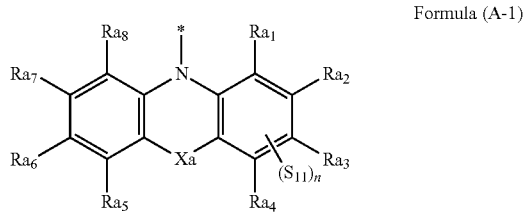

Formula (A-1)

(wherein each of $Ra_1$ to $Ra_8$ independently represents a hydrogen atom, a halogen atom, an alkyl group, an aryl group or a heterocyclic group, which may further have a substituent, * represents the bonding position, Xa represents a single bond, an oxygen atom, a sulfur atom, an alkylene group, a silylene group, an alkenylene group, a cycloalkylene group, a cycloalkenylene group, an arylene group, a divalent heterocyclic group or an imino group, which may further have a substituent, each $S_{11}$ independently represents the following substituent ($S_{11}$) and substitutes as any one of $Ra_1$ to $Ra_8$, and each n independently represents an integer of 0 to 4);

Substituent ($S_{11}$)

(wherein each of $R_1$ to $R_3$ independently represents a hydrogen atom or an alkyl group).

Advantage of the Invention

According to the present invention, a photoelectric conversion element capable of functioning as a photoelectric conversion element when a compound having a specific structure is applied to the photoelectric conversion element, causing the element to exhibit a low dark current, and reducing the range of increase in the dark current even when the element is heat-treated, and an imaging device equipped with such a photoelectric conversion element, can be provided.

EMBODIMENTS TO CARRY OUT THE INVENTION

Photoelectric Conversion Element

Figure 1A:
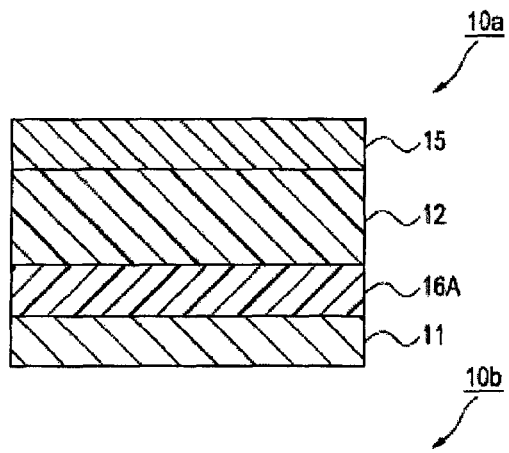
FIG. 1A A schematic cross-sectional view showing one configuration example of the photoelectric conversion element.

The photoelectric conversion element of the present invention is a photoelectric conversion element having a photoelectric conversion film which is sandwiched between a transparent electrically conductive film and an electrically conductive film and contains a photoelectric conversion layer and an electron blocking layer, wherein the electron blocking layer contains a compound represented by the following formula (F-1):

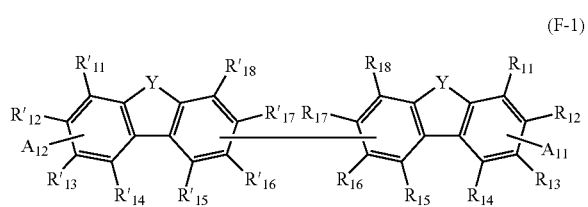

(F-1)

(wherein each of $R_{11}$ to $R_{18}$ and $R'_{11}$ to $R'_{18}$ independently represents a hydrogen atom, a halogen atom, an alkyl group, an aryl group, a heterocyclic group, a hydroxyl group, an amino group or a mercapto group, which may further have a substituent, any one of $R_{15}$ to $R_{18}$ is connected to any one of $R'_{15}$ to $R'_{18}$ through a single bond, each of $A_{11}$ and $A_{12}$ independently represents a substituent represented by the following formula (A-1) and substitutes as any one of $R_{11}$ to $R_{14}$ and $R'_{11}$ to $R'_{14}$, and each Y independently represents a carbon atom, a nitrogen atom, an oxygen atom, a sulfur atom or a silicon atom, which may further have a substituent);

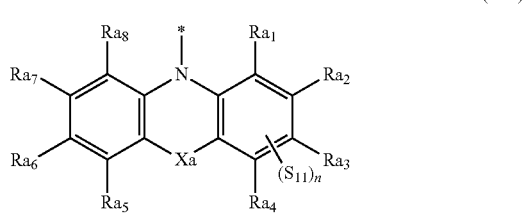

Formula (A-1)

(wherein each of $Ra_1$ to $Ra_8$ independently represents a hydrogen atom, a halogen atom, an alkyl group, an aryl group or a heterocyclic group, which may further have a substituent, * represents the bonding position, Xa represents a single bond, an oxygen atom, a sulfur atom, an alkylene group, a silylene group, an alkenylene group, a cycloalkylene group, a cycloalkenylene group, an arylene group, a divalent heterocyclic group or an imino group, which may further have a substituent, each $S_{11}$ independently represents the following substituent ($S_{11}$) and substitutes as any one of $Ra_1$ to $Ra_8$, and n represents an integer of 0 to 4);

Substituent ($S_{11}$)

(wherein each of $R_1$ to $R_3$ independently represents a hydrogen atom or an alkyl group).

The embodiment containing the compound of formula (F-1) in the photoelectric conversion film is not particularly limited but in the case where the photoelectric conversion film further contains a material having a large electron affinity (Ea) (preferably a material having Ea of 4.0 eV or more), it is preferred to produce a state where the material having a large electron affinity (Ea) is in contact with the compound of formula (F-1). By containing the compound of formula (F-1) in a state of being in contact with the material having a large electron affinity (Ea), generation of a source charge (electron, hole) at the interface of two materials can be effective suppressed. Incidentally, the material having an electron affinity (Ea) of 4.0 eV or more is preferably the later-described fullerene or fullerene derivative.

More specifically, a photoelectric conversion element in the following embodiments is preferred.

(1) An embodiment where the photoelectric conversion film comprises a photoelectric conversion layer and a charge blocking layer (either one or both of an electron blocking layer and a hole blocking layer), the photoelectric conversion layer contains a material having a large electron affinity (Ea), and at least either one charge blocking layer is composed of a compound of formula (F-1).

(2) An embodiment where the photoelectric conversion film comprises a photoelectric conversion layer, a charge blocking layer and an organic layer that is disposed between the photoelectric conversion layer and the charge blocking layer, the photoelectric conversion layer contains a material having a large electron affinity (Ea), and the organic layer is composed of a compound of formula (F-1).

In the embodiment of (1) above, thanks to the charge blocking layer composed of a compound of formula (F-1), injection of an electric charge from an electrode can be prevented while suppressing generation of a source charge between the charge blocking layer and the photoelectric conversion layer, and in the embodiment (2) above, generation of a source charge between the charge blocking layer and the photoelectric conversion layer due to direct contact of those layers can be prevented.

Suitable implementation modes of the photoelectric conversion element of the present invention are described below. An electrically conductive film, a photoelectric conversion layer, an electron blocking layer and a transparent electrically conductive film may be stacked in this order, but in a preferred embodiment, an electrically conductive film, an electron blocking layer, a photoelectric conversion layer and a transparent electrically conductive layer are stacked in this order.

Figure 1B:
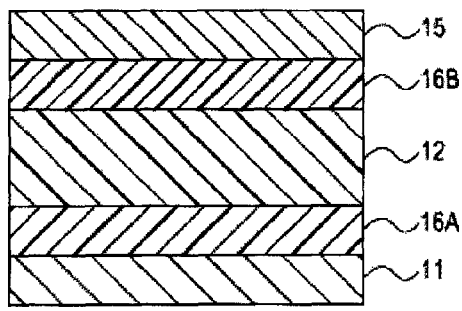
FIG. 1B A schematic cross-sectional view showing one configuration example of the photoelectric conversion element.

FIG. 1A and FIG. 1B show a configuration example of the photoelectric conversion element according to this implementation mode.

In the photoelectric conversion element 10a shown in FIG. 1A, an electron blocking layer 16A, a photoelectric conversion layer 12 and an upper electrode 15 are stacked in this order on a lower electrode 11.

In the photoelectric conversion element 10b shown in FIG. 1B, an electron blocking layer 16A, a photoelectric conversion layer 12, a hole blocking layer 16B and an upper electrode 15 are stacked in this order on a lower electrode 11. The order of stacking an electron blocking layer, a photoelectric conversion layer and a hole blocking layer in FIGS. 1(a) and 1(b) may be reversed according to use or characteristics.

The components constituting the photoelectric conversion element according to this implementation mode are described.

(Electrode)

The electrode (the upper electrode (transparent electrically conductive film) 15 and the lower electrode (electrically conductive film) 11) is composed of an electrically conductive material. Examples of the electrically conductive material which can be used include a metal, an alloy, a metal oxide, an electroconductive compound, and a mixture thereof.

Light is incident from the upper electrode 15 and therefore, the upper electrode 15 needs to be sufficiently transparent to light that is to be detected. Specific examples thereof include an electrically conductive metal oxide such as tin oxide doped with antimony, fluorine (ATO, FTO) or the like, tin oxide, zinc oxide, indium oxide, indium tin oxide (ITO) and indium zinc oxide (IZO); a metal thin film such as gold, silver, chromium and nickel; a mixture or laminate of such a metal and such an electrically conductive metal oxide; an inorganic electrically conductive substance such as copper iodide and copper sulfide; an organic electrically conductive material such as polyaniline, polythiophene and polypyrrole; and a laminate of such a material and ITO. Among these, an electrically conductive metal oxide is preferred in view of high electrical conductivity, transparency and the like. The upper electrode 15 is deposited on the photoelectric conversion layer 12 and therefore, is preferably deposited by a method causing no deterioration of the properties of the photoelectric conversion layer 12.

The lower electrode 11 includes, according to use, for example, a case where transparency is imparted, and a case where, conversely, a material capable of reflecting light is used without imparting transparency. Specific examples thereof include an electrically conductive metal oxide such as tin oxide doped with antimony, fluorine (ATO, FTO) or the like, tin oxide, zinc oxide, indium oxide, indium tin oxide (ITO) and indium zinc oxide (IZO); a metal such as gold, silver, chromium, nickel, titanium, tungsten and aluminum; an electrically conductive compound such as oxide and nitride of the metal above; a mixture or laminate of such a metal and such an electrically conductive metal oxide; an inorganic electrically conductive substance such as copper iodide and copper sulfide; an organic electrically conductive material such as polyaniline, polythiophene and polypyrrole; and a laminate of such a material and ITO.

The method for forming the electrode is not particularly limited and may be appropriately selected by taking into consideration the suitability for the electrode material. Specifically, the electrode can be formed, for example, by a wet system such as printing and coating, a physical system such as vacuum deposition. sputtering and ion plating, or a chemical system such as CVD and plasma CVD.

In the case where the material of the electrode is ITO, the electrode can be formed, for example, by an electron beam method, a sputtering method, a resistance heating deposition method, a chemical reaction method (e.g., sol-gel method) or a method of coating a dispersion of indium tin oxide. The film produced using ITO may be further subjected to, for example, a UV-ozone treatment or a plasma treatment.

The upper electrode 15 is preferably produced in a plasma-free state. When the upper electrode 15 is produced in a plasma-free state, the effect of plasma on the base plate can be reduced and good photoelectric conversion properties can be obtained. Here, the plasma-free state means a state where plasma is not generated during deposition of the upper electrode 15 or a state where the distance from a plasma generation source to the substrate is 2 cm or more, preferably 10 cm or more, more preferably 20 cm or more, and the amount of plasma reaching the substrate is reduced.

Examples of the apparatus generating no plasma during deposition of the upper electrode 15 include an electron beam deposition apparatus (EB deposition apparatus) and a pulsed laser deposition apparatus. As for the EB deposition apparatus or pulsed laser deposition apparatus, the apparatuses described, for example, in Yutaka Sawada (supervisor), *Tomei Doden Maku no Shin Tenkai* (*New Development of Transparent Conductive Film*), CMC (1999), Yutaka Sawada (supervisor), *Tomei Doden Maku no Shin Tenkai II* (*New Development II of Transparent Conductive Film*), CMC (2002), *Tomei Doden Maku no Gijutsu* (*Technology of Transparent Conductive Film*), JSPS, Ohmsha (1999), and references cited therein can be used. In the following, the method of depositing the transparent electrode film by using an EB deposition apparatus is referred to as an EB deposition method, and the method of depositing the transparent electrode film by using a pulsed laser deposition apparatus is referred to as a pulsed laser deposition method.

As for the apparatus capable of realizing a state where the distance from a plasma generation source to the substrate is 2 cm or more and the amount of plasma reaching the substrate is reduced (hereinafter referred to as a "plasma-free deposition apparatus"), an opposed-target sputtering apparatus, an arc plasma deposition method and the like are considered, and apparatuses described, for example, in Yutaka Sawada (supervisor), *Tomei Doden Maku no Shin Tenkai* (*New Development of Transparent Conductive Film*), CMC (1999), Yutaka Sawada (supervisor), *Tomei Doden Makuno Shin Tenkai II* (*New Development II of Transparent Conductive Film*), CMC (2002), *Tomei Doden Maku no Gijutsu* (*Technology of Transparent Conductive Film*), JSPS, Ohmsha (1999), and references cited therein can be used.

In the case where a transparent electrically conductive film such as TCO is used for the upper electrode 15, a DC short or an increase of leak current sometimes occurs. One of causes thereof is considered to be coverage of fine cracks introduced into the photoelectric conversion layer 12 by a dense film such as TCO, resulting in an increase of conduction with the first electrode film 11 on the opposite side. Therefore, in the case of an electrode having relatively poor film quality such as Al, the leak current is less likely to increase. The increase of leak current can be greatly suppressed by controlling the film thickness of the upper electrode 15 with respect to the film thickness (that is, the crack depth) of the photoelectric conversion layer 12. The thickness of the upper electrode 15 is preferably 1/5 or less, more preferably 1/10 or less, of the thickness of the photoelectric conversion layer 12.

Usually, when the thickness of the electrically conductive film is made smaller than a certain range, an abrupt increase of the resistance value is incurred, but in the solid-state imaging device where the photoelectric conversion element according to this implementation mode is incorporated, the sheet resistance may be, preferably, from 100 to 10,000 Ω/sq. and the latitude as to in which range the film thickness can be reduced is large. Also, as the thickness of the upper electrode (transparent electrically conductive film) 15 is smaller, the quantity of light absorbed is reduced and the light transmittance is generally increased. The increase of light transmittance brings about an increase of light absorption in the photoelectric conversion layer 12 and an increase of photoelectric conversion performance, and this is very preferred. Considering the suppression of leak current and the increase of resistance value of thin film as well as the increase of transmittance, which are associated with reduction in the film thickness, the thickness of the upper electrode 15 is preferably from 5 to 100 nm, more preferably from 5 to 20 nm.

(Charge Blocking Layer)

The charge blocking layer according to this implementation mode contains a compound represented by the following formula (F-1). One embodiment of the present invention is to use the material of formula (F-1) as the material for the blocking layer in contact with the photoelectric conversion layer containing a material having large Ea.

(Electron Blocking Layer, Hole Blocking Layer)

The electron blocking layer for use in the present invention contains a compound represented by formula (F-1):

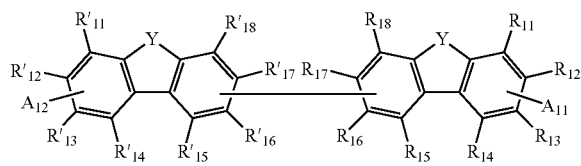

(F-1)

(wherein each of $R_{11}$ to $R_{18}$ and $R'_{11}$ to $R'_{18}$ independently represents a hydrogen atom, a halogen atom, an alkyl group, an aryl group, a heterocyclic group, a hydroxyl group, an amino group or a mercapto group, which may further have a substituent, any one of $R_{15}$ to $R_{18}$ is connected to any one of $R'_{15}$ to $R'_{18}$ through a single bond, each of $A_{11}$ and $A_{12}$ independently represents a substituent represented by the following formula (A-1) and substitutes as any one of $R_{11}$ to $R_{14}$ and $R'_{11}$ to $R'_{14}$, and each Y independently represents a carbon atom, a nitrogen atom, an oxygen atom, a sulfur atom or a silicon atom, which may further have a substituent);

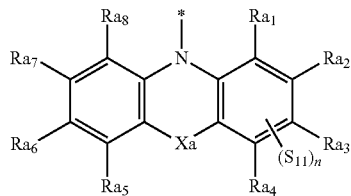

Formula (A-1)

(wherein each of $Ra_1$ to $Ra_8$ independently represents a hydrogen atom, a halogen atom, an alkyl group, an aryl group or a heterocyclic group, which may further have a substituent,

* represents the bonding position, Xa represents a single bond, an oxygen atom, a sulfur atom, an alkylene group, a silylene group, an alkenylene group, a cycloalkylene group, a cycloalkenylene group, an arylene group, a divalent heterocyclic group or an imino group, which may further have a substituent, each $S_{11}$ independently represents the following substituent ($S_{11}$) and substitutes as any one of $Ra_1$ to $Ra_8$, and n represents an integer of 0 to 4);

Substituent ($S_{11}$)

(wherein each of $R_1$ to $R_3$ independently represents a hydrogen atom or an alkyl group).

In formula (F-1), each of $R_{11}$ to $R_{18}$ and $R'_{11}$ to $R'_{18}$ independently represents a hydrogen atom, a halogen atom, an alkyl group, an aryl group, a heterocyclic group, a hydroxyl group, an amino group or a mercapto group, which may further have a substituent. Specific examples of the further substituent include the later-described substituent W, and the substituent is preferably a halogen atom, an alkyl group, an aryl group, a heterocyclic group, a hydroxyl group, an amino group or a mercapto group, more preferably a halogen atom, an alkyl group, an aryl group or a heterocyclic group, still more preferably a fluorine atom, an alkyl group or an aryl group, yet still more preferably an alkyl group or an aryl group, and most preferably an alkyl group.

Each of $R_{11}$ to $R_{18}$ and $R'_{11}$ to $R'_{18}$ is preferably a hydrogen atom, an alkyl group which may have a substituent, an aryl group or a heterocyclic group, more preferably a hydrogen atom, an alkyl group having a carbon number of 1 to 18, an aryl group having a carbon number of 6 to 18, or a heterocyclic group having a carbon number of 4 to 16, which may have a substituent. In particular, a compound where the substituent represented by formula (A-1) substitutes on each of $R_{12}$ and $R'_{12}$ independently is preferred; a compound where the substituent represented by formula (A-1) substitutes on each of $R_{12}$ and $R'_{12}$ independently and each of $R_{11}$, $R_{13}$ to $R_{18}$, $R'_{11}$ and $R'_{13}$ to $R'_{18}$ is a hydrogen atom or an alkyl group having a carbon number of 1 to 18, which may have a substituent, is more preferred; and a compound where the substituent represented by formula (A-1) substitutes on each of $R_{12}$ and $R_{12}$ independently and each of $R_{11}$, $R_{13}$ to $R_{18}$, $R'_{11}$ and $R'_{13}$ to $R'_{18}$ is a hydrogen atom, is still more preferred.

Each Y independently represents a carbon atom, a nitrogen atom, an oxygen atom, a sulfur atom or a silicon atom, which may further have a substituent. That is, Y represents a divalent linking group composed of a carbon atom, a nitrogen atom, an oxygen atom, a sulfur atom or a silicon atom. Among these, —$C(R_{21})(R_{22})$—, —$Si(R_{23})(R_{24})$— and —$N(R_{20})$— are preferred, —$C(R_{21})(R_{22})$— and —$N(R_{20})$— are more preferred, and —$C(R_{21})(R_{22})$— is still more preferred.

In —$C(R_{21})(R_{22})$— above, each of $R_{21}$ and $R_{22}$ independently represents a hydrogen atom, a halogen atom, or an alkyl, aryl or heterocyclic group which may have a substituent. Specific examples of the further substituent include the substituent W. Each of $R_{21}$ and $R_{22}$ is preferably a hydrogen atom or an alkyl, aryl or heterocyclic group which may have a substituent, more preferably a hydrogen atom, an alkyl group having a carbon number of 1 to 18, an aryl group having a carbon number of 6 to 18, or a heterocyclic group having a carbon number of 4 to 16, which may have a substituent, still more preferably a hydrogen atom or an alkyl group having a carbon number of 1 to 18, which may have a substituent, yet still more preferably an alkyl group having a carbon number of 1 to 18.

In —$Si(R_{23})(R_{24})$— above, each of $R_{23}$ and $R_{24}$ independently represents a hydrogen atom, a halogen atom, or an alkyl, aryl, heterocyclic, hydroxyl, amino or mercapto group which may have a substituent. Specific examples of the further substituent include the substituent W. Each of $R_{23}$ and $R_{24}$ is preferably a hydrogen atom or an alkyl, aryl or heterocyclic group which may have a substituent, more preferably a hydrogen atom, an alkyl group having a carbon number of 1 to 18, an aryl group having a carbon number of 6 to 18, or a heterocyclic group having a carbon number of 4 to 16, which may have a substituent, still more preferably a hydrogen atom or an alkyl group having a carbon number of 1 to 18, which may have a substituent, yet still more preferably an alkyl group having a carbon number of 1 to 18.

In —$N(R_{20})$— above, $R_{20}$ represents an alkyl, aryl or heterocyclic group which may have a substituent. Specific examples of the further substituent include the substituent W. $R_{20}$ is preferably a hydrogen atom, an alkyl group having a carbon number of 1 to 18, an aryl group having a carbon number of 6 to 18, or a heterocyclic group having a carbon number of 4 to 16, which may have a substituent, more preferably a hydrogen atom or an alkyl group having a carbon number of 1 to 18, which may have a substituent, still more preferably an alkyl group having a carbon number of 1 to 18.

In formula (A-1), each of $Ra_1$ to $Ra_8$ independently represents a hydrogen atom, a halogen atom, or an alkyl, aryl, heterocyclic, hydroxyl, amino or mercapto group which may have a substituent. Specific examples of the further substituent include the substituent W, and the substituent is preferably an alkyl group. Also, a plurality of these substituents may combine with each other to form a ring.

Each of $Ra_1$ to $Ra_8$ is preferably a hydrogen atom, a halogen atom, an alkyl group having a carbon number of 1 to 18, an aryl group having a carbon number of 6 to 18, or a heterocyclic group having a carbon number of 4 to 16, more preferably a hydrogen atom, an alkyl group having a carbon number of 1 to 12, or an aryl group having a carbon number of 6 to 14, still more preferably a hydrogen atom, an alkyl group having a carbon number of 1 to 6, or an aryl group having a carbon number of 6 to 10. The alkyl group may be a branched alkyl group.

Specific preferred examples include a hydrogen atom, a methyl group, an ethyl group, a propyl group, a butyl group, a hexyl group, a cyclohexyl group, a phenyl group and a naphthyl group.

A substituent where at least either one of $Ra_3$ and $Ra_6$ is a hydrogen atom or an alkyl group having a carbon number of 1 to 10 and each of $Ra_1$, $Ra_2$, $Ra_4$, $Ra_5$, $Ra_7$ and $Ra_8$ is a hydrogen atom or where at least either one of $Ra_2$ and $Ra_7$ is a hydrogen atom or an alkyl group having a carbon number of 1 to 10 and each of $Ra_1$, $Ra_3$, $Ra_4$, $Ra_5$, $Ra_6$ and $Ra_8$ is a hydrogen atom, is preferred, and a substituent where each of $Ra_3$ and $Ra_6$ is a hydrogen atom or an alkyl group having a carbon number of 1 to 6 and each of $Ra_1$, $Ra_2$, $Ra_4$, $Ra_5$, $Ra_7$ and $Ra_8$ is a hydrogen atom, is more preferred.

Xa represents a single bond, an oxygen atom, a sulfur atom, an alkylene group, a silylene group, an alkenylene group, a cycloalkylene group, a cycloalkenylene group, an arylene group, a divalent heterocyclic group or an imino group, which may further have a substituent.

Xa is preferably a single bond, an alkylene group having a carbon number of 1 to 12, an alkenylene group having a carbon number of 2 to 12, an arylene group having a carbon number of 6 to 14, a heterocyclic group having a carbon number of 4 to 13, an oxygen atom, a sulfur atom, an imino group containing a hydrocarbon group having a carbon number of 1 to 12 (preferably an aryl group or an alkyl group) (e.g., phenylimino, methylimino, tert-butylimino), or a silylene group, more preferably a single bond, an oxygen atom, an alkylene group having a carbon number of 1 to 6 (e.g., methylene, 1,2-ethylene, 1,1-dimethylmethylene), an alkenylene group having a carbon number of 2 (e.g., —CH$_2$=CH$_2$—), an arylene group having a carbon number of 6 to 10 (e.g., 1,2-phenylene, 2,3-naphthylene), or a silylene group, still more preferably a single bond, an oxygen atom, or an alkylene group having a carbon number of 1 to 6 (e.g., methylene, 1,2-ethylene, 1,1-dimethylmethylene). These substituents may further have the later-described substituent W.

The group represented by formula (A-1) is preferably a group represented by the following formula (A-2):

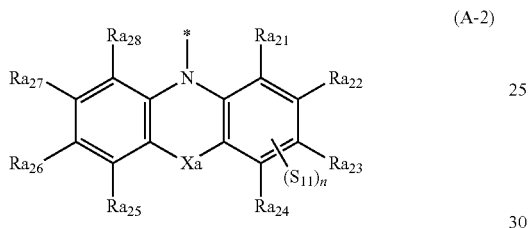

(A-2)

(wherein each of Ra$_{21}$ to Ra$_{28}$ independently represents a hydrogen atom, a halogen atom, an alkyl group, an aryl group or a heterocyclic group, which may further have a substituent, * represents the bonding position, Xa represents a single bond, an oxygen atom, a sulfur atom, an alkylene group, a silylene group, an alkenylene group, a cycloalkylene group, a cycloalkenylene group, an arylene group, a divalent heterocyclic group or an imino group, which may further have a substituent, each S$_{11}$ independently represents the substituent (S$_{11}$) and substitutes as any one of Ra$_1$ to Ra$_8$, and n represents an integer of 0 to 4).

In formula (A-2), Xa, S$_{11}$, Ra$_{21}$ to Ra$_{28}$ and n have the same meanings as Xa, S$_{11}$, Ra$_1$ to Ra$_8$ (excluding a heterocyclic ring) and n in formula (A-1), and preferred ranges are also the same.

Specific examples of the groups represented by formulae (A-1) and (A-2) include the groups N1 to N11 illustrated below, but the present invention is not limited thereto. As the group represented by formula (A-1), N-1 to N-7 are preferred, N-1 to N-6 are more preferred, N-1 to N-3 are still more preferred, N-1 and N-2 are yet still more preferred, and N-1 is most preferred.

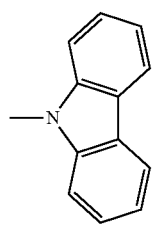

N-1

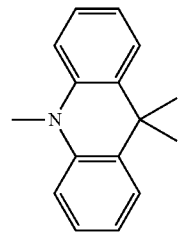

N-2

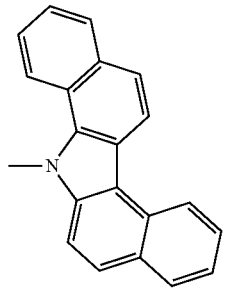

N-3

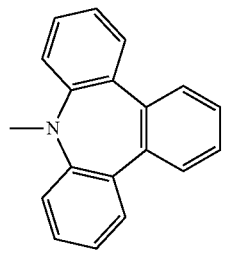

N-4

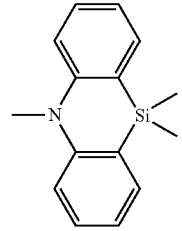

N-5

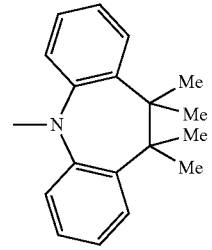

N-6

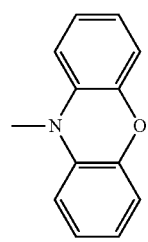

N-7

-continued

N-8
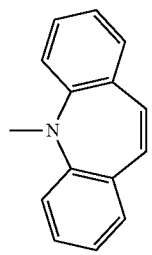

N-9
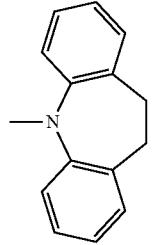

N-10
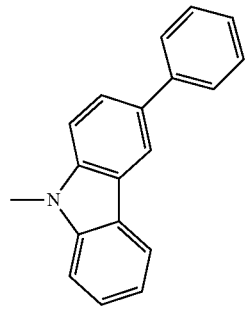

N-11
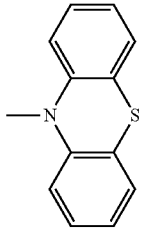

In the substituent ($S_{11}$), $R_1$ represents a hydrogen atom or an alkyl group. $R_1$ is preferably a methyl group, an ethyl group, a propyl group, an isopropyl group, a butyl group, or a tert-butyl group, more preferably a methyl group, an ethyl group, a propyl group, an isopropyl group or a tert-butyl group, still more preferably a methyl group, an ethyl group, an isopropyl group or a tert-butyl group, yet still more preferably a methyl group, an ethyl group or a tert-butyl group.

$R_2$ represents a hydrogen atom or an alkyl group. $R_2$ is preferably a hydrogen atom, a methyl group, an ethyl group, a propyl group, an isopropyl group, a butyl group, or a tert-butyl group, more preferably a hydrogen atom, a methyl group, an ethyl group or a propyl group, still more preferably a hydrogen atom or a methyl group, yet still more preferably a methyl group.

$R_3$ represents a hydrogen atom or an alkyl group. $R_3$ is preferably a hydrogen atom or a methyl group, more preferably a methyl group.

Also, $R_1$ to $R_3$ may combine with each other to form a ring. In the case of forming a ring, the number of ring members is not particularly limited, but a 5- or 6-membered ring is preferred, and a 6-membered ring is more preferred.

$S_{11}$ represents the substituent ($S_{11}$) and substitutes as any one of $R_{a1}$ to $R_{a8}$. In formulae (A-1) and (A-2), at least either one of $Ra_1$ and $Ra_b$ preferably independently represents the substituent ($S_{11}$).

Preferred substituents ($S_{11}$) include the following (a) to (x). Among these, (a) to (j) are preferred, (a) to (h) are more preferred, (a) to (f) are still more preferred, (a) to (c) are yet still more preferred, and (a) is most preferred.

 (a)

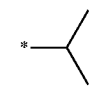 (b)

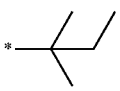 (c)

 (d)

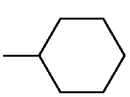 (e)

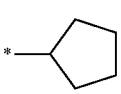 (f)

 (g)

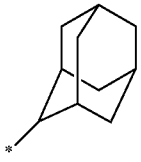 (h)

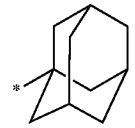 (i)

*—CH$_3$ (j)

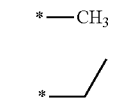 (k)

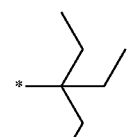 (l)

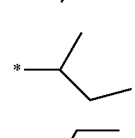 (m)

(n) 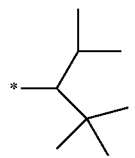

(o) 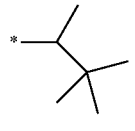

(p) 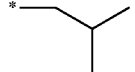

(q) 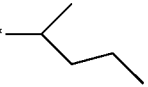

(r) 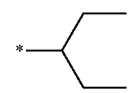

(s) 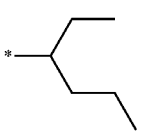

(t) 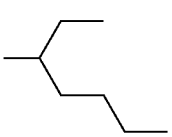

(u) 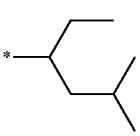

(v) 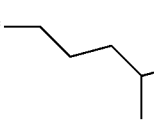

(w) 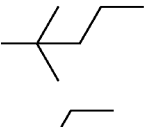

(x) 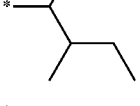

Each n independently represents an integer of 0 to 4 and is preferably from 0 to 3, more preferably from 0 to 2, still more preferably 1 or 2, and yet still more preferably 2. Thanks to introduction of the substituent represented by $S_{11}$, the interaction with the photoelectric conversion layer is suppressed, the dark current is reduced, the intermolecular force between compounds represented by formula (F-1) is strengthened resulting from increase in the molecular weight, and the heat resistance of the element is enhanced.

One preferred embodiment of the compound represented by formula (F-1) is a compound represented by the following formula (F-2). The interaction with the photoelectric conversion layer is suppressed, the dark current is reduced, the intermolecular force is strengthened resulting from increase in the molecular weight, and the heat resistance of the element is enhanced.

The compound represented by formula (F-1) is preferably a compound represented by formula (F-2):

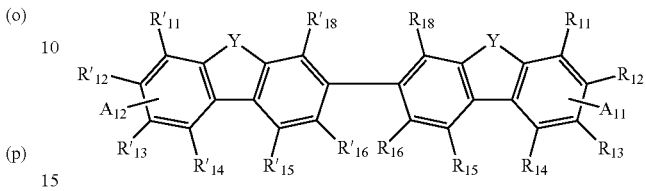

(F-2)

(wherein each of $R_{11}$ to $R_{16}$, $R_{18}$, $R'_{11}$ to $R'_{16}$ and $R'_{18}$ independently represents a hydrogen atom, a halogen atom, an alkyl group, an aryl group, a heterocyclic group, a hydroxyl group, an amino group or a mercapto group, which may further have a substituent, each of $A_{11}$ and $A_{12}$ independently represents a substituent represented by formula (A-1) and substitutes as any one of $R_{11}$ to $R_{14}$ and $R'_{11}$ to $R'_{14}$, and each Y independently represents a carbon atom, a nitrogen atom, an oxygen atom, a sulfur atom or a silicon atom, which may further have a substituent).

In formula (F-2), $R_{11}$ to $R'_{16}$, $R_{18}$, $R'_{11}$ to $R'_{16}$, $R'_{18}$, Y, $A_{11}$ and $A_{12}$ have the same meanings as $R_{11}$ to $R'_{16}$, $R_{18}$, $R'_{11}$ to $R'_{16}$, $R'_{18}$, Y, $A_{11}$ and $A_{12}$ in formula (F-1), and preferred ranges are also the same.

One preferred embodiment of the compound represented by formula (F-1) is a compound represented by the following formula (F-3). The interaction with the photoelectric conversion layer is suppressed, the dark current is reduced, the intermolecular force is strengthened resulting from increase in the molecular weight, and the heat resistance of the element is enhanced.

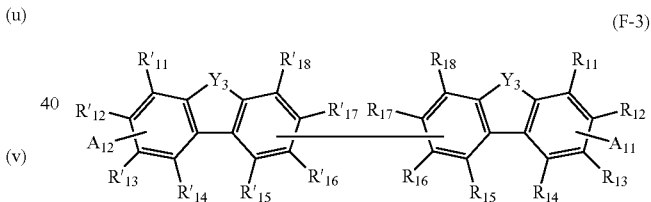

(F-3)

(wherein each of $R_{11}$ to $R_{18}$ and $R'_{11}$ to $R'_{18}$ independently represents a hydrogen atom, a halogen atom, an alkyl group, an aryl group, a heterocyclic group, a hydroxyl group, an amino group or a mercapto group, which may further have a substituent, any one of $R_{15}$ to $R_{18}$ is connected to any one of $R'_{15}$ to $R'_{18}$ through a single bond, each of $A_{11}$ and $A_{12}$ independently represents a substituent represented by the following formula (A-2) and substitutes as any one of $R_{11}$ to $R_{14}$ and $R'_{11}$ to $R'_{14}$, and each $Y_3$ independently represents a carbon atom, an oxygen atom, a sulfur atom or a silicon atom, which may further have a substituent);

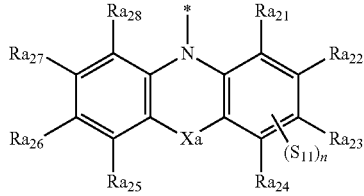

(A-2)

(wherein each of $Ra_{21}$ to $Ra_{28}$ independently represents a hydrogen atom, a halogen atom or an alkyl group, which may further have a substituent, * represents the bonding position, Xa represents a single bond, an oxygen atom, a sulfur atom, an alkylene group, a silylene group, an alkenylene group, a cycloalkylene group, a cycloalkenylene group, an arylene group, a divalent heterocyclic group or an imino group, which may further have a substituent, each $S_{11}$ independently represents the substituent ($S_{11}$) and substitutes as any one of $Ra_1$ to $Ra_8$, and n represents an integer of 0 to 4);

Substituent ($S_{11}$)

(wherein each of $R_1$ to $R_3$ independently represents a hydrogen atom or an alkyl group).

In formula (F-3), $R_{11}$ to $R'_{16}$, $R_{18}$, $R'_{11}$ to $R_{16}$, $R'_{18}$, Y', $A_{11}$ and $A_{12}$ have the same meanings as $R_{11}$ to $R'_{16}$, $R_{18}$, $R'_{11}$ to $R'_{16}$, $R'_{18}$, Y (excluding a nitrogen atom), $A_{11}$ and $A_{12}$ in formula (F-1), and preferred ranges are also the same.

Other embodiments of the compound represented by formula (F-1) include a compound represented by the following formula (F-4):

(F-4)

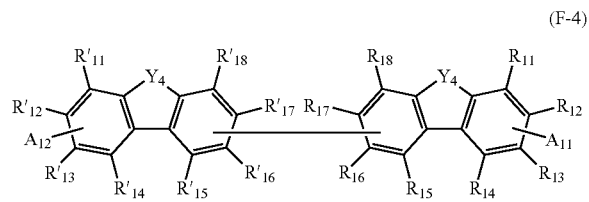

(wherein each of $R_{11}$ to $R_{18}$ and $R'_{11}$ to $R'_{18}$ independently represents a hydrogen atom, a halogen atom, an alkyl group, an aryl group, a heterocyclic group, a hydroxyl group, an amino group or a mercapto group, which may further have a substituent, any one of $R_{15}$ to $R_{18}$ is connected to any one of $R'_{15}$ to $R'_{18}$ through a single bond, each of $A_{11}$ and $A_{12}$ independently represents a substituent represented by the following formula (A-1) and substitutes as any one of $R_{11}$ to $R_{14}$ and $R'_{11}$ to $R'_{14}$, and $Y_4$ represents a nitrogen atom, which may further have a substituent);

Formula (A-1)

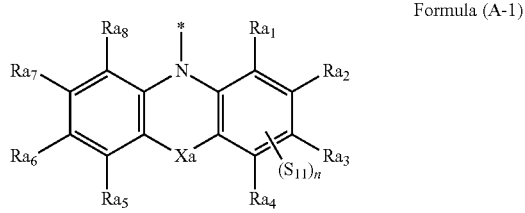

(wherein each of $Ra_1$ to $Ra_8$ independently represents a hydrogen atom, a halogen atom, an alkyl group, an aryl group or a heterocyclic group, which may further have a substituent, * represents the bonding position, Xa represents a single bond, an oxygen atom, a sulfur atom, an alkylene group, a silylene group, an alkenylene group, a cycloalkylene group, a cycloalkenylene group, an arylene group, a divalent heterocyclic group or an imino group, which may further have a substituent, each $S_{11}$ independently represents the following substituent ($S_{11}$) and substitutes as any one of $Ra_1$ to $Ra_8$, and n represents an integer of 0 to 4).

In formula (F-4), $R_{11}$ to $R'_{16}$, $R_{18}$, $R'_{11}$ to $R'_{16}$, $R'_{18}$, $Y_4$, $A_{11}$ and $A_{12}$ have the same meanings as $R_{11}$ to $R'_{16}$, $R_{18}$, $R'_{11}$ to $R'_{16}$, $R'_{18}$, Y (when Y represents a nitrogen atom), $A_{11}$ and $A_{12}$ in formula (F-1), and preferred ranges are also the same.

The ionization potential (Ip) of the compound for use in the present invention, when the compound is used for the electron blocking layer, must be smaller than Ip of the material assuming hole transport in the photoelectric conversion layer, because a hole needs to be received without barriers from the material assuming hole transport in the photoelectric conversion layer. In particular, when a material having absorption sensitivity in the visible region is selected, for conforming with a larger number of materials, the ionization potential of the compound for use in the present invention is preferably 5.8 eV or less. When Ip is 5.8 eV or less, this produces an effect of bringing out high charge collection efficiency and high-speed responsivity without generating a barrier to charge transport.

Also, Ip is preferably 4.9 eV or more, more preferably 5.0 eV or more. When Ip is 4.9 eV or more, a higher dark current reducing effect can be obtained.

In this connection, Ip of each compound can be measured by ultraviolet photoelectron spectroscopy (UPS) or in-air photoelectron spectrometer (for example, AC-2 manufactured by Riken Keiki Co., Ltd.).

The Ip of the compound for use in the present invention can be adjusted to the range above, for example, by changing the substituent bonded to the skeleton.

[Compound Represented by Formula (F-1)]

The present invention also relates to a compound represented by the following formula (F-1). The compound represented by formula (F-1) is endowed with excellent heat resistance and high charge transportability and therefore, is suited for formation of the electron blocking layer.

(F-1)

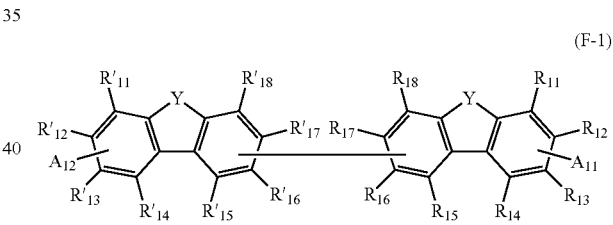

(wherein each of $R_{11}$ to $R_{18}$ and $R'_{11}$ to $R'_{18}$ independently represents a hydrogen atom, a halogen atom, an alkyl group, an aryl group, a heterocyclic group, a hydroxyl group, an amino group or a mercapto group, which may further have a substituent, any one of $R_{15}$ to $R_{18}$ is connected to any one of $R'_{15}$ to $R'_{18}$ through a single bond, each of $A_{11}$ and $A_{12}$ independently represents a substituent represented by the following formula (A-1) and substitutes as any one of $R_{11}$ to $R_{14}$ and $R'_{11}$ to $R'_{14}$, and each Y independently represents a carbon atom, a nitrogen atom, an oxygen atom, a sulfur atom or a silicon atom, which may further have a substituent);

Formula (A-1)

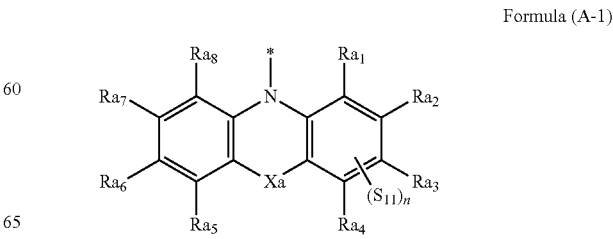

(wherein each of Ra₁ to Ra₈ independently represents a hydrogen atom, a halogen atom, an alkyl group, an aryl group or a heterocyclic group, which may further have a substituent, * represents the bonding position, Xa represents a single bond, an oxygen atom, a sulfur atom, an alkylene group, a silylene group, an alkenylene group, a cycloalkylene group, a cycloalkenylene group, an arylene group, a divalent heterocyclic group or an imino group, which may further have a substituent, each $S_{11}$ independently represents the following substituent ($S_{11}$) and substitutes as any one of Ra₁ to Ra₈, and n represents an integer of 0 to 4);

Substituent ($S_{11}$)

(wherein each of R₁ to R₃ independently represents a hydrogen atom or an alkyl group).

In the compound of the present invention, $R_{11}$ to $R'_{16}$, $R_{18}$, $R'_{11}$ to $R'_{16}$, $R'_{18}$, Y, $A_{11}$ and $A_{12}$ have the same meanings as $R_{11}$ to $R'_{16}$, $R_{18}$, $R'_{11}$ to $R'_{16}$, $R'_{13}$, Y, $A_{11}$ and $A_{12}$ in the above-described photoelectric conversion element of the present invention, and preferred ranges are also the same.

The compound represented by formula (F-1) is preferably a compound represented by formula (F-2) or a compound represented by formula (F-3).

Specific examples of the compound for use in the present invention are illustrated below, but the present invention is not limited to the following specific examples. Also, in formulae (a) to (t), when the members in each pair of "$A_{11}$ and $A_{12}$", "$R_{20}$ and $R'_{20}$", "$R_{23}/R_{24}$ and $R'_{23}/R'_{24}$" or the like are not the same, they can make a combination other than the structures illustrated.

Incidentally, the partial structures B-1 to B-51 in the following compound examples are shown below. Also, Me: methyl group, Et: ethyl group, i-Pro: isopropyl group, n-Bu: n-butyl group, t-Bu: tert-butyl group, Ph: phenyl group, 2-tol: 2-toluoyl group, 3-tol: 3-toluoyl group, 4-tol: 4-toluoyl group, 1-Np: 1-naphthyl group, 2-Np: 2-naphthyl group, 2-An: 2-anthryl group, and 2-Fn: 2-fluorenyl group.

B-1
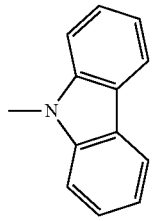

B-2
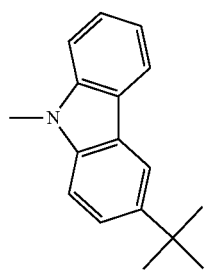

B-3
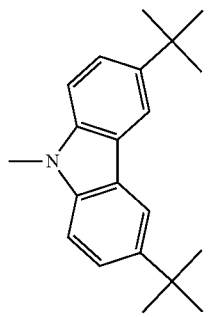

B-4
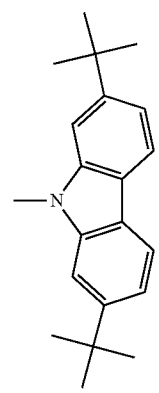

B-5
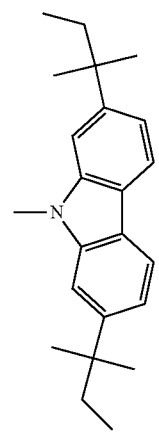

B-6
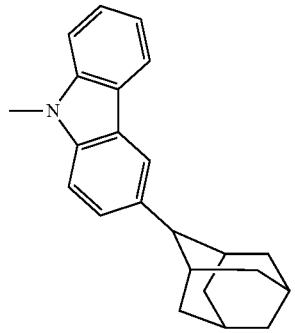

B-7 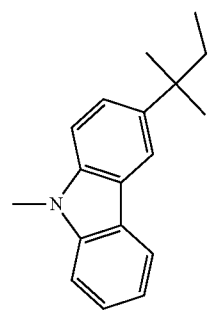
B-8 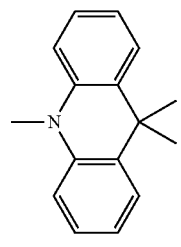
B-9 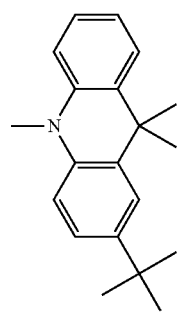
B-10 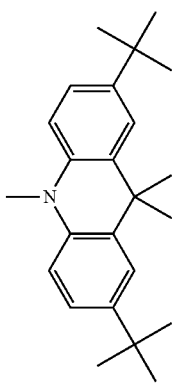
B-11 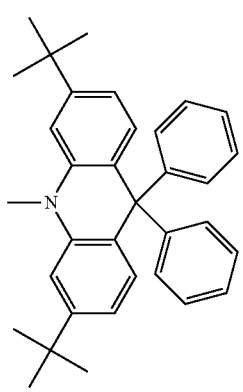
B-12 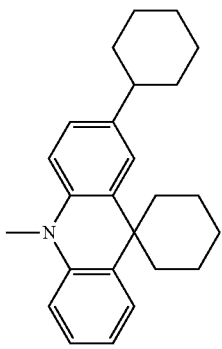
B-13 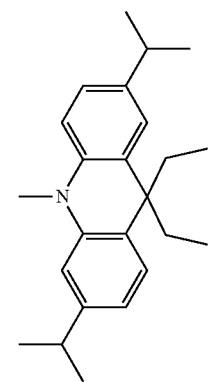
B-14 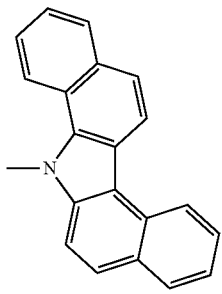
B-15 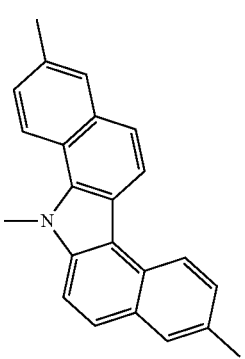

B-16
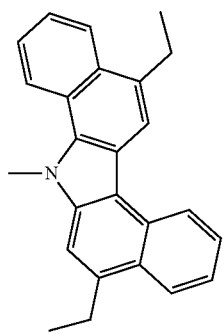
B-17
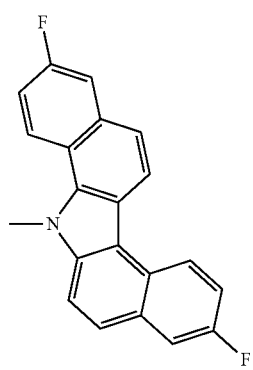
B-18
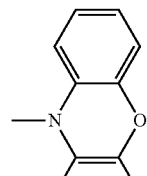
B-19
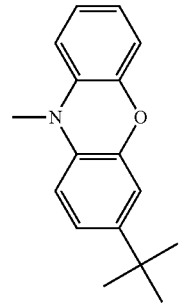
B-20
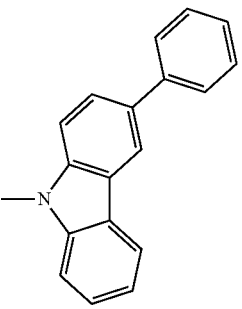
B-21
B-22
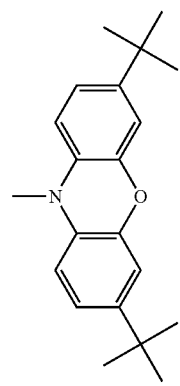
B-23
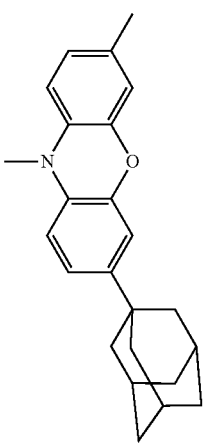
B-24

B-25
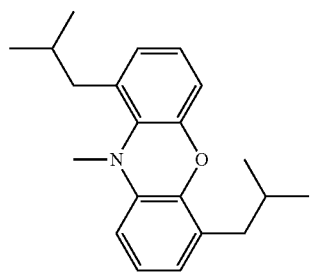
B-26
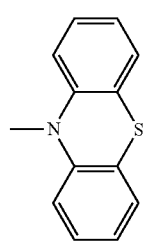
B-27
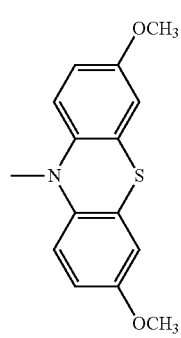
B-28
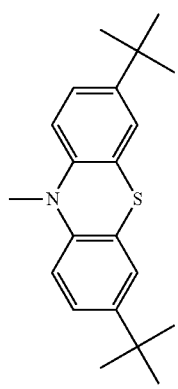
B-29
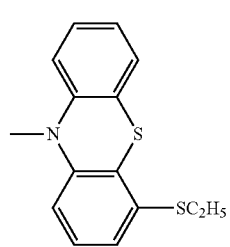
B-30
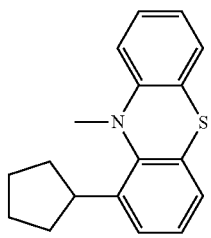
B-31
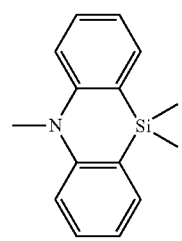
B-32
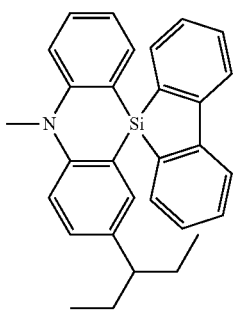
B-33
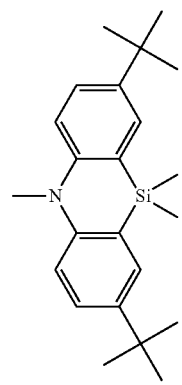
B-34
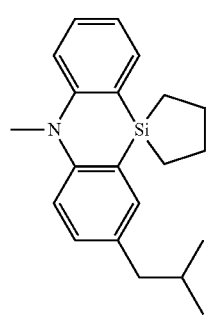

B-35
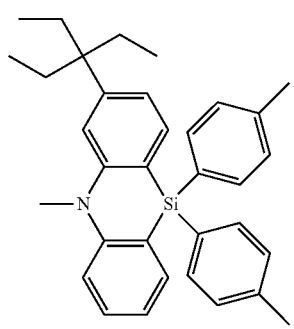
B-36
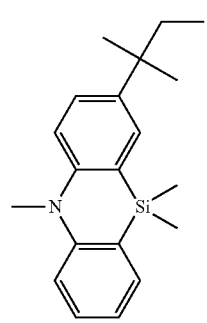
B-37
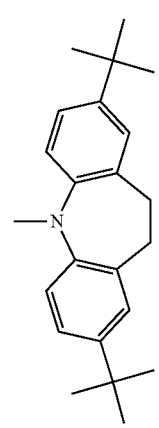
B-38
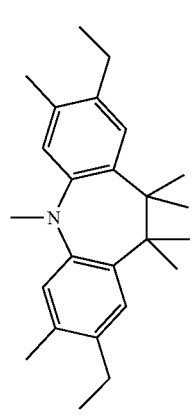
B-39
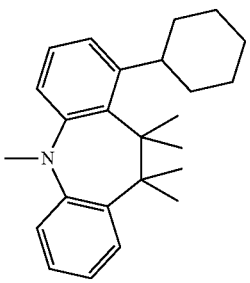
B-40
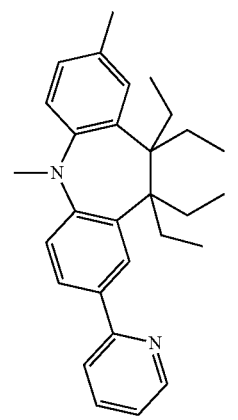
B-41
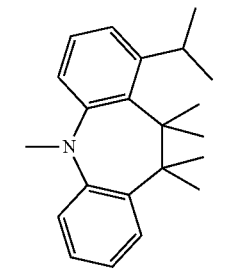
B-42
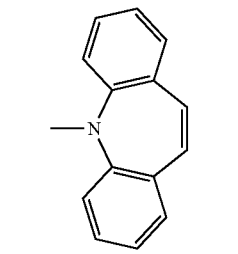
B-43
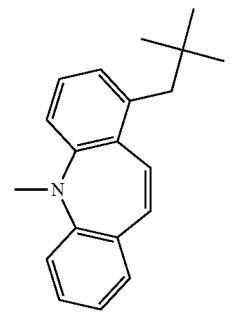

B-44 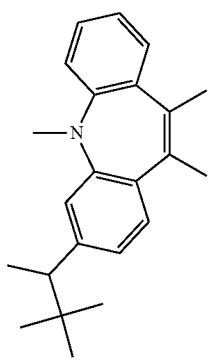
B-45 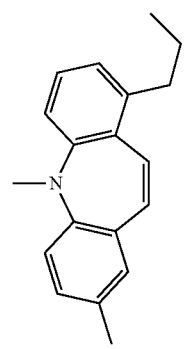
B-46 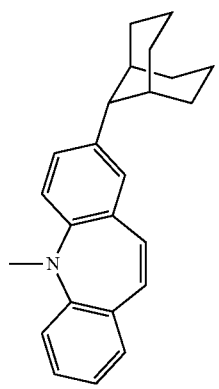
B-47 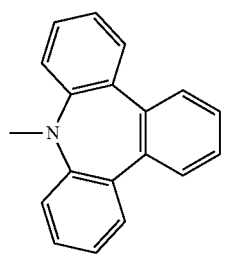
B-48 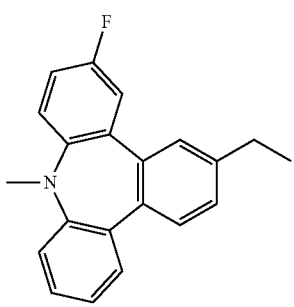
B-49 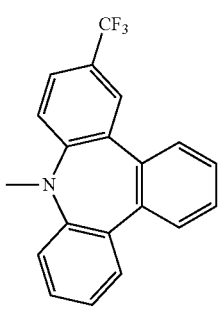
B-50 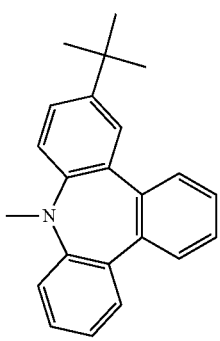
B-51 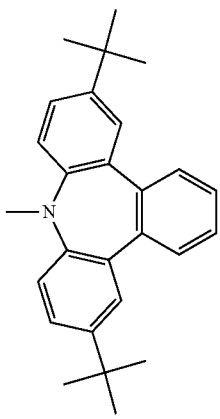
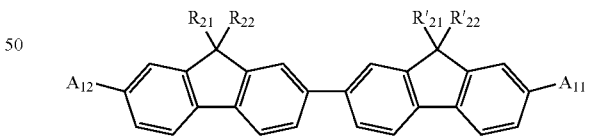
(a)
| Compound No. | $R_{21}$ | $R_{22}$ | $R'_{21}$ | $R'_{22}$ | $A_{11}$ | $A_{12}$ |
|---|---|---|---|---|---|---|
| a-1 | Me | Me | Me | Me | B-1 | B-1 |
| a-2 | Me | Me | Me | Me | B-2 | B-2 |
| a-3 | Me | Me | Me | Me | B-3 | B-3 |
| a-4 | Me | Me | Me | Me | B-8 | B-8 |
| a-5 | Me | Me | Me | Me | B-9 | B-9 |
| a-6 | Me | Me | Me | Me | B-10 | B-10 |
| a-7 | Me | Me | Me | Me | B-14 | B-14 |
| a-8 | Me | Me | Me | Me | B-21 | B-21 |
| a-9 | Me | Me | Me | Me | B-23 | B-23 |
| a-10 | Me | Me | Me | Me | B-31 | B-33 |
| a-11 | Me | Me | Me | Me | B-42 | B-42 |
| a-12 | H | H | H | H | B-43 | B-43 |

-continued (a)

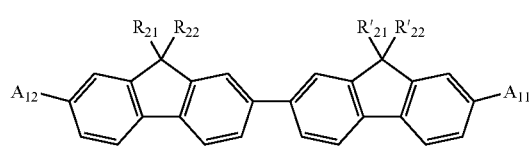

| Compound No. | $R_{21}$ | $R_{22}$ | $R'_{21}$ | $R'_{22}$ | $A_{11}$ | $A_{12}$ |
|---|---|---|---|---|---|---|
| a-13 | H | H | H | Me | B-47 | B-47 |
| a-14 | Et | Et | Et | Et | B-48 | B-48 |
| a-15 | n-Bu | n-Bu | n-Bu | n-Bu | B-31 | B-33 |
| a-16 | Ph | Ph | Ph | Ph | B-4 | B-4 |
| a-17 | Me | Me | Me | Ph | B-5 | B-5 |
| a-18 | i-Pr | i-Pr | i-Pr | i-Pr | B-17 | B-17 |
| a-19 | 2-MeOEt | 2-MeOEt | 2-MeOEt | 2-MeOEt | B-1 | B-2 |
| a-20 | Me | Me | Me | Me | B-26 | B-26 |
| a-21 | Et | Et | Ph | Ph | B-8 | B-9 |
| a-22 | Me | Me | Me | Me | B-8 | B-10 |
| a-23 | Me | Me | Me | Me | B-1 | B-8 |
| a-24 | Me | Me | Me | Me | B-30 | B-10 |
| a-25 | Me | Et | Me | Ph | B-1 | B-20 |

(b)

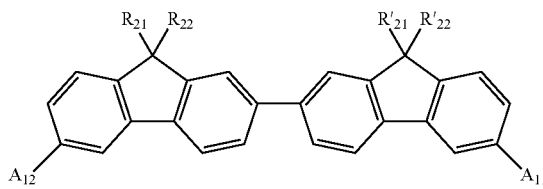

| Compound No. | $R_{21}$ | $R_{22}$ | $R'_{21}$ | $R'_{22}$ | $A_{11}$ | $A_{12}$ |
|---|---|---|---|---|---|---|
| b-1 | Me | Me | Me | Me | B-1 | B-1 |
| b-2 | Me | Me | Me | Me | B-2 | B-2 |
| b-3 | Me | Me | Me | Me | B-3 | B-3 |
| b-4 | Me | Me | Me | Me | B-8 | B-8 |
| b-5 | Me | Me | Me | Me | B-9 | B-9 |
| b-6 | H | H | H | H | B-43 | B-43 |
| b-7 | H | H | H | Me | B-47 | B-47 |
| b-8 | Et | Et | Et | Et | B-48 | B-48 |
| b-9 | n-Bu | n-Bu | n-Bu | n-Bu | B-6 | B-6 |
| b-10 | Ph | Ph | Ph | Ph | B-11 | B-11 |
| b-11 | Me | Me | Me | Ph | B-15 | B-15 |
| b-12 | i-Pr | i-Pr | i-Pr | i-Pr | B-17 | B-17 |
| b-13 | 2-MeOEt | 2-MeOEt | 2-MeOEt | 2-MeOEt | B-23 | B-23 |
| b-14 | Et | Et | Ph | Ph | B-26 | B-26 |
| b-15 | Me | Et | Me | Ph | B-32 | B-32 |

(c)

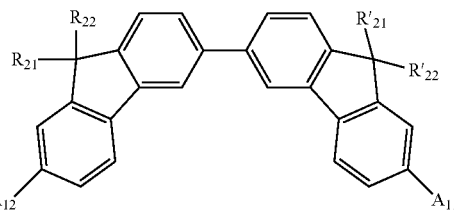

| Compound No. | $R_{21}$ | $R_{22}$ | $R'_{21}$ | $R'_{22}$ | $A_{11}$ | $A_{12}$ |
|---|---|---|---|---|---|---|
| c-1 | Me | Me | Me | Me | B-1 | B-1 |
| c-2 | Me | Me | Me | Me | B-2 | B-2 |
| c-3 | Me | Me | Me | Me | B-3 | B-3 |
| c-4 | Me | Me | Me | Me | B-8 | B-8 |
| c-5 | Me | Me | Me | Me | B-9 | B-9 |
| c-6 | H | H | H | H | B-10 | B-10 |
| c-7 | H | H | H | Me | B-51 | B-51 |
| c-8 | Et | Et | Et | Et | B-46 | B-44 |
| c-9 | n-Bu | n-Bu | n-Bu | n-Bu | B-37 | B-37 |
| c-10 | Ph | Ph | Ph | Ph | B-38 | B-38 |
| c-11 | Me | Me | Me | Ph | B-33 | B-35 |
| c-12 | i-Pr | i-Pr | i-Pr | i-Pr | B-27 | B-27 |
| c-13 | 2-MeOEt | 2-MeOEt | 2-MeOEt | 2-MeOEt | B-24 | B-24 |
| c-14 | Et | Et | Ph | Ph | B-7 | B-7 |
| c-15 | Me | Et | Me | Ph | B-7 | B-24 |

(d)

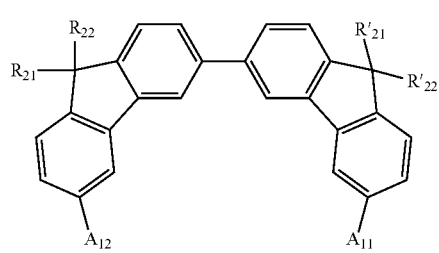

| Compound No. | $R_{21}$ | $R_{22}$ | $R'_{21}$ | $R'_{22}$ | $A_{11}$ | $A_{12}$ |
|---|---|---|---|---|---|---|
| d-1 | Me | Me | Me | Me | B-1 | B-1 |
| d-2 | Me | Me | Me | Me | B-2 | B-2 |
| d-3 | Me | Me | Me | Me | B-3 | B-3 |
| d-4 | Me | Me | Me | Me | B-8 | B-8 |
| d-5 | Me | Me | Me | Me | B-9 | B-9 |
| d-6 | H | H | H | H | B-10 | B-10 |
| d-7 | H | H | H | Me | B-12 | B-12 |
| d-8 | Et | Et | Et | Et | B-18 | B-18 |
| d-9 | n-Bu | n-Bu | n-Bu | n-Bu | B-25 | B-25 |
| d-10 | Ph | Ph | Ph | Ph | B-31 | B-31 |
| d-11 | Me | Me | Me | Ph | B-34 | B-34 |
| d-12 | i-Pr | i-Pr | i-Pr | i-Pr | B-39 | B-39 |
| d-13 | 2-MeOEt | 2-MeOEt | 2-MeOEt | 2-MeOEt | B-49 | B-49 |
| d-14 | Et | Et | Ph | Ph | B-16 | B-22 |
| d-15 | Me | Et | Me | Ph | B-3 | B-10 |

(e)

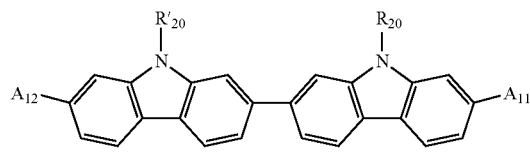

| Compound No. | $R_{20}$ | $R'_{20}$ | $A_{11}$ | $A_{12}$ |
| --- | --- | --- | --- | --- |
| e-1 | Ph | Ph | B-1 | B-1 |
| e-2 | Ph | Ph | B-2 | B-2 |
| e-3 | Ph | Ph | B-3 | B-3 |
| e-4 | Ph | Ph | B-8 | B-8 |
| e-5 | Ph | Ph | B-9 | B-9 |
| e-6 | Ph | Ph | B-10 | B-10 |
| e-7 | Ph | Ph | B-14 | B-14 |
| e-8 | Ph | Ph | B-20 | B-20 |
| e-9 | Ph | Ph | B-21 | B-21 |
| e-10 | 2-tol | 2-tol | B-1 | B-1 |
| e-11 | 3-tol | 3-tol | B-2 | B-2 |
| e-12 | 4-tol | 4-tol | B-3 | B-3 |
| e-13 | 2-Np | 2-Np | B-8 | B-8 |
| e-14 | 1-Np | 1-Np | B-9 | B-9 |
| e-15 | 2-An | 2-An | B-10 | B-10 |
| e-16 | 2-Fn | 2-En | B-4 | B-4 |
| e-17 | Me | Me | B-28 | B-28 |
| e-18 | i-Pr | i-Pr | B-36 | B-36 |
| e-19 | Et | Et | B-40 | B-40 |
| e-20 | Ph | 2-tol | B-45 | B-50 |
| e-21 | 3-tol | Ph | B-8 | B-9 |
| e-22 | 2-Fn | Ph | B-8 | B-10 |
| e-23 | t-Bu | t-Bu | B-1 | B-1 |
| e-24 | t-Bu | t-Bu | B-3 | B-3 |
| e-25 | 2-Np | Ph | B-1 | B-8 |

(g)

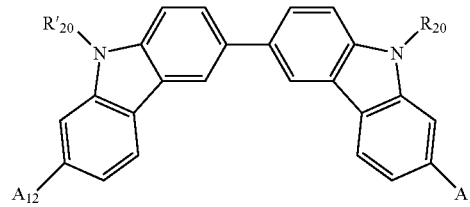

| Compound No. | $R_{20}$ | $R'_{20}$ | $A_{11}$ | $A_{12}$ |
| --- | --- | --- | --- | --- |
| g-1 | Ph | Ph | B-2 | B-2 |
| g-2 | Ph | Ph | B-3 | B-3 |
| g-3 | Ph | Ph | B-9 | B-9 |
| g-4 | Ph | Ph | B-10 | B-10 |
| g-10 | 2-tol | 2-tol | B-9 | B-9 |
| g-11 | 3-tol | 3-tol | B-14 | B-14 |
| g-12 | 4-tol | 4-tol | B-10 | B-10 |
| g-13 | 2-Np | 2-Np | B-8 | B-8 |
| g-14 | 1-Np | 1-Np | B-9 | B-9 |
| g-15 | 2-An | 2-An | B-10 | B-10 |
| g-16 | 2-Fn | 2-Fn | B-21 | B-21 |
| g-17 | Me | Me | B-26 | B-26 |
| g-18 | i-Pr | i-Pr | B-31 | B-31 |
| g-19 | Et | Et | B-37 | B-37 |
| g-20 | Ph | 2-tol | B-43 | B-43 |
| g-21 | 3-tol | Ph | B-48 | B-48 |
| g-22 | 2-Fn | Ph | B-22 | B-22 |
| g-24 | t-Bu | t-Bu | B-28 | B-28 |
| g-25 | 2-Np | Ph | B-1 | B-9 |

(f)

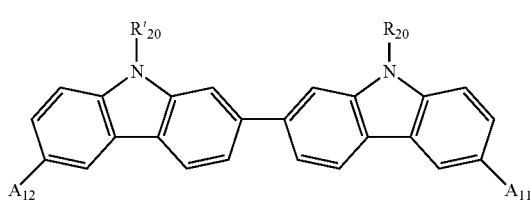

| Compound No. | $R_{20}$ | $R'_{20}$ | $A_{11}$ | $A_{12}$ |
| --- | --- | --- | --- | --- |
| f-1 | Ph | Ph | B-1 | B-1 |
| f-2 | Ph | Ph | B-2 | B-2 |
| f-3 | Ph | Ph | B-3 | B-3 |
| f-4 | Ph | Ph | B-8 | B-8 |
| f-10 | 2-tol | 2-tol | B-9 | B-9 |
| f-11 | 3-tol | 3-tol | B-10 | B-10 |
| f-12 | 4-tol | 4-tol | B-3 | B-3 |
| f-13 | 2-Np | 2-Np | B-8 | B-8 |
| f-14 | 1-Np | 1-Np | B-9 | B-9 |
| f-15 | 2-An | 2-An | B-10 | B-10 |
| f-16 | 2-Fn | 2-En | B-14 | B-14 |
| f-17 | Me | Me | B-21 | B-21 |
| f-18 | i-Pr | i-Pr | B-29 | B-29 |
| f-19 | Et | Et | B-41 | B-41 |
| f-20 | Ph | 2-tol | B-45 | B-50 |
| f-21 | 3-tol | Ph | B-9 | B-2 |
| f-22 | 2-Fn | Ph | B-8 | B-3 |
| f-24 | t-Bu | t-Bu | B-3 | B-4 |
| f-25 | 2-Np | Ph | B-1 | B-9 |

(h)

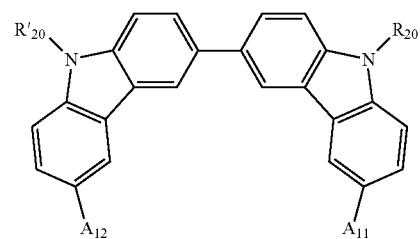

| Compound No. | $R_{20}$ | $R'_{20}$ | $A_{11}$ | $A_{12}$ |
| --- | --- | --- | --- | --- |
| h-1 | Ph | Ph | B-2 | B-2 |
| h-2 | Ph | Ph | B-3 | B-3 |
| h-3 | Ph | Ph | B-9 | B-9 |
| h-4 | Ph | Ph | B-10 | B-10 |
| h-10 | 2-tol | 2-tol | B-9 | B-9 |
| h-11 | 3-tol | 3-tol | B-14 | B-14 |
| h-12 | 4-tol | 4-tol | B-10 | B-10 |
| h-13 | 2-Np | 2-Np | B-8 | B-8 |
| h-14 | 1-Np | 1-Np | B-9 | B-9 |
| h-15 | 2-An | 2-An | B-10 | B-10 |
| h-16 | 2-Fn | 2-Fn | B-21 | B-21 |
| h-17 | Me | Me | B-26 | B-26 |
| h-18 | i-Pr | i-Pr | B-31 | B-31 |
| h-19 | Et | Et | B-38 | B-38 |
| h-20 | Ph | 2-tol | B-42 | B-42 |
| h-21 | 3-tol | Ph | B-51 | B-51 |
| h-22 | 2-En | Ph | B-3 | B-4 |
| h-24 | t-Bu | t-Bu | B-5 | B-5 |
| h-25 | 2-Np | Ph | B-3 | B-10 |

(i)

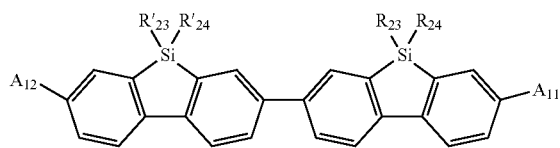

| Compound No. | R₂₃ | R₂₄ | R'₂₃ | R'₂₄ | A₁₁ | A₁₂ |
|---|---|---|---|---|---|---|
| i-1 | Me | Me | Me | Me | B-1 | B-1 |
| i-2 | Me | Me | Me | Me | B-2 | B-2 |
| i-3 | Me | Me | Me | Me | B-3 | B-3 |
| i-4 | Me | Me | Me | Me | B-8 | B-8 |
| i-5 | Me | Me | Me | Me | B-9 | B-9 |
| i-6 | Me | Me | Me | Me | B-10 | B-10 |
| i-7 | Me | Me | Me | Me | B-14 | B-14 |
| i-8 | Me | Me | Me | Me | B-22 | B-22 |
| i-9 | Me | Me | Me | Me | B-27 | B-27 |
| i-10 | Me | Me | Me | Me | B-33 | B-33 |
| i-11 | Me | Me | Me | Me | B-42 | B-42 |
| i-12 | H | H | H | H | B-43 | B-43 |
| i-13 | H | H | H | Me | B-44 | B-44 |
| i-14 | Et | Et | Et | Et | B-45 | B-45 |
| i-15 | n-Bu | n-Bu | n-Bu | n-Bu | B-31 | B-33 |
| i-16 | Ph | Ph | Ph | Ph | B-4 | B-4 |
| i-17 | Me | Me | Me | Ph | B-5 | B-5 |
| i-18 | i-Pr | i-Pr | i-Pr | i-Pr | B-17 | B-17 |
| i-19 | 2-MeOEt | 2-MeOEt | 2-MeOEt | 2-MeOEt | B-1 | B-2 |
| i-20 | 3-tol | Me | 3-tol | Me | B-1 | B-1 |
| i-21 | Et | Et | Ph | Ph | B-8 | B-9 |
| i-22 | 4-tol | Ph | 4-tol | Me | B-8 | B-10 |
| i-23 | Me | Me | Me | Me | B-1 | B-8 |
| i-24 | 2-tol | Me | 2-tol | Me | B-30 | B-10 |
| i-25 | Me | Et | Me | Ph | B-1 | B-20 |

(j)

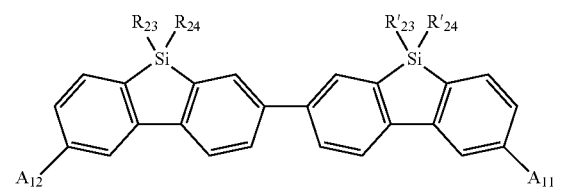

| Compound No. | R₂₃ | R₂₄ | R'₂₃ | R'₂₄ | A₁₁ | A₁₂ |
|---|---|---|---|---|---|---|
| j-1 | Me | Me | Me | Me | B-1 | B-1 |
| j-2 | Me | Me | Me | Me | B-2 | B-2 |
| j-3 | Me | Me | Me | Me | B-3 | B-3 |
| j-4 | Me | Me | Me | Me | B-8 | B-8 |
| j-5 | Me | Me | Me | Me | B-9 | B-9 |
| j-6 | Me | Me | Me | Me | B-10 | B-10 |
| j-7 | Me | Me | Me | Me | B-14 | B-14 |
| j-8 | Me | Me | Me | Me | B-21 | B-21 |
| j-9 | Me | Me | Me | Me | B-31 | B-31 |
| j-10 | Me | Me | Me | Me | B-33 | B-33 |
| j-11 | Me | Me | Me | Me | B-42 | B-42 |
| j-12 | H | H | H | H | B-43 | B-43 |
| j-13 | H | H | H | Me | B-44 | B-44 |
| j-14 | Et | Et | Et | Et | B-45 | B-45 |
| j-15 | n-Bu | n-Bu | n-Bu | n-Bu | B-31 | B-31 |
| j-16 | Ph | Ph | Ph | Ph | B-4 | B-4 |
| j-17 | Me | Me | Me | Ph | B-5 | B-5 |
| j-18 | i-Pr | i-Pr | i-Pr | i-Pr | B-18 | B-18 |
| j-19 | 2-MeOEt | 2-MeOEt | 2-MeOEt | 2-MeOEt | B-1 | B-2 |
| j-20 | 3-tol | Me | 3-tol | Me | B-4 | B-3 |
| j-21 | Et | Et | Ph | Ph | B-8 | B-9 |
| j-22 | 4-tol | Ph | 4-tol | Me | B-8 | B-10 |
| j-23 | Me | Me | Me | Me | B-4 | B-5 |
| j-24 | 2-tol | Me | 2-tol | Me | B-31 | B-10 |
| j-25 | Me | Et | Me | Ph | B-3 | B-20 |

(k)

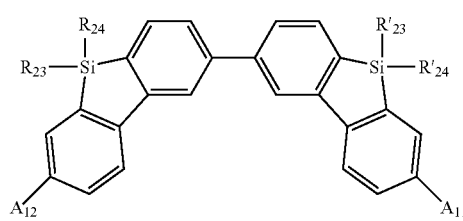

| Compound No. | R₂₃ | R₂₄ | R'₂₃ | R'₂₄ | A₁₁ | A₁₂ |
|---|---|---|---|---|---|---|
| k-1 | Me | Me | Me | Me | B-1 | B-1 |
| k-2 | Me | Me | Me | Me | B-2 | B-2 |
| k-3 | Me | Me | Me | Me | B-3 | B-3 |
| k-4 | Me | Me | Me | Me | B-8 | B-8 |
| k-5 | Me | Me | Me | Me | B-9 | B-9 |
| k-6 | Me | Me | Me | Me | B-10 | B-10 |
| k-7 | Me | Me | Me | Me | B-14 | B-14 |
| k-8 | Me | Me | Me | Me | B-25 | B-25 |
| k-9 | Me | Me | Me | Me | B-22 | B-22 |
| k-10 | Me | Me | Me | Me | B-29 | B-29 |
| k-11 | Me | Me | Me | Me | B-33 | B-33 |
| k-12 | H | H | H | H | B-42 | B-42 |
| k-13 | H | H | H | Me | B-45 | B-45 |
| k-14 | Et | Et | Et | Et | B-50 | B-50 |
| k-15 | n-Bu | n-Bu | n-Bu | n-Bu | B-31 | B-31 |
| k-16 | Ph | Ph | Ph | Ph | B-3 | B-3 |
| k-17 | Me | Me | Me | Ph | B-9 | B-9 |
| k-18 | i-Pr | i-Pr | i-Pr | i-Pr | B-17 | B-18 |
| k-19 | 2-MeOEt | 2-MeOEt | 2-MeOEt | 2-MeOEt | B-3 | B-2 |
| k-20 | 3-tol | Me | 3-tol | Me | B-4 | B-3 |
| k-21 | Et | Et | Ph | Ph | B-8 | B-9 |
| k-22 | 4-tol | Ph | Ph | Me | B-8 | B-10 |
| k-23 | Me | Me | Me | Me | B-4 | B-5 |
| k-24 | 3-tol | Me | 2-tol | Me | B-31 | B-10 |
| k-25 | Me | Et | Me | Ph | B-3 | B-21 |

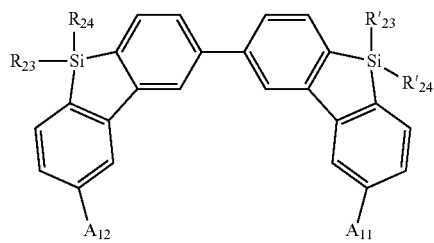

(I)

| Compound No. | R₂₃ | R₂₄ | R'₂₃ | R'₂₄ | A₁₁ | A₁₂ |
|---|---|---|---|---|---|---|
| l-1 | Me | Me | Me | Me | B-1 | B-1 |
| l-2 | Me | Me | Me | Me | B-2 | B-2 |
| l-3 | Me | Me | Me | Me | B-3 | B-3 |
| l-4 | Me | Me | Me | Me | B-8 | B-8 |
| l-5 | Me | Me | Me | Me | B-9 | B-9 |
| l-6 | Me | Me | Me | Me | B-10 | B-10 |
| l-7 | Me | Me | Me | Me | B-14 | B-14 |
| l-8 | Me | Me | Me | Me | B-22 | B-22 |
| l-9 | Me | Me | Me | Me | B-27 | B-27 |
| l-10 | Me | Me | Me | Me | B-33 | B-33 |
| l-11 | Me | Me | Me | Me | B-42 | B-42 |
| l-12 | H | H | H | H | B-43 | B-43 |
| l-13 | H | H | H | Me | B-44 | B-44 |
| l-14 | Et | Et | Et | Et | B-45 | B-45 |
| l-15 | n-Bu | n-Bu | n-Bu | n-Bu | B-31 | B-33 |
| l-16 | Ph | Ph | Ph | Ph | B-4 | B-4 |
| l-17 | Me | Me | Me | Ph | B-5 | B-5 |
| l-18 | i-Pr | i-Pr | i-Pr | i-Pr | B-17 | B-17 |
| l-19 | 2-MeOEt | 2-MeOEt | 2-MeOEt | 2-MeOEt | B-1 | B-2 |
| l-20 | 3-tol | Me | 3-tol | Me | B-1 | B-3 |
| l-21 | Et | Et | Ph | Ph | B-8 | B-9 |
| l-22 | 4-tol | Ph | 4-tol | Me | B-8 | B-10 |
| l-23 | Me | Me | Me | Me | B-1 | B-8 |
| l-24 | 2-tol | Me | 2-tol | Me | B-30 | B-10 |
| l-25 | Me | Et | Me | Ph | B-1 | B-20 |

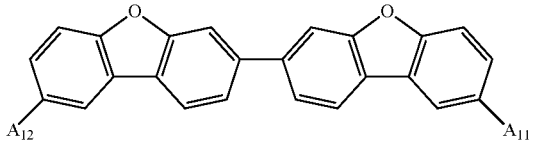

(n)

| Compound No. | A₁₁ | A₁₂ |
|---|---|---|
| n-1 | B-2 | B-2 |
| n-2 | B-3 | B-3 |
| n-3 | B-9 | B-9 |
| n-4 | B-10 | B-10 |
| n-10 | B-9 | B-9 |
| n-11 | B-14 | B-14 |
| n-12 | B-10 | B-10 |
| n-13 | B-8 | B-8 |
| n-14 | B-9 | B-9 |
| n-15 | B-10 | B-10 |
| n-16 | B-21 | B-21 |
| n-17 | B-26 | B-26 |
| n-18 | B-31 | B-31 |
| n-19 | B-38 | B-38 |
| n-20 | B-42 | B-42 |
| n-21 | B-51 | B-51 |
| n-22 | B-3 | B-4 |
| n-24 | B-5 | B-5 |
| n-25 | B-3 | B-10 |

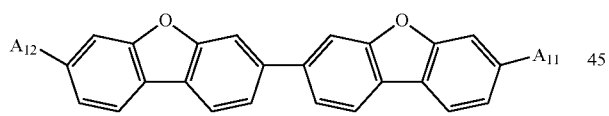

(m)

| Compound No. | A₁₁ | A₁₂ |
|---|---|---|
| m-1 | B-1 | B-1 |
| m-2 | B-2 | B-2 |
| m-3 | B-3 | B-3 |
| m-4 | B-8 | B-8 |
| m-5 | B-9 | B-9 |
| m-6 | B-10 | B-10 |
| m-7 | B-14 | B-14 |
| m-8 | B-25 | B-25 |
| m-9 | B-22 | B-22 |
| m-10 | B-29 | B-29 |
| m-11 | B-33 | B-33 |
| m-12 | B-42 | B-42 |
| m-13 | B-45 | B-45 |
| m-14 | B-50 | B-50 |
| m-15 | B-31 | B-31 |
| m-16 | B-3 | B-3 |
| m-17 | B-9 | B-9 |
| m-18 | B-17 | B-18 |
| m-19 | B-3 | B-2 |
| m-20 | B-4 | B-3 |

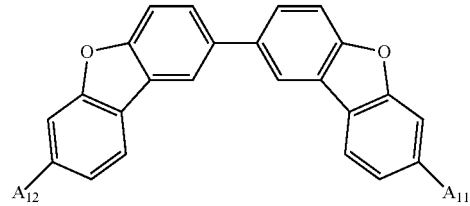

(o)

| Compound No. | A₁₁ | A₁₂ |
|---|---|---|
| o-1 | B-2 | B-2 |
| o-2 | B-3 | B-3 |
| o-3 | B-9 | B-9 |
| o-4 | B-10 | B-10 |
| o-10 | B-9 | B-9 |
| o-11 | B-14 | B-14 |
| o-12 | B-10 | B-10 |
| o-13 | B-8 | B-8 |
| o-14 | B-9 | B-9 |
| o-15 | B-10 | B-10 |
| o-16 | B-21 | B-21 |
| o-17 | B-26 | B-26 |
| o-18 | B-31 | B-31 |
| o-19 | B-37 | B-37 |
| o-20 | B-43 | B-43 |
| o-21 | B-48 | B-48 |
| o-22 | B-22 | B-22 |
| o-24 | B-28 | B-28 |
| o-25 | B-1 | B-9 |

(p)

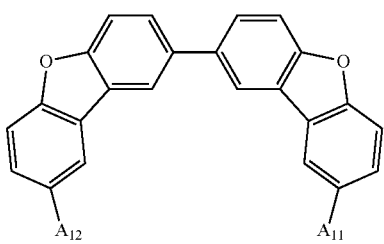

| Compound No. | $A_{11}$ | $A_{12}$ |
|---|---|---|
| p-1 | B-1 | B-1 |
| p-2 | B-2 | B-2 |
| p-3 | B-3 | B-3 |
| p-4 | B-8 | B-8 |
| p-5 | B-9 | B-9 |
| p-6 | B-10 | B-10 |
| P-7 | B-14 | B-14 |
| p-8 | B-22 | B-22 |
| p-9 | B-27 | B-27 |
| p-10 | B-33 | B-33 |
| p-11 | B-42 | B-42 |
| p-12 | B-43 | B-43 |
| p-13 | B-44 | B-44 |
| p-14 | B-45 | B-45 |
| p-15 | B-31 | B-33 |
| p-16 | B-4 | B-4 |
| p-17 | B-5 | B-5 |
| p-18 | B-17 | B-17 |
| p-19 | B-1 | B-2 |
| p-20 | B-1 | B-3 |
| p-21 | B-8 | B-9 |
| p-22 | B-8 | B-10 |
| p-23 | B-1 | B-8 |
| p-24 | B-30 | B-10 |
| p-25 | B-1 | B-20 |

(q)

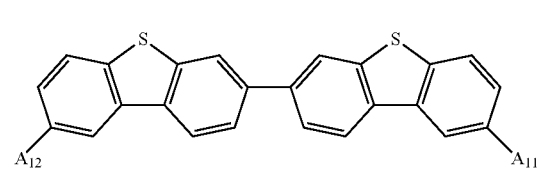

| Compound No. | $A_{11}$ | $A_{12}$ |
|---|---|---|
| q-1 | B-1 | B-1 |
| q-2 | B-2 | B-2 |
| q-3 | B-3 | B-3 |
| q-4 | B-8 | B-8 |
| q-5 | B-9 | B-9 |
| q-6 | B-10 | B-10 |
| q-7 | B-14 | B-14 |
| q-8 | B-22 | B-22 |
| q-9 | B-27 | B-27 |
| q-10 | B-33 | B-33 |
| q-11 | B-42 | B-42 |
| q-12 | B-43 | B-43 |
| q-13 | B-44 | B-44 |
| q-14 | B-45 | B-45 |
| q-15 | B-31 | B-33 |
| q-16 | B-4 | B-4 |
| q-17 | B-5 | B-5 |
| q-18 | B-17 | B-17 |
| q-19 | B-1 | B-2 |
| q-20 | B-1 | B-3 |
| q-21 | B-8 | B-9 |
| q-22 | B-8 | B-10 |
| q-23 | B-1 | B-8 |
| q-24 | B-30 | B-10 |
| q-25 | B-1 | B-20 |

(r)

| Compound No. | $A_{11}$ | $A_{12}$ |
|---|---|---|
| r-1 | B-1 | B-1 |
| r-2 | B-2 | B-2 |
| r-3 | B-3 | B-3 |
| r-4 | B-8 | B-8 |
| r-5 | B-9 | B-9 |
| r-6 | B-10 | B-10 |
| r-7 | B-14 | B-14 |
| r-8 | B-21 | B-21 |
| r-9 | B-23 | B-23 |
| r-10 | B-31 | B-33 |
| r-11 | B-42 | B-42 |
| r-12 | B-43 | B-43 |
| r-13 | B-47 | B-47 |
| r-14 | B-48 | B-48 |
| r-15 | B-31 | B-33 |
| r-16 | B-4 | B-4 |
| r-17 | B-5 | B-5 |
| r-18 | B-17 | B-17 |
| r-19 | B-1 | B-2 |
| r-20 | B-1 | B-3 |
| r-21 | B-8 | B-9 |
| r-22 | B-8 | B-10 |
| r-23 | B-1 | B-8 |
| r-24 | B-30 | B-10 |
| r-25 | B-1 | B-20 |

(s)

| Compound No. | $A_{11}$ | $A_{12}$ |
|---|---|---|
| s-1 | B-1 | B-1 |
| s-2 | B-2 | B-2 |
| s-3 | B-3 | B-3 |
| s-4 | B-8 | B-8 |
| s-5 | B-9 | B-9 |
| s-6 | B-10 | B-10 |
| s-7 | B-51 | B-51 |
| s-8 | B-46 | B-44 |
| s-9 | B-37 | B-37 |
| s-10 | B-38 | B-38 |
| s-11 | B-33 | B-35 |
| s-12 | B-27 | B-27 |
| s-13 | B-24 | B-24 |
| s-14 | B-7 | B-7 |
| s-15 | B-7 | B-24 |

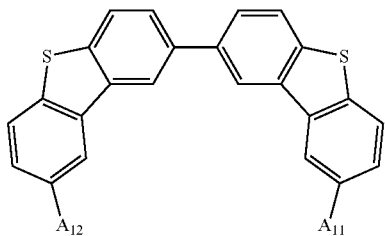
(t)
| Compound No. | $A_{11}$ | $A_{12}$ |
|---|---|---|
| t-1 | B-1 | B-1 |
| t-2 | B-2 | B-2 |
| t-3 | B-3 | B-3 |
| t-4 | B-8 | B-8 |
| t-5 | B-9 | B-9 |
| t-6 | B-10 | B-10 |
| t-7 | B-14 | B-14 |
| t-8 | B-20 | B-20 |
| t-9 | B-21 | B-21 |
| t-10 | B-1 | B-1 |
| t-11 | B-2 | B-2 |
| t-12 | B-3 | B-3 |
| t-13 | B-8 | B-8 |
| t-14 | B-9 | B-9 |
-continued
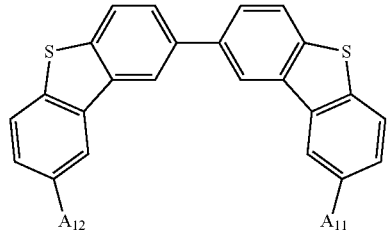
(t)
| Compound No. | $A_{11}$ | $A_{12}$ |
|---|---|---|
| t-15 | B-10 | B-10 |
| t-16 | B-4 | B-4 |
| t-17 | B-28 | B-28 |
| t-18 | B-36 | B-36 |
| t-19 | B-40 | B-40 |
| t-20 | B-45 | B-50 |
| t-21 | B-8 | B-9 |
| t-22 | B-8 | B-10 |
| t-23 | B-1 | B-1 |
| t-24 | B-3 | B-3 |
| t-25 | B-1 | B-8 |
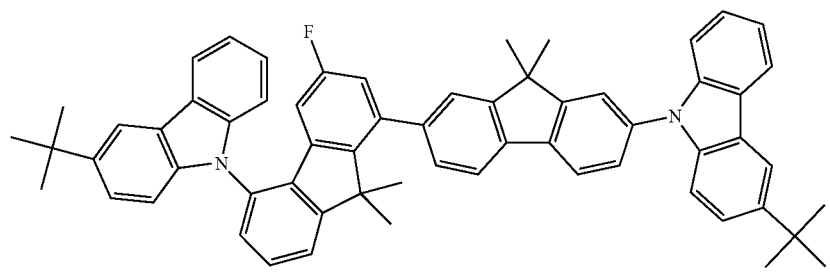
u-1
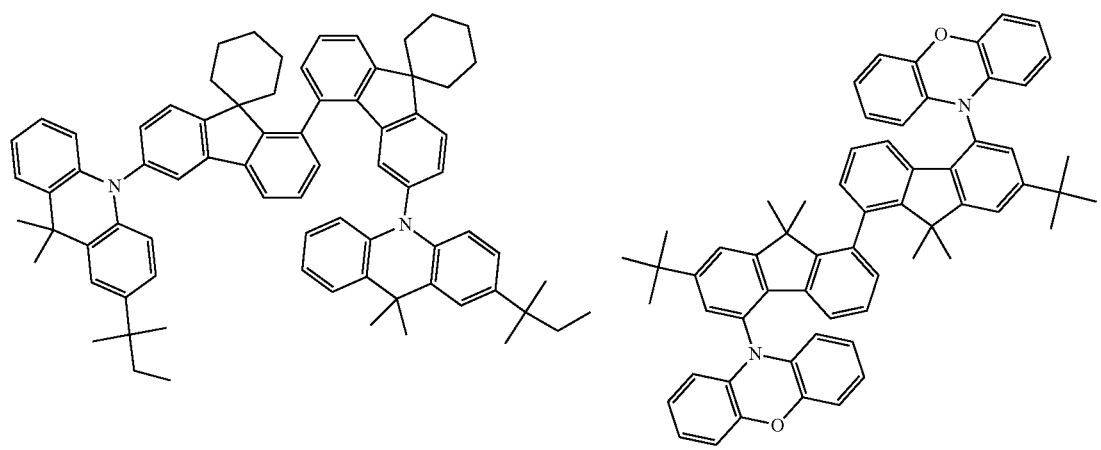
u-2
u-4

-continued
u-5
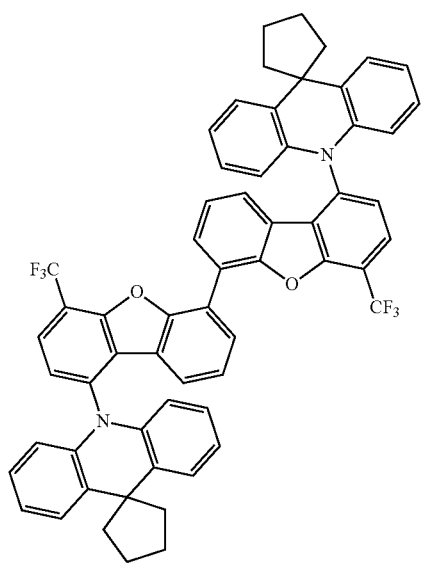
u-6
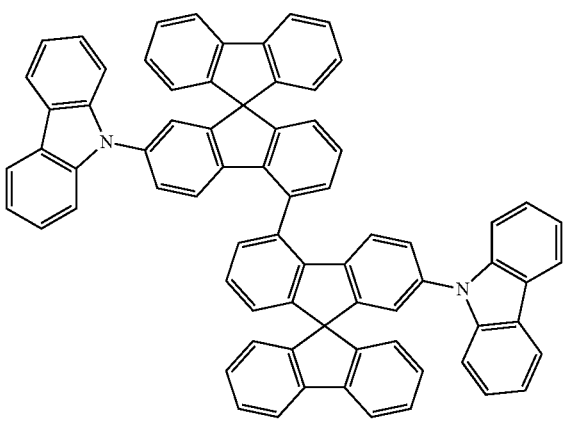
u-7
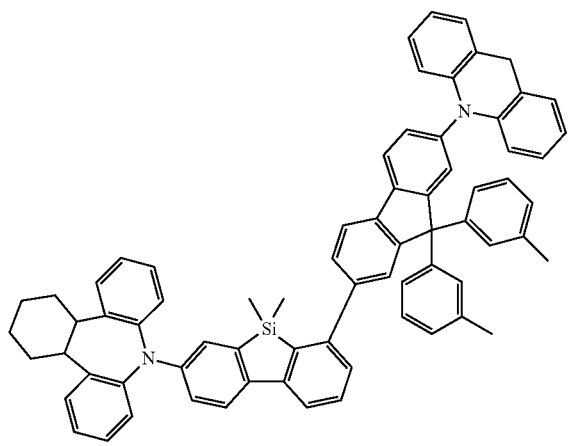
u-8
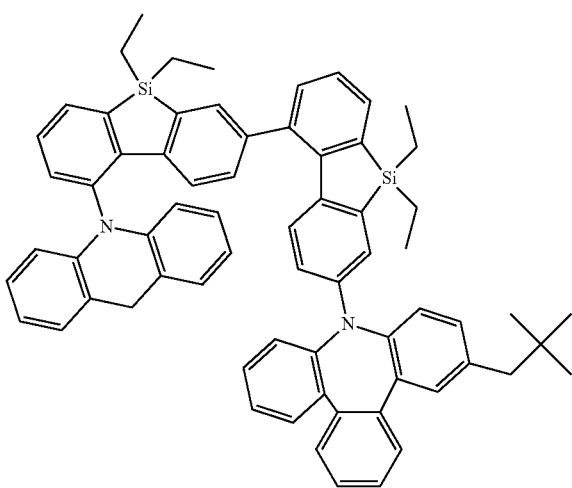
u-9
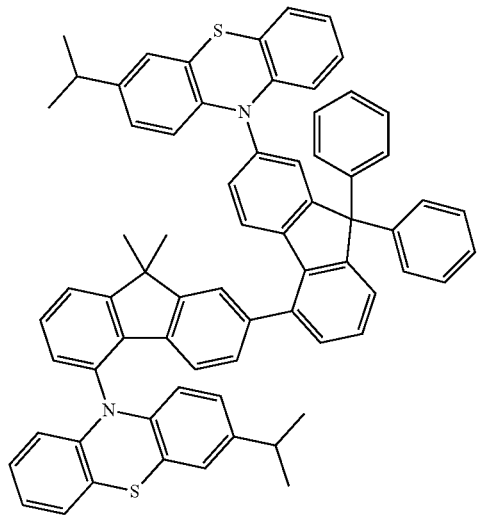
u-10

-continued
u-11
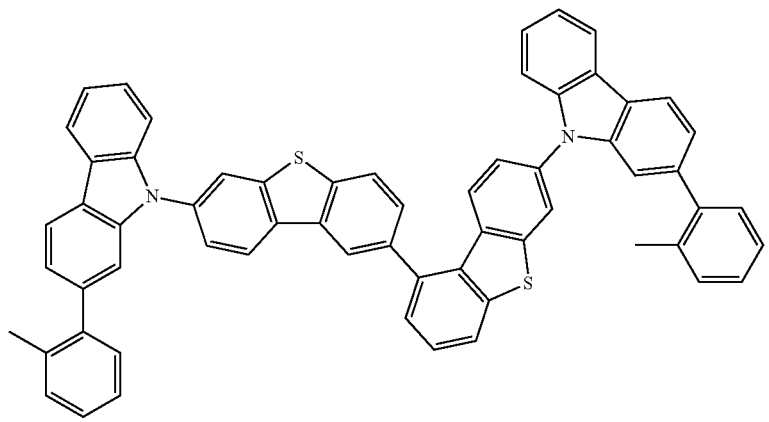
u-12
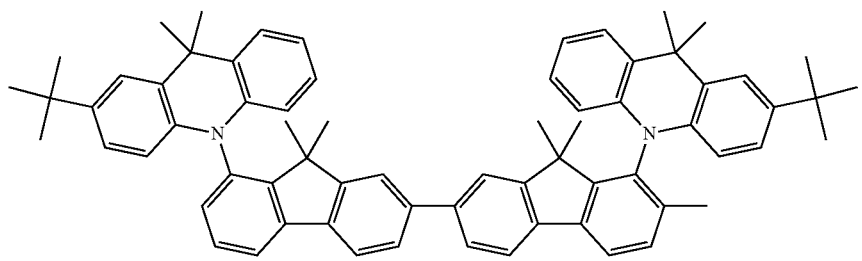
u-13
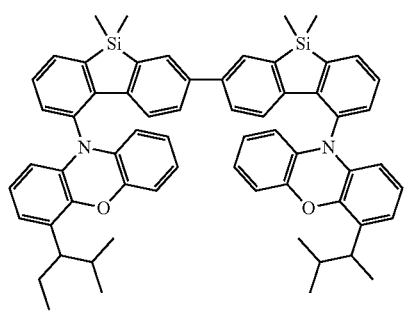
u-14
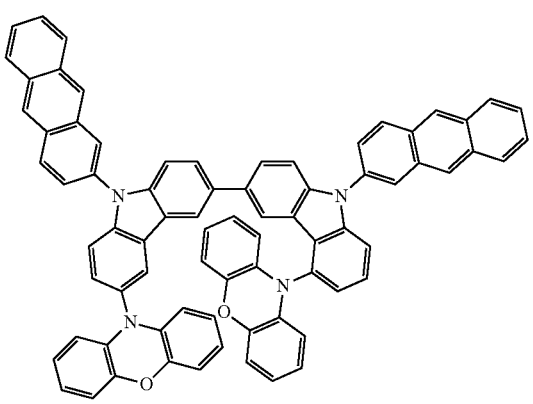
u-15
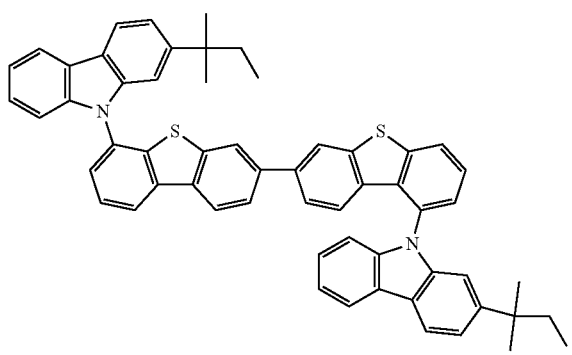
u-16
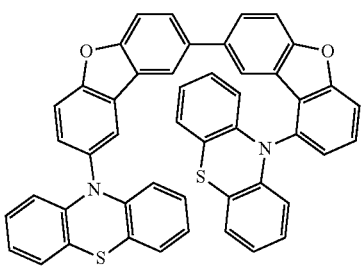

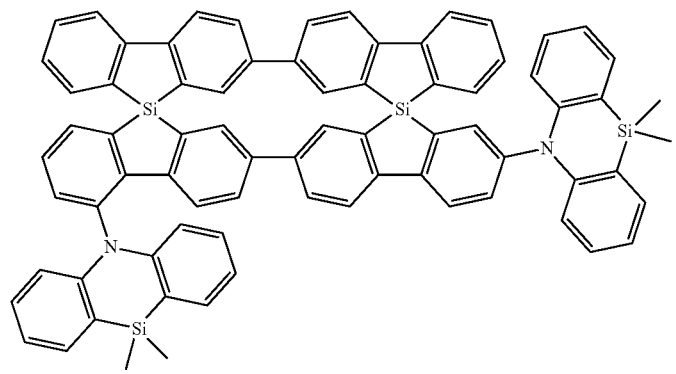
u-17
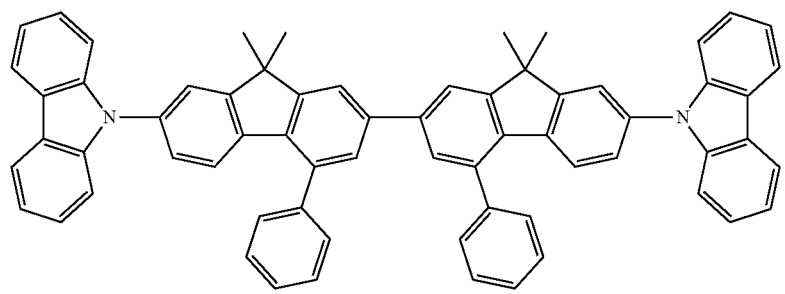
u-18
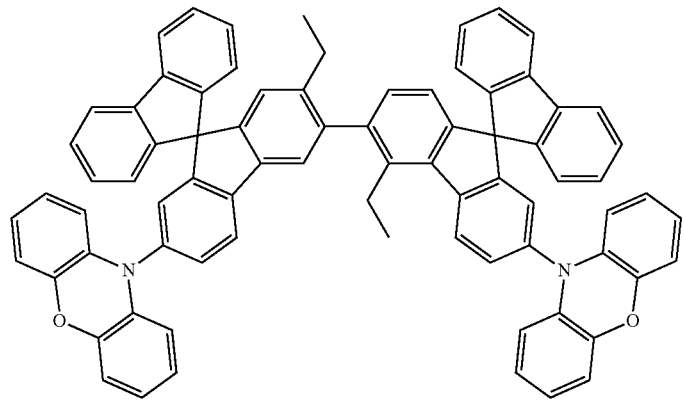
u-19
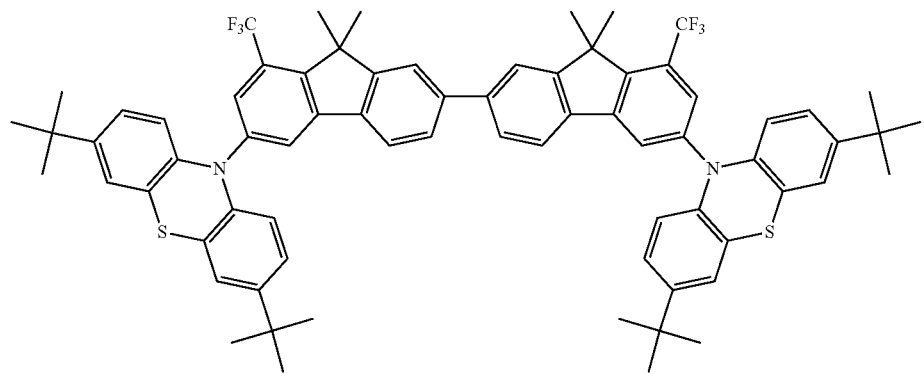
u-20

-continued
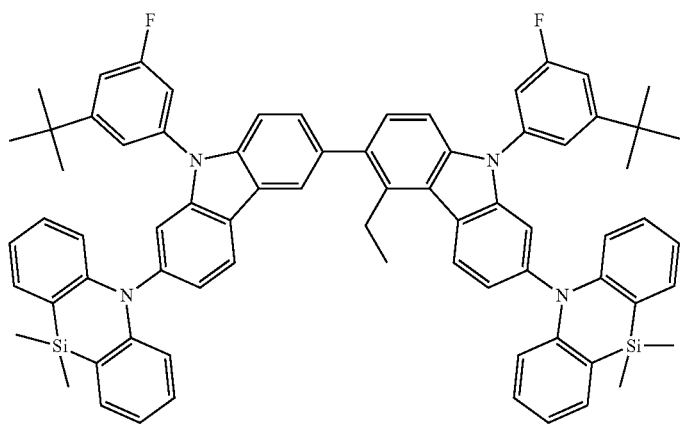
u-21
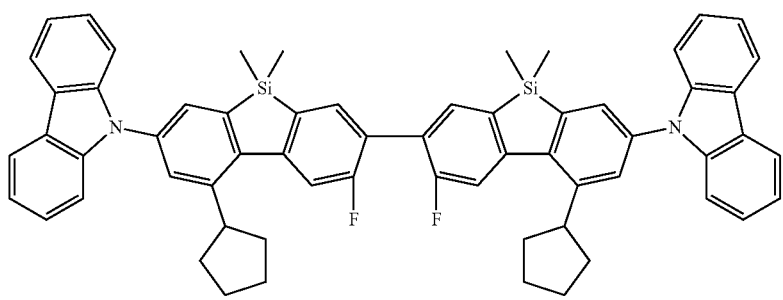
u-22
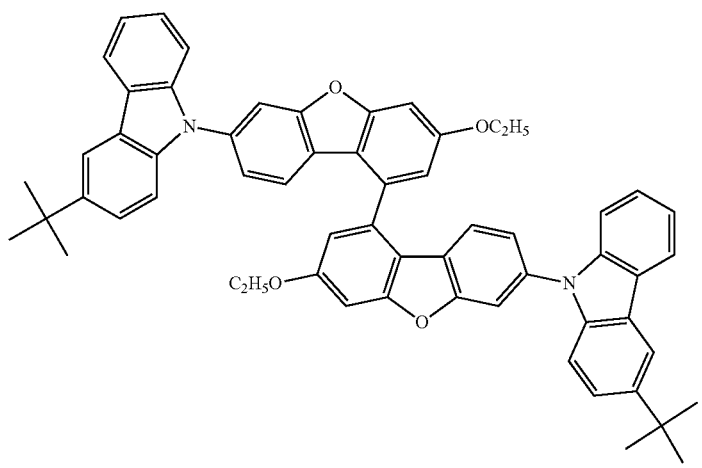
u-23
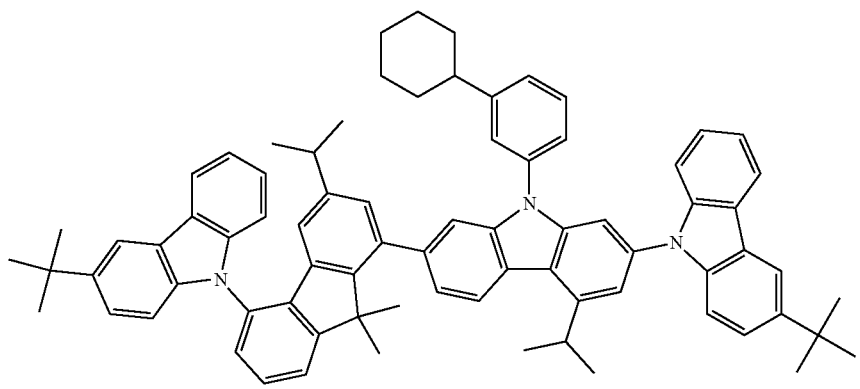
u-24

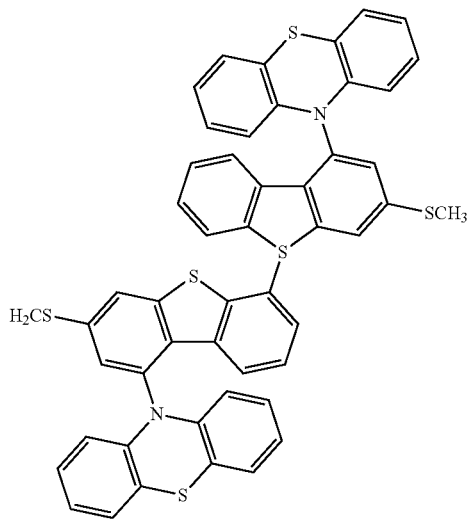

u-25

The molecular weight of the compound for use in the present invention is preferably from 500 to 2,000, more preferably from 500 to 1,500, still more preferably from 700 to 1,300. When the molecular weight is from 500 to 2,000, vapor deposition of the material becomes possible and the heat resistance can be more elevated.

The compound for use in the present invention can be synthesized by applying a known method.

The amount used of the compound of formula (F-1) is, when used for the charge blocking layer, preferably from 10 to 300 nm, more preferably from 30 to 150 nm, still more preferably from 50 to 100 nm, in terms of a single layer. In the case of using the compound for a layer interposed between the photoelectric conversion layer and the charge blocking layer, the amount used is preferably 100 nm or less, more preferably 50 nm or less, still more preferably 20 nm or less, in terms of a single layer.

The compound of formula (F-1) is contained in the charge blocking layer. In the electron blocking layer, the compound must have sufficiently small Ea in the portion contacting with an electrode so as to suppress injection of an electron from the electrode and in turn, the Ip of the portion tends to become relatively small. Also, in the electron blocking layer, the portion contacting with the photoelectric conversion layer must be designed to have smaller Ip than the Ip in the hole transport portion of the photoelectric conversion layer so as to receive a hole in the electron blocking layer from the photoelectric conversion layer without energy barriers. For these reasons, the material constituting the electron blocking must be often designed to have relatively small Ip, and in this case, the material of formula (F-1) can be used while more suppressing a source charge even when contacted with a material having large Ea in the photoelectric conversion layer, despite the same Ip.

Incidentally, in the case of having a hole blocking layer as in the embodiment shown in FIG. 1B, an electron-accepting material is preferably used as the material for forming the hole blocking layer.

Examples of the electron-accepting material which can be used include an oxadiazole derivative such as 1,3-bis(4-tert-butylphenyl-1,3,4-oxadiazolyl)phenylene (OXD-7); an anthraquinodimethane derivative; a diphenylquinone derivative; bathocuproine, bathophenanthroline and their derivatives; a triazole compound; a tris(8-hydroxyquinolinato)aluminum complex; a bis(4-methyl-8-quinolinato)aluminum complex; a distyrylarylene derivative; and a silole compound.

Also, a material having adequate electron transportability can be used even if it is not an electron-accepting organic material. A porphyrin-based compound, a styryl-based compound such as DCM (4-dicyanomethylene-2-methyl-6-(4-(dimethylaminostyryl))-4H-pyrane), and a 4H-pyrane-based compound can be used.

Specifically, the compounds illustrated below are preferred. In the following specific examples, Ea indicates the electron affinity (eV) of the material, and Ip indicates the ionization potential (eV) of the material.

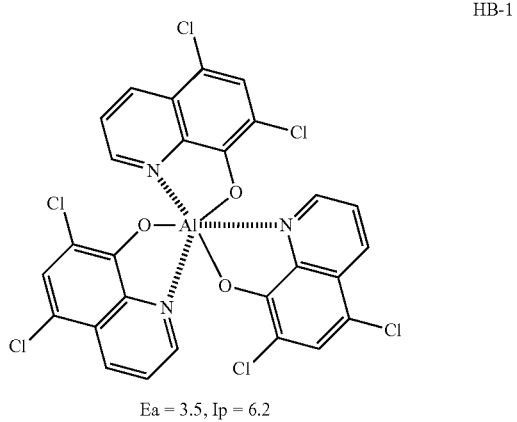

HB-1

Ea = 3.5, Ip = 6.2

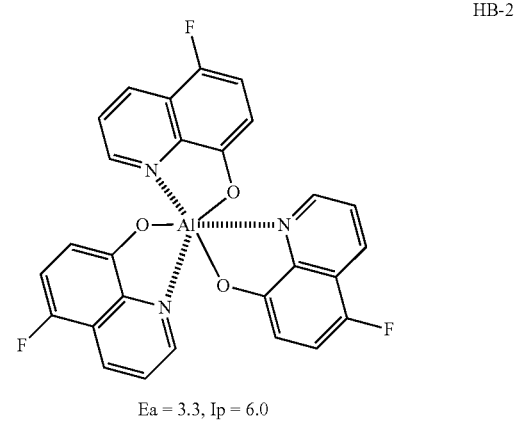

HB-2

Ea = 3.3, Ip = 6.0

HB-3

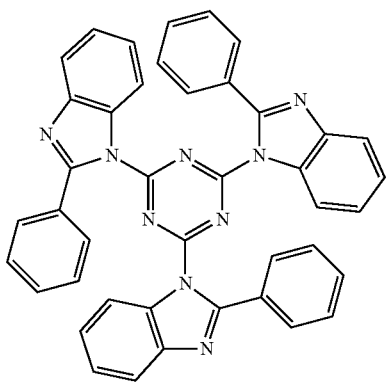

Ea = 3.7, Ip = 7.2

HB-4

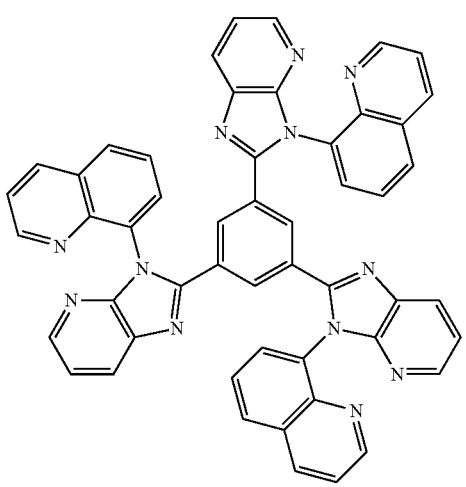

Ea = 3.6, Ip = 7.6

HB-5

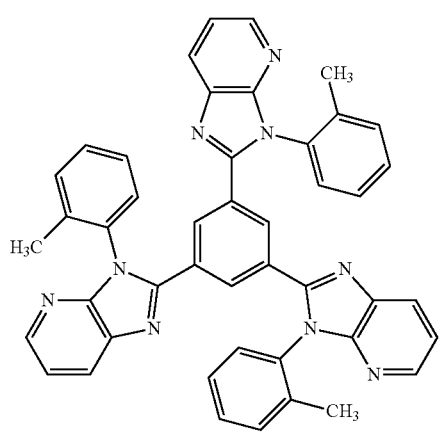

Ea = 3.6, Ip = 7.6

BCP

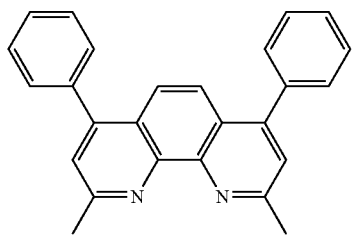

Ea = 3.2, Ip = 6.7

The charge blocking layer can be formed by vapor deposition. The vapor deposition may be either physical vapor deposition (PVD) or chemical vapor deposition (CVD), but physical vapor deposition such as vacuum deposition is preferred. In the case of depositing the film by vacuum deposition, the production conditions such as vacuum degree and deposition temperature can be set according to conventional methods.

The thickness of the charge blocking layer is preferably from 10 to 300 nm, more preferably from 30 to 150 nm, still more preferably from 50 to 100 nm. With a thickness of 10 nm or more, a suitable dark current-reducing effect is obtained, and with a thickness of 300 nm or less, a suitable photoelectric conversion efficiency is obtained.

Incidentally, a plurality of layers may be formed for the charge blocking layer.

(Photoelectric Conversion Layer)

The organic material constituting the photoelectric conversion layer 12 preferably contains at least either one of a p-type organic semiconductor and an n-type organic semiconductor, and it is more preferred to contain an n-type organic semiconductor. Also, as for the effect of the present invention, a great effect is brought out particularly when the photoelectric conversion layer contains a material having an electron affinity (Ea) of 4.0 eV or more. The material having an electron affinity (Ea) of 4.0 eV or more includes the later-described n-type organic semiconductor.

The p-type organic semiconductor (compound) is a donor-type organic semiconductor (compound) and indicates an organic compound having a property of readily donating an electron, mainly typified by a hole-transporting organic compound. More specifically, this is an organic compound having a smaller ionization potential when two organic materials are used in contact. Accordingly, the donor-type organic compound may be any organic compound as long as it is an organic compound having an electron donating property. Examples of the compound which can be used include a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbocyclic compound (e.g., naphthalene derivative, anthracene derivative, phenanthrene derivative, tetracene derivative, pyrene derivative, perylene derivative, fluoranthene derivative), and a metal complex having a nitrogen-containing heterocyclic compound as a ligand. The donor-type organic semiconductor is not limited to these compounds and, as described above, any organic compound having an ionization potential smaller than that of the organic compound used as an n-type (acceptor) compound may be used as the donor-type organic semiconductor.

Among these, a triarylamine compound is preferred.

Above all, a triarylamine compound represented by the following formula (I) is more preferred.

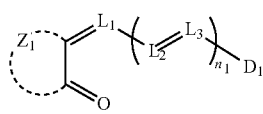

Formula (I)

wherein $Z_1$ represents an atomic group necessary for forming a 5- or 6-membered ring, each of $L_1$, $L_2$ and $L_3$ represents an unsubstituted methine group or a substituted methine group, $D_1$ represents an atomic group, and $n_1$ represents an integer of 0 or more.

In formula (I), $Z_1$ represents an atomic group necessary for forming a 5- or 6-membered ring, each of $L_1$, $L_2$ and $L_3$ represents an unsubstituted methine group or a substituted methine group, $D_1$ represents an atomic group, and $n_1$ represents an integer of 0 or more.

$Z_1$ represents an atomic group necessary for forming a 5- or 6-membered ring. The ring formed is preferably a ring usually used as an acidic nucleus in merocyanine dyes, and specific examples thereof include the followings:

(a) a 1,3-dicarbonyl nucleus, such as 1,3-indanedione nucleus, 1,3-cyclohexanedione, 5,5-dimethyl-1,3-cyclohexanedione and 1,3-dioxane-4,6-dione; (b) a pyrazolinone nucleus, such as 1-phenyl-2-pyrazolin-5-one, 3-methyl-1-phenyl-2-pyrazolin-5-one and 1-(2-benzothiazoyl)-3-methyl-2-pyrazolin-5-one; (c) an isoxazolinone nucleus, such as 3-phenyl-2-isoxazolin-5-one and 3-methyl-2-isoxazolin-5-one; (d) an oxyindole nucleus, such as 1-alkyl-2,3-dihydro-2-oxyindole; (e) a 2,4,6-triketohexahydropyrimidine nucleus, such as barbituric acid, 2-thiobarbituric acid and their derivatives, and examples of the derivative include a 1-alkyl form such as 1-methyl and 1-ethyl, a 1,3-dialkyl form such as 1,3-dimethyl, 1,3-diethyl and 1,3-dibutyl, a 1,3-diaryl form such as 1,3-diphenyl, 1,3-di(p-chlorophenyl) and 1,3-di(p-ethoxycarbonylphenyl), a 1-alkyl-1-aryl form such as 1-ethyl-3-phenyl, and a 1,3-diheterocyclic substitution form such as 1,3-di(2-pyridyl); (f) a 2-thio-2,4-thiazolidinedione nucleus, such as rhodanine and its derivatives, and examples of the derivative include a 3-alkylrhodanine such as 3-methylrhodanine, 3-ethylrhodanine and 3-allylrhodanine, a 3-arylrhodanine such as 3-phenylrhodanine, and a 3-heterocyclic ring-substituted rhodanine such as 3-(2-pyridyl)rhodanine, (g) a 2-thio-2,4-oxazolidinedione (2-thio-2,4-(3H,5H)-oxazoledione) nucleus, such as 3-ethyl-2-thio-2,4-oxazolidinedione; (h) a thianaphthenone nucleus, such as 3(2H)-thianaphthenone-1,1-dioxide; (i) a 2-thio-2,5-thiazolidinedione nucleus, such as 3-ethyl-2-thio-2,5-thiazolidinedione; (j) a 2,4-thiazolidinedione nucleus, such as 2,4-thiazolidinedione, 3-ethyl-2,4-thiazolidinedione and 3-phenyl-2,4-thiazolidinedione; (k) a thiazolin-4-one nucleus, such as 4-thiazolinone and 2-ethyl-4-thiazolinone; (l) a 2,4-imidazolidinedione (hydantoin) nucleus, such as 2,4-imidazolidinedione and 3-ethyl-2,4-imidazolidinedione; (m) a 2-thio-2,4-imidazolidinedione (2-thiohydantoin) nucleus, such as 2-thio-2,4-imidazolidinedione and 3-ethyl-2-thio-2,4-imidazolidinedione; (n) an imidazolin-5-one nucleus, such as 2-propylmercapto-2-imidazolin-5-one; (o) a 3,5-pyrazolidinedione nucleus, such as 1,2-diphenyl-3,5-pyrazolidinedione and 1,2-dimethyl-3,5-pyrazolidinedione; (p) a benzothiophen-3-one nucleus, such as benzothiophen-3-one, oxobenzothiophen-3-one and dioxobenzothiophen-3-one; and (q) an indanone nucleus, such as 1-indanone, 3-phenyl-1-indanone, 3-methyl-1-indanone, 3,3-diphenyl-1-indanone and 3,3-dimethyl-1-indanone.

The ring formed by $Z_1$ is preferably a 1,3-dicarbonyl nucleus, a pyrazolinone nucleus, a 2,4,6-triketohexahydropyrimidine nucleus (including a thioketone form, e.g., barbituric acid nucleus, 2-thiobarbituric acid nucleus), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus or an indanone nucleus, more preferably a 1,3-dicarbonyl nucleus, a 2,4,6-triketohexahydropyrimidine nucleus (including a thioketone form, e.g., barbituric acid nucleus, 2-thiobarbituric acid nucleus), a 3,5-pyrazolidinedione nucleus, a benzothiophen-3-one nucleus or an indanone nucleus, still more preferably a 1,3-dicarbonyl nucleus or a 2,4,6-triketohexahydropyrimidine nucleus (including a thioketone form, e.g., barbituric acid nucleus, 2-thiobarbituric acid nucleus), yet still more preferably a 1,3-indanedione nucleus, a barbituric acid nucleus, a 2-thiobarbituric acid nucleus or a derivative thereof.

The ring formed by $Z_1$ is preferably a ring represented by the following formula:

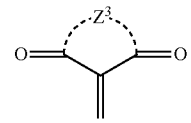

$Z^3$ represents an atomic group necessary for forming a 5- or 6-membered ring. $Z^3$ can be selected from the above-described rings formed by $Z_1$ and is preferably a 1,3-dicarbonyl nucleus or a 2,4,6-triketohexahydropyrimidine nucleus (including a thioketone form), more preferably a 1,3-indanedione nucleus, a barbituric acid nucleus, a 2-thiobarbituric acid nucleus or a derivative thereof.

It has been found that by controlling the interaction between acceptor parts, high hole transportability can be brought out when depositing the film by vapor co-deposition with $C_{60}$. The interaction can be controlled by the structure of the acceptor part and the introduction of a substituent working out to a steric hindrance. In the barbituric acid nucleus and 2-thiobarbituric acid nucleus, both two hydrogens at two N-positions are preferably substituted for by a substituent, whereby the intermolecular interaction can be controlled. Examples of the substituent include the later-described substituent W, and the substituent is preferably an alkyl group, more preferably a methyl group, an ethyl group, a propyl group or a butyl group.

In the case where the ring formed by $Z_1$ is a 1,3-indanedione nucleus, a group represented by the following formula (IV) or a group represented by the following formula (V) is preferred.

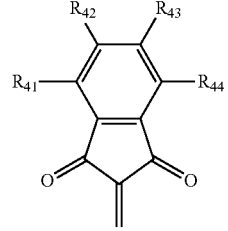

Formula (IV)

wherein each of $R_{41}$ to $R_{44}$ independently represents a hydrogen atom or a substituent.

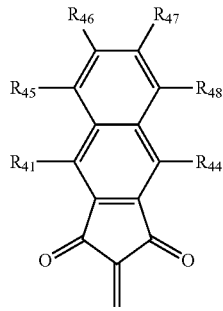

Formula (V)

wherein each of $R_{41}$, $R_{44}$ and $R_{45}$ to $R_{48}$ independently represents a hydrogen atom or a substituent.

In the case of a group represented by formula (IV), each of $R_{41}$ to $R_{44}$ independently represents a hydrogen atom or a substituent. As to the substituent, for example, those described as the substituent W may be applied. Adjacent members out of $R_{41}$ to $R_{44}$ may combine to form a ring, and it is preferred that $R_{42}$ and $R_{43}$ combine together to form a ring (for example, a benzene ring, a pyridine ring or a pyrazine ring). Preferably, all of $R_{41}$ to $R_{44}$ are a hydrogen atom.

The group represented by formula (IV) is preferably a group represented by formula (V). In the case of a group represented by formula (V), each of $R_{41}$, $R_{44}$ and $R_{45}$ to $R_{48}$ independently represents a hydrogen atom or a substituent. As to the substituent, for example, those described as the substituent W may be applied. It is preferred that all of $R_{41}$, $R_{44}$ and $R_{45}$ to $R_{48}$ are a hydrogen atom.

In the case where the ring formed by $Z_1$ is a 2,4,6-triketohexahydropyrimidine nucleus (including a thioketone form), a group represented by the following formula (VI) is preferred.

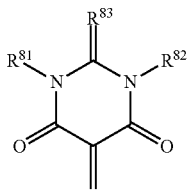

Formula (VI)

wherein each of $R_{81}$ and $R_{82}$ independently represents a hydrogen atom or a substituent, and $R_{83}$ represents an oxygen atom, a sulfur atom or a substituent.

In the case of a group represented by formula (VI), each of $R_{81}$ and $R_{82}$ independently represents a hydrogen atom or a substituent. As to the substituent, for example, those described as the substituent W may be applied. Each of $R_{81}$ and $R_{82}$ is independently preferably an alkyl group, an aryl group or a heterocyclic group (e.g., 2-pyridyl), more preferably an alkyl group having a carbon number of 1 to 6 (e.g., methyl, ethyl, n-propyl, tert-butyl).

$R_{83}$ represents an oxygen atom, a sulfur atom or a substituent, but $R_{83}$ preferably represents an oxygen atom or a sulfur atom. The substituent is preferably a substituent with the bonding part being a nitrogen atom or a carbon atom. In the case of a nitrogen atom, the substituent is preferably an alkyl group (having a carbon number of 1 to 12) or an aryl group (having a carbon number of 6 to 12), and specific examples thereof include a methylamino group, an ethylamino group, a butylamino group, a hexylamino group, a phenylamino group and a naphthylamino group. In the case of a carbon atom, it may be sufficient if at least one electron-withdrawing group is further substituted. The electron-withdrawing group includes a carbonyl group, a cyano group, a sulfoxide group, a sulfonyl group and a phosphoryl group and preferably further has a substituent. Examples of this substituent include the substituent W. $R_{83}$ preferably forms a 5- or 6-membered ring containing the carbon atom, and specific examples thereof include those having the following structures.

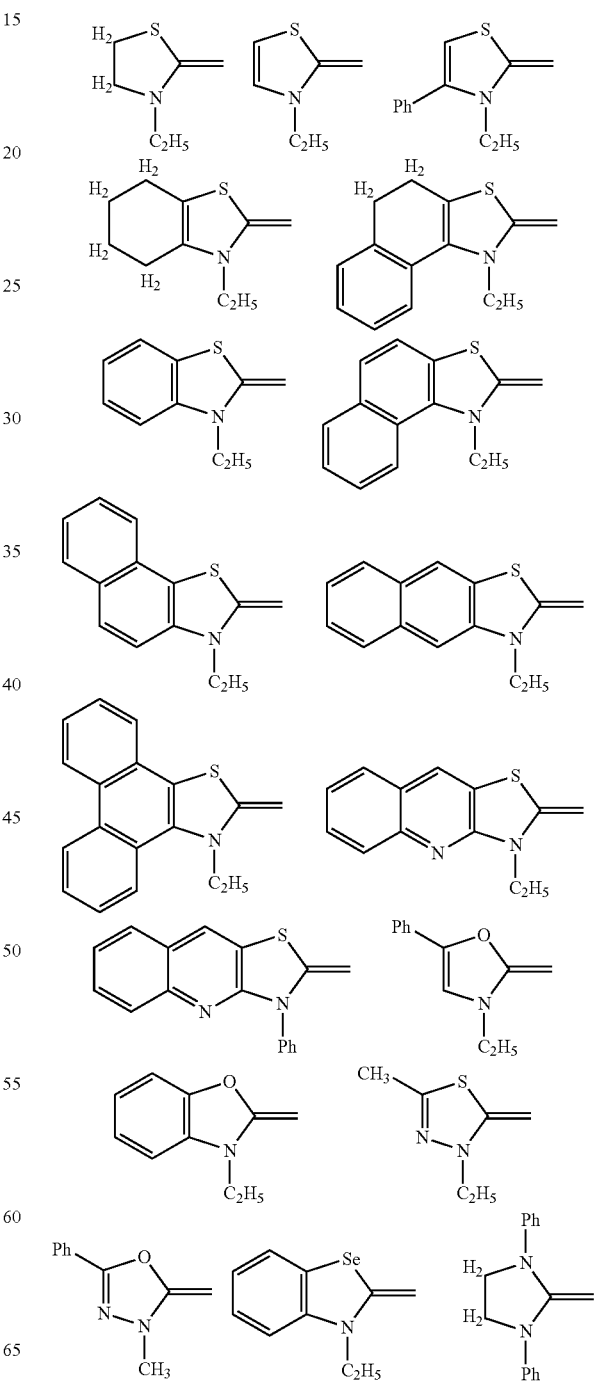

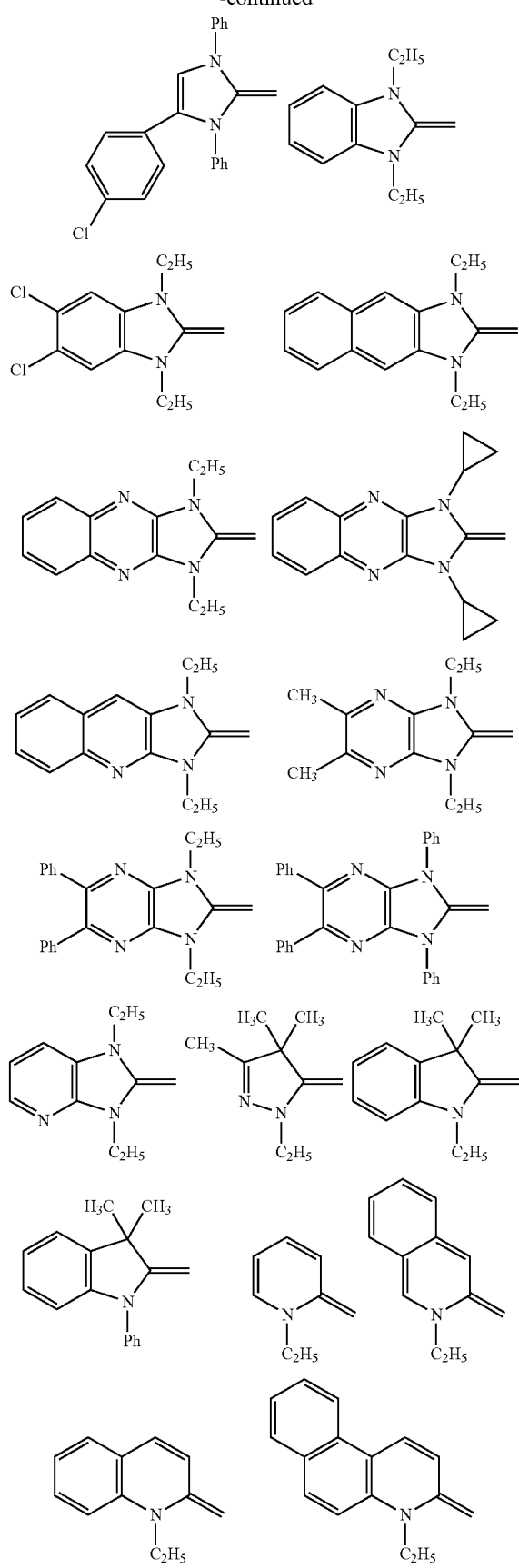
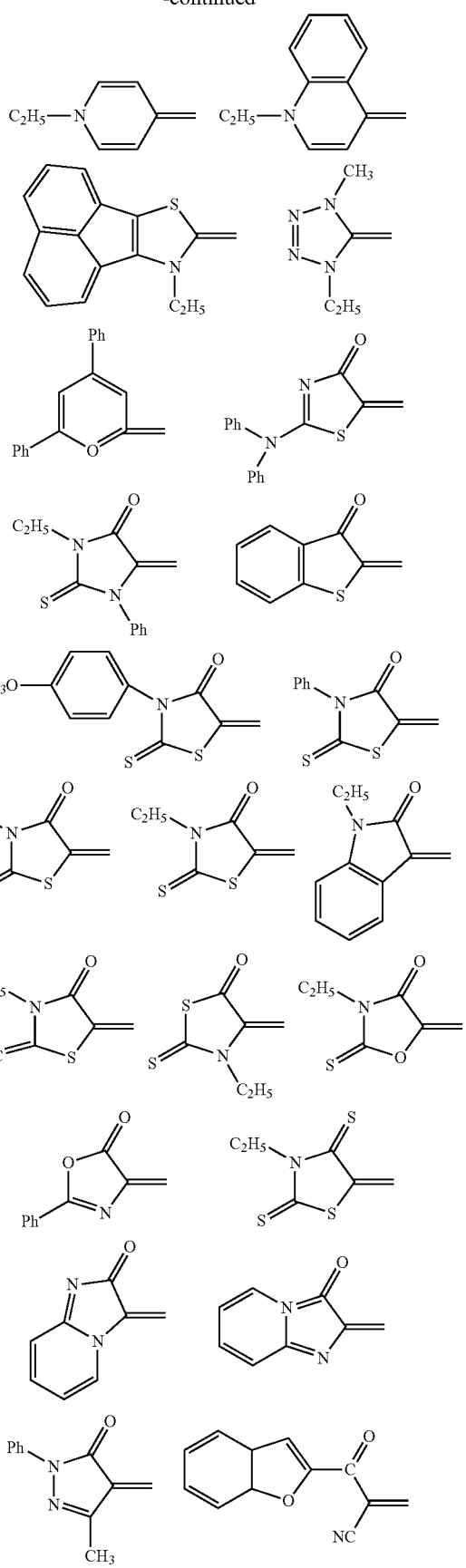

-continued

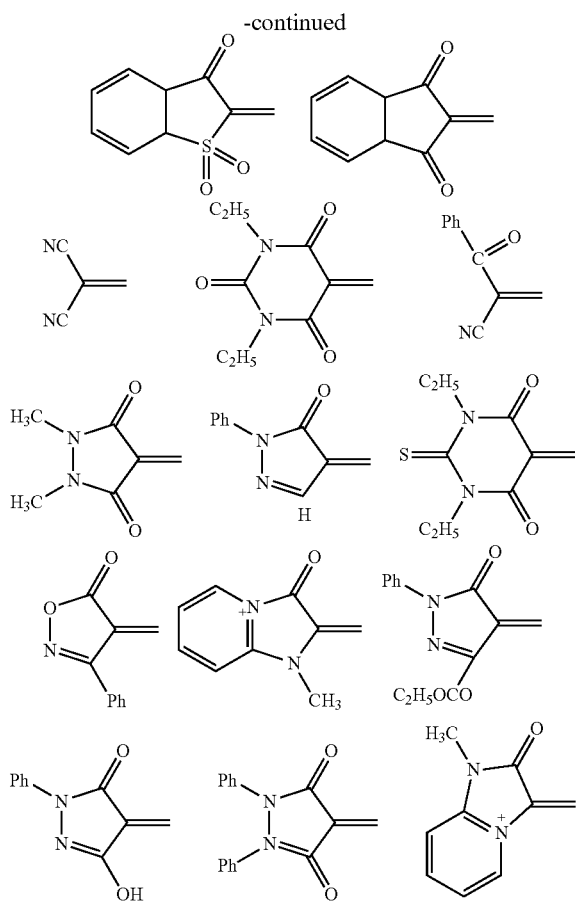

In the groups above, Ph indicates a phenyl group.

Each of $L_1$, $L_2$ and $L_3$ independently represents an unsubstituted methine group or a substituted methine group. Substituted methine groups may combine together to form a ring (for example, a 6-membered ring such as benzene ring). Examples of the substituent of the substituted methine group include the substituent W, and it is preferred that all of $L_1$, $L_2$ and $L_3$ are an unsubstituted methine group.

$n_1$ represents an integer of 0 or more, preferably represents an integer of 0 to 3, and is more preferably 0. When $n_1$ becomes large, the absorption wavelength region is allowed to reside on a long wavelength side, but the thermal decomposition temperature lowers. From the standpoint of having appropriate absorption in the visible region and suppressing thermal decomposition at the vapor deposition of film, n is preferably 0.

$D_1$ represents an atomic group. $D_1$ is preferably a group containing —$NR^a(R^b)$, and it is more preferred that $D_1$ represents an aryl group (preferably a phenyl or naphthyl group which may be substituted) substituted with —$NR^a(R^b)$. Each of $R^a$ and $R^b$ independently represents a hydrogen atom or a substituent, and examples of the substituent represented by $R^a$ and $R^b$ include the substituent W, but the substituent is preferably an aliphatic hydrocarbon group (preferably an alkyl or alkenyl group which may be substituted), an aryl group (preferably a phenyl group which may be substituted) or a heterocyclic group. The heterocyclic group is preferably a 5-membered ring such as furan, thiophene, pyrrole and oxadiazole.

In the case where each of $R^a$ and $R^b$ is a substituent (preferably an alkyl group or an alkenyl group), the substituent may form a ring (preferably a 6-membered ring) by combining with a hydrogen atom or a substituent in the aromatic ring (preferably benzene ring) skeleton of the aryl group substituted with —$NR^a(R^b)$. In this case, $D_1$ is preferably represented by formula (VIII), (IX) or (X) described later.

The substituents $R^a$ and $R^b$ may combine together to form a ring (preferably a 5- or 6-membered ring, more preferably a 6-membered ring), or each of $R^a$ and $R^b$ may combine with a substituent in L (indicates any one of $L_1$, $L_2$ and $L_3$) to form a ring (preferably a 5- or 6-membered ring, more preferably a 6-membered ring).

$D_1$ is preferably an aryl group (preferably a phenyl group) substituted with an amino group at the para-position and in this case, preferably represented by the following formula (II). The amino group may be substituted. Examples of the substituent of the amino group include the substituent W, but the substituent is preferably an aliphatic hydrocarbon group (preferably an alkyl group which may be substituted), an aryl group (preferably a phenyl group which may be substituted) or a heterocyclic group. The amino group is preferably an amino group substituted with two aryl groups, a so-called diaryl group-substituted amino group. In this case, $D_1$ is preferably represented by the following formula (III). The substituent (preferably an alkyl or alkenyl group which may be substituted) of the amino group may combine with a hydrogen atom or a substituent in the aromatic ring (preferably benzene ring) skeleton of the aryl group to form a ring (preferably a 6-membered ring).

Formula (II)

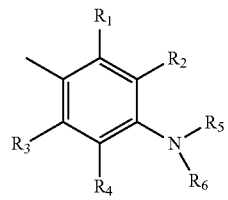

wherein each of $R_1$ to $R_8$ independently represents a substituent and out of these substituents, and $R_1$ and $R_2$, $R_3$ and $R_4$, $R_5$ and $R_6$, $R_2$ and $R_5$, or $R_4$ and $R_6$ may combine together to form a ring.

Formula (III)

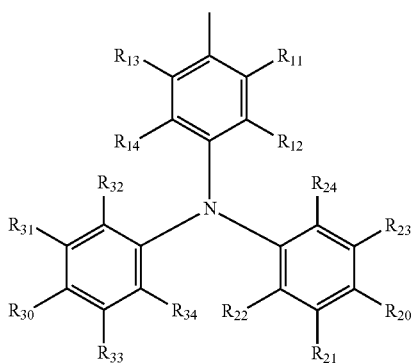

wherein each of $R_{11}$ to $R_{14}$, $R_{20}$ to $R_{24}$ and $R_{30}$ to $R_{34}$ independently represents a hydrogen atom or a substituent, and $R_{11}$ to $R_{14}$, $R_{20}$ to $R_{24}$, or $R_{30}$ to $R_{34}$ may combine with each other to form a ring.

In the case where each of $R^a$ and $R^b$ is an aliphatic hydrocarbon group, an aryl group or a heterocyclic group, the substituent is preferably an alkyl group, an alkenyl group, an aryl group, an alkoxy group, an aryloxy group, an acyl group, an alkoxycarbonyl group, an aryloxycarbonyl group, an acylamino group, a sulfonylamino group, a sulfonyl group, a silyl group or an aromatic heterocyclic group, more preferably an alkyl group, an alkenyl group, an aryl group, an alkoxy group, an aryloxy group, a silyl group or an aromatic heterocyclic group, still more preferably an alkyl group, an aryl group, an alkoxy group, an aryloxy group, a silyl group or an aromatic heterocyclic group. As for specific examples, those described as the substituent W may be applied.

Each of $R^a$ and $R^b$ is preferably an alkyl group, an aryl group or an aromatic heterocyclic group. Each of $R^a$ and $R^b$ is more preferably an alkyl group, an alkylene group forming a ring by combining with L, or an aryl group, still more preferably an alkyl group having a carbon number of 1 to 8, an alkylene group forming a 5- or 6-membered ring by combining with L, or a substituted or unsubstituted phenyl group, yet still more preferably an alkyl group having a carbon number of 1 to 8, or a substituted or unsubstituted phenyl group.

It is also preferred that $D_1$ is represented by the following formula (VII):

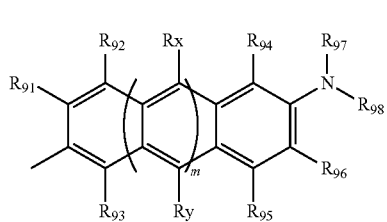

Formula (VII)

wherein each of $R_{91}$ to $R_{98}$ independently represents a hydrogen atom or a substituent; m represents an integer of 0 or more, and m is preferably 0 or 1; each of Rx and Ry independently represents a hydrogen atom or a substituent and when m is 2 or more, Rx's or Ry's bonded to respective 6-membered rings may be different substituents; and $R_{91}$ and $R_{92}$, $R_{92}$ and Rx, Rx and $R_{94}$, $R_{94}$ and $R_{97}$, $R_{93}$ and Ry, Ry and $R_{95}$, $R_{95}$ and $R_{96}$, or $R_{97}$ and $R_{98}$ may independently combine together to form a ring. The bonding part to $L_3$ (when n is 0, to $L_1$) may be the position of $R_{91}$, $R_{92}$ or $R_{93}$ and in this case, the substituent or hydrogen atom corresponding to $R_{91}$, $R_{92}$ or $R_{93}$ may be bonded to the site denoted as the bonding part to $L_3$ in formula (VII) and adjacent R's may combine together to form a ring. The expression "adjacent R's may combine together to form a ring" as used herein indicates that, for example, in the case where $R_{91}$ is the bonding part to $L_3$ (when n is 0, to $L_1$), assuming that $R_{90}$ is bonded to the bonding part of formula (VII), $R_{90}$ and $R_{93}$ may combine to form a ring; in the case where $R_{92}$ is the bonding part to $L_3$ (when n is 0, to $L_1$), assuming that $R_{90}$ is bonded to the bonding part of formula (VII), $R_{90}$ and $R_{91}$, or $R_{90}$ and $R_{93}$ may combine together to form a ring; and in the case where $R_{93}$ is the bonding part to $L_3$ (when n is 0, to $L_1$), assuming that $R_{90}$ is bonded to the bonding part of formula (VII), $R_{90}$ and $R_{91}$, or $R_{91}$ and $R_{92}$ may combine together to form a ring.

The ring above is preferably a benzene ring.

Examples of the substituents $R_{91}$ to $R_{98}$, Rx and Ry include the substituent W.

All of $R_{91}$ to $R_{96}$ are preferably a hydrogen atom, and both Rx and Ry are preferably a hydrogen atom. It is preferred that $R_{91}$ to $R_{96}$ are a hydrogen atom and at the same time, Rx and Ry are a hydrogen atom.

Each of $R_{97}$ and $R_{98}$ is independently preferably a phenyl group which may be substituted, and examples of the substituent include the substituent W, but an unsubstituted phenyl group is preferred.

m represents an integer of 0 or more and is preferably 0 or 1.

It is also preferred that $D_1$ is a group represented by formula (VIII), (IX) or (X).

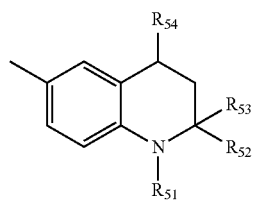

Formula (VIII)

wherein each of $R_{51}$ to $R_{54}$ independently represents hydrogen or a substituent. Examples of the substituent include the substituent W. $R_{52}$ and $R_{53}$, or $R_{51}$ and $R_{52}$ may combine together to form a ring.

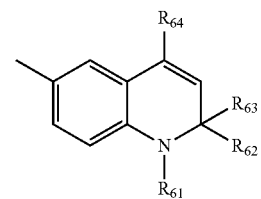

Formula (IX)

wherein each of $R_{61}$ to $R_{64}$ independently represents hydrogen or a substituent. Examples of the substituent include the substituent W. $R_{62}$ and $R_{63}$, or $R_{61}$ and $R_{62}$ may combine together to form a ring.

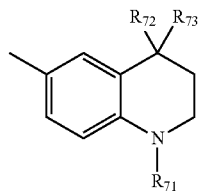

Formula (X)

wherein each of $R_{71}$ to $R_{73}$ independently represents hydrogen or a substituent. Examples of the substituent include the substituent W. $R_{72}$ and $R_{73}$ may combine together to form a ring.

$D_1$ is more preferably a group represented by formula (II) or (III).

In formula (II), each of $R_1$ to $R_6$ independently represents a hydrogen atom or a substituent, and $R_1$ and $R_2$, $R_3$ and $R_4$, $R_5$ and $R_6$, $R_2$ and $R_5$, or $R_4$ and $R_6$ may combine together to form a ring.

Examples of the substituent in $R_1$ to $R_4$ include the substituent W. It is preferred that $R_1$ to $R_4$ are a hydrogen atom or that $R_2$ and $R_5$, or $R_4$ and $R_6$ form a 5-membered ring, and more preferably, all of $R_1$ to $R_4$ are a hydrogen atom.

Examples of the substituent in $R_5$ and $R_6$ include the substituent W. Among the substituents, a substituted or unsubstituted aryl group is preferred. The substituent of the substituted aryl is preferably an alkyl group (e.g., methyl, ethyl) or an aryl group (e.g., phenyl, naphthylene, phenanthryl, anthryl). Each of $R_5$ and $R_6$ is preferably a phenyl group, an alkyl-substituted phenyl group, a phenyl-substituted phenyl group, a naphthyl group, a phenanthryl group, an anthryl group or a fluorenyl group (preferably 9,9'-dimethyl-2-fluorenyl group).

In formula (III), each of $R_{11}$ to $R_{14}$, $R_{20}$ to $R_{24}$ and $R_{30}$ to $R_{34}$ independently represents a hydrogen atom or a substituent. Also, $R_{11}$ to $R_{14}$, $R_{20}$ to $R_{24}$, or $R_{30}$ to $R_{34}$ may combine together to form a ring. Examples of the ring formation include a case where $R_{11}$ and $R_{12}$, or $R_{13}$ and $R_{14}$ combine to form a benzene ring, a case where two adjacent members of $R_{20}$ to $R_{24}$ ($R_{24}$ and $R_{23}$, $R_{23}$ and $R_{20}$, $R_{20}$ and $R_{21}$, or $R_{21}$ and $R_{22}$) combine to form a benzene ring, a case where two adjacent members of $R_{30}$ to $R_{34}$ ($R_{34}$ and $R_{33}$, $R_{33}$ and $R_{30}$, $R_{30}$ and $R_{31}$, or $R_{31}$ and $R_{32}$) combine to form a benzene ring, and a case where $R_{22}$ and $R_{34}$ combine to form a 5-membered ring together with the N atom.

Examples of the substituent represented by $R_{11}$ to $R_{14}$, $R_{20}$ to $R_{24}$ and $R_{30}$ to $R_{34}$ include the substituent W. The substituent is preferably an alkyl group (e.g., methyl, ethyl) or an aryl group (e.g., phenyl, naphthyl), and such a group may be further substituted with the substituent W (preferably an aryl group). Above all, a case where $R_{20}$ and $R_{30}$ are a substituent is preferred, and a case where at the same time, the others $R_{11}$ to $R_{14}$, $R_{21}$ to $R_{24}$ and $R_{31}$ to $R_{34}$ are a hydrogen atom is more preferred.

The compound represented by formula (I) is a compound described in JPA-2000-297068, and the compounds not described in this patent publication can be also produced in accordance with the synthesis methods described in the publication.

Specific examples of the compound represented by formula (I) are illustrated below, but the present invention is not limited thereto.

(1)

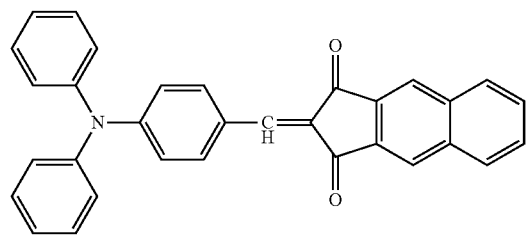

(2)

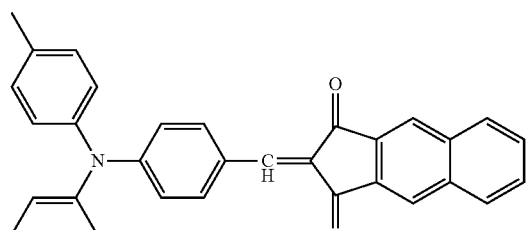

(3)

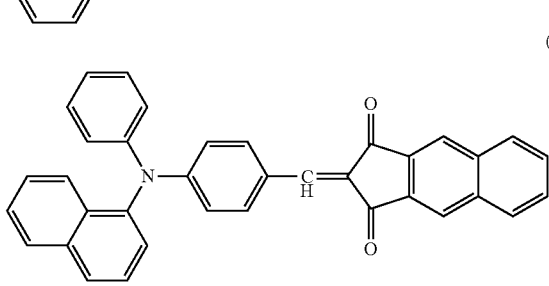

(4)

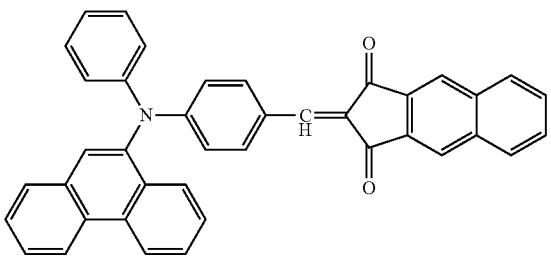

(5)

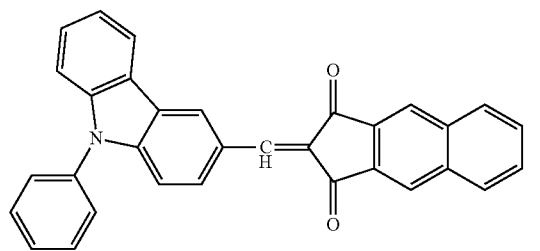

(6)

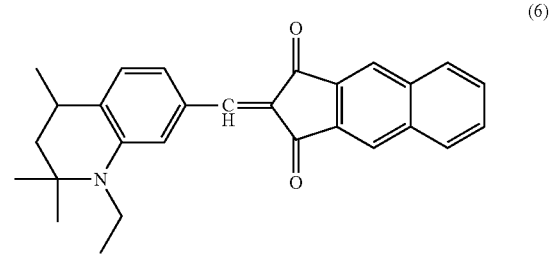

(7)

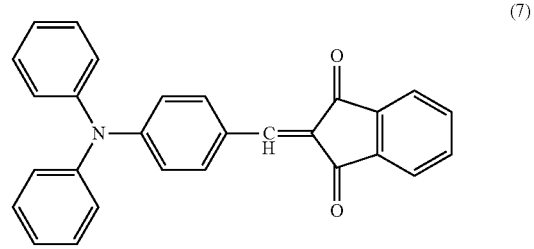

(8)

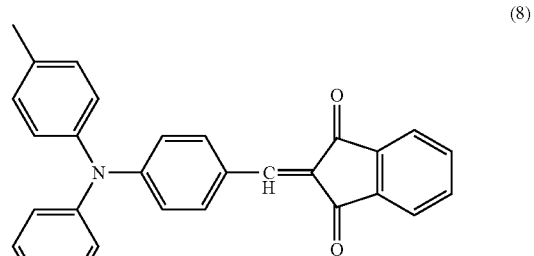

(9)

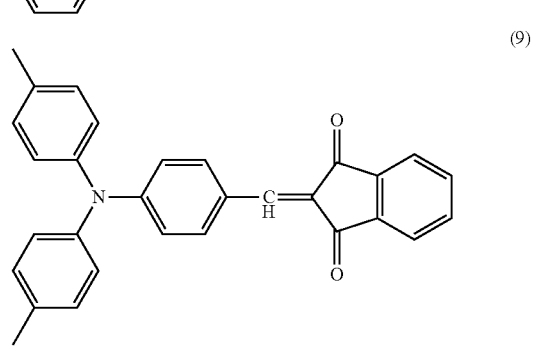

(10)
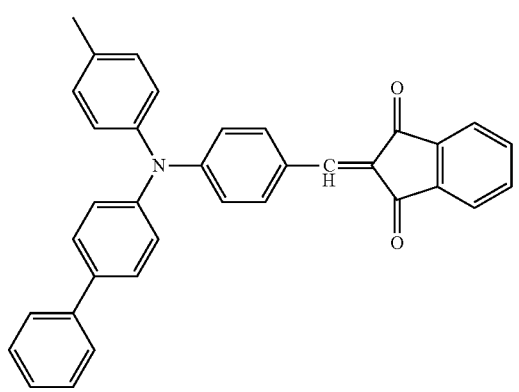
(11)
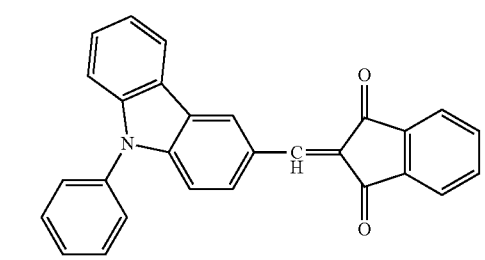
(12)
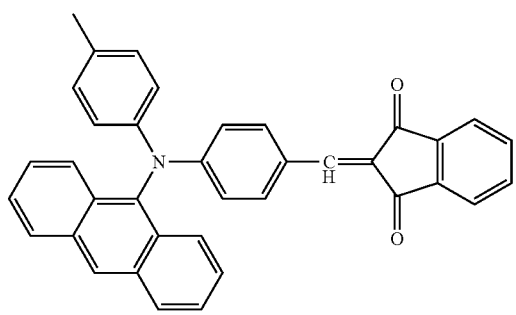
(13)
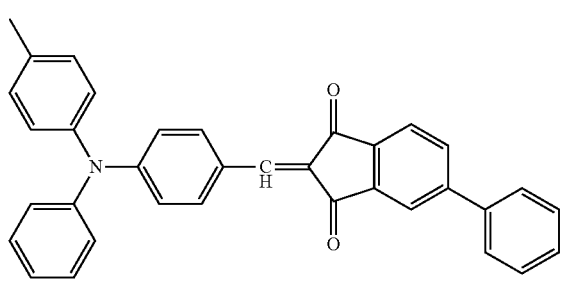
(14)
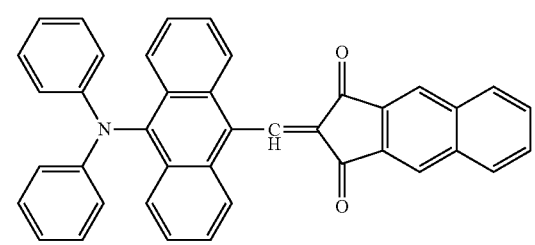
(15)
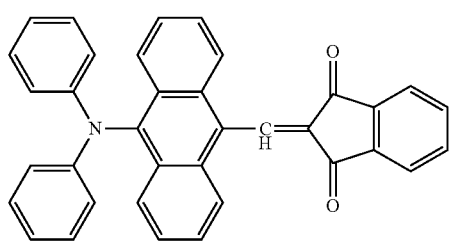
(16)
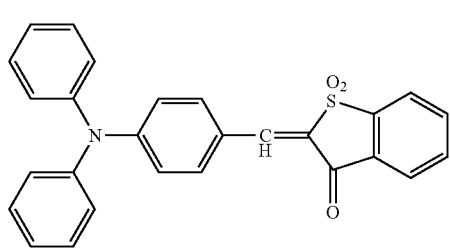
(17)
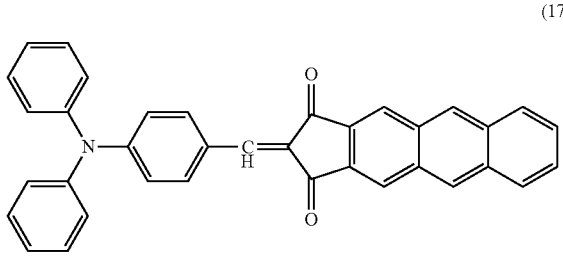
(18)
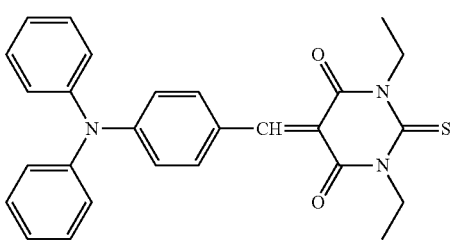
(19)
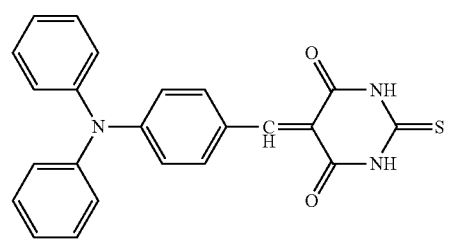
(20)
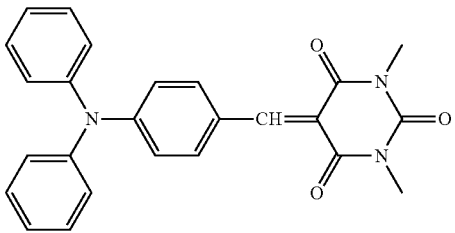

(21) 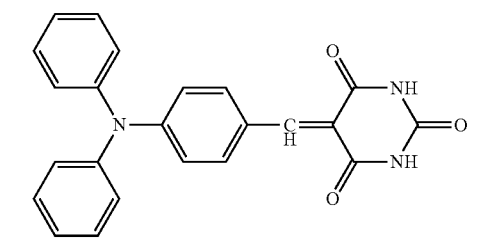
(22) 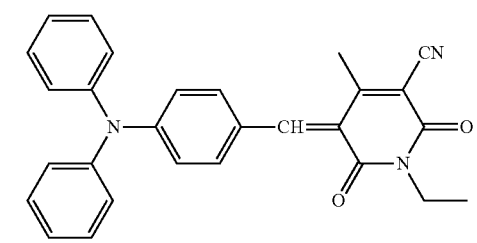
(23) 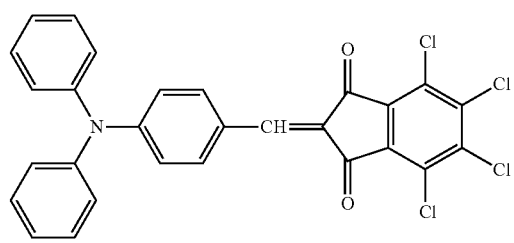
(24) 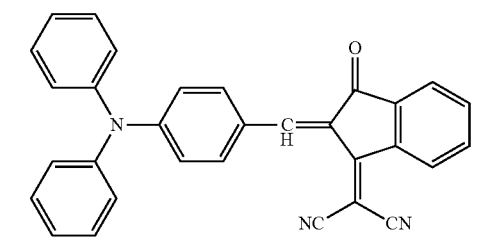
(25) 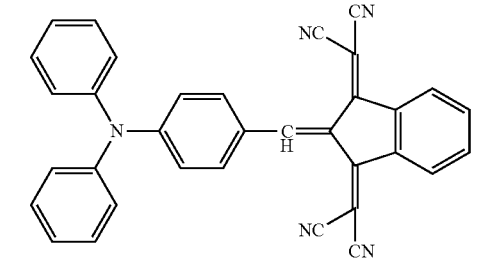
(26) 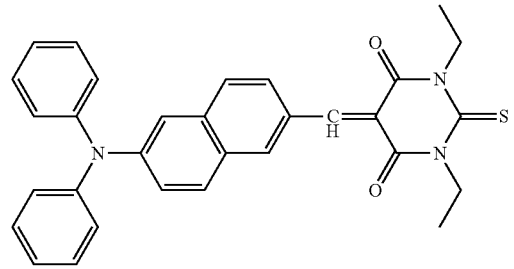
(27) 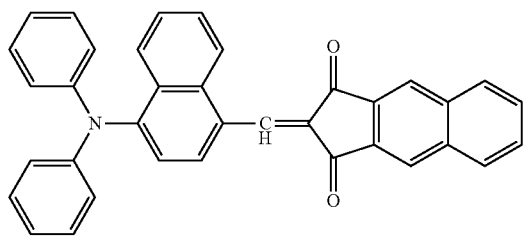
(28) 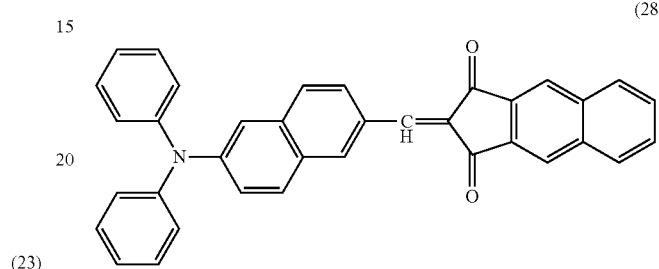
(29) 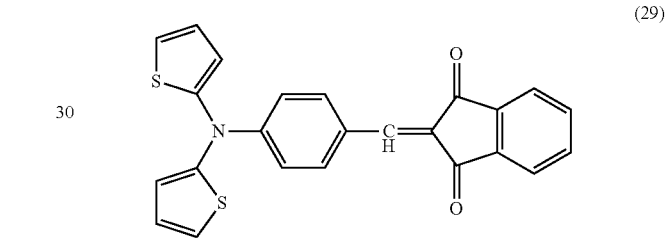
(30) 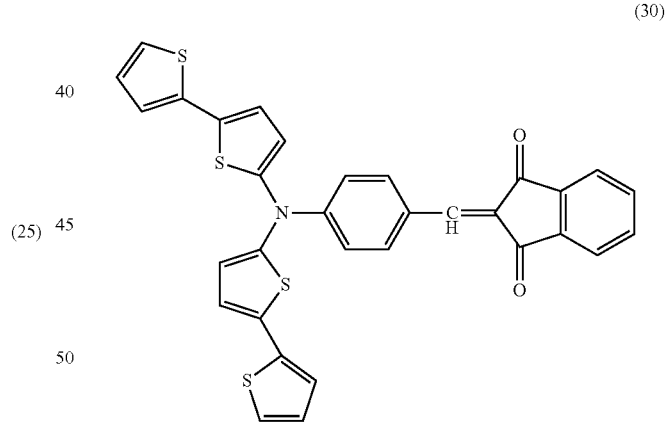
(31) 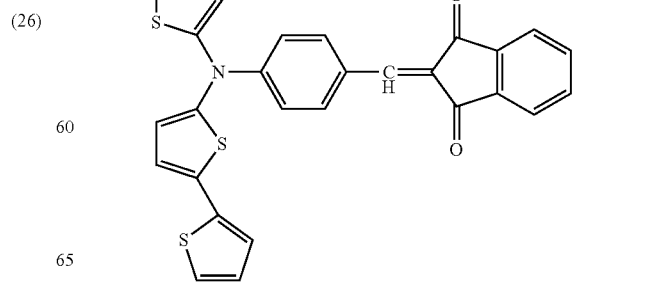

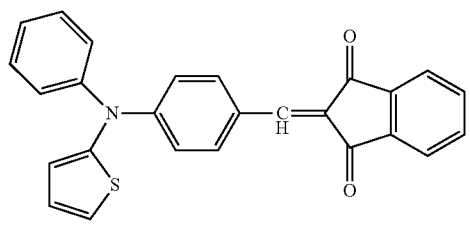
(32)
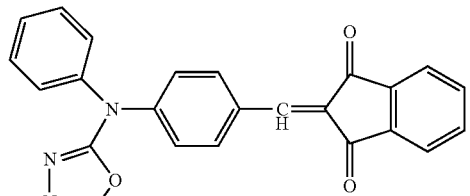
(33)
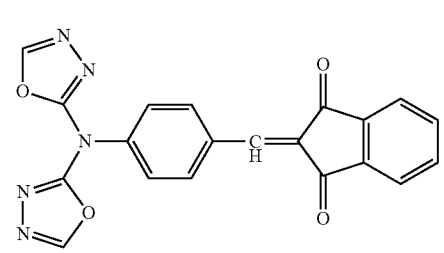
(34)
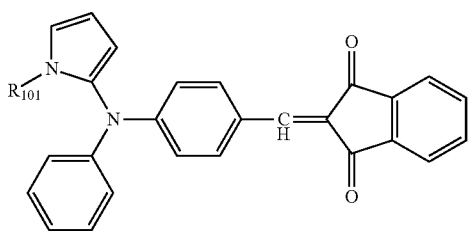
(35)
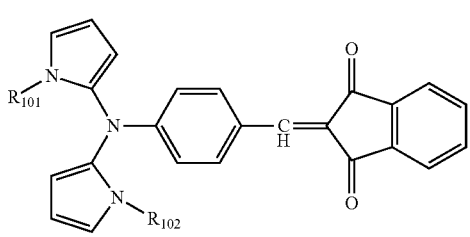
(36)
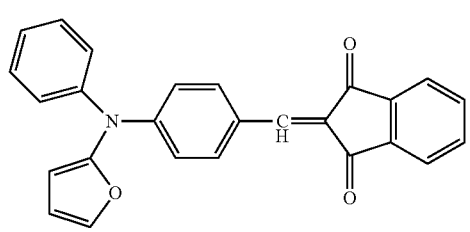
(37)
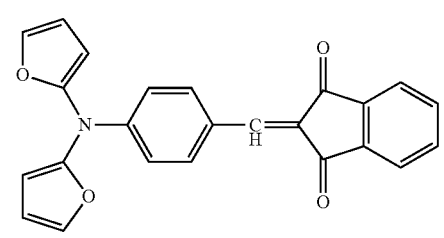
(38)
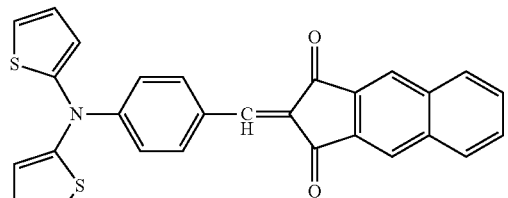
(39)
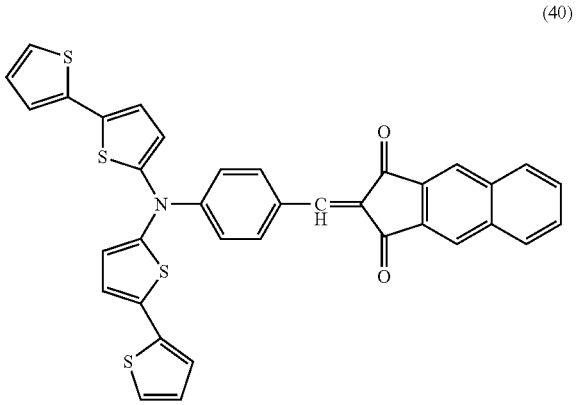
(40)
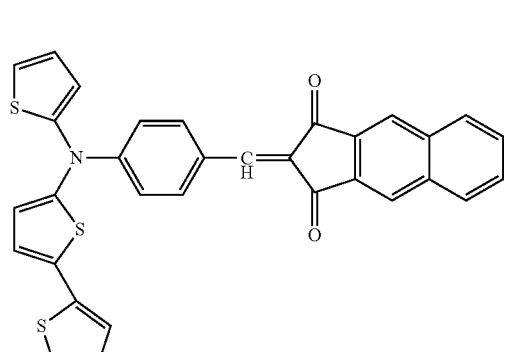
(41)
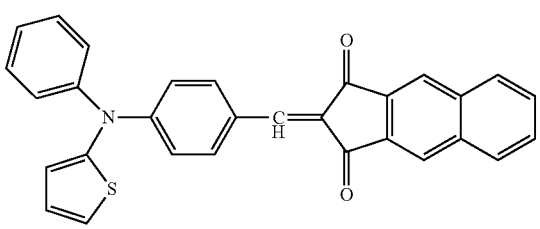
(42)
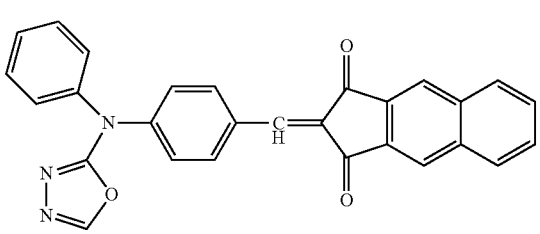
(43)

77
-continued
(44)
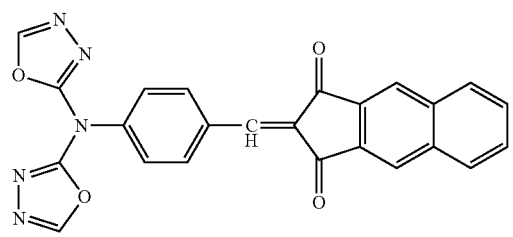
(45)
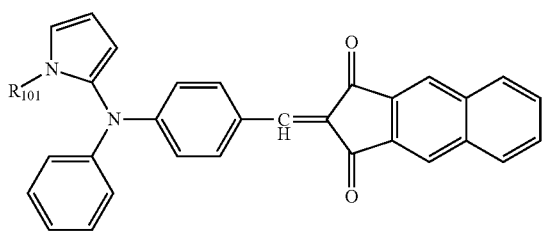
(46)
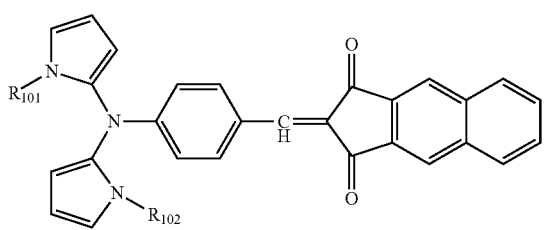
(47)
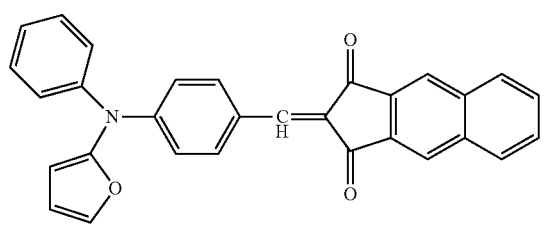
(48)
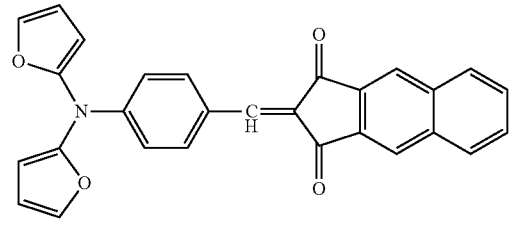
(49)
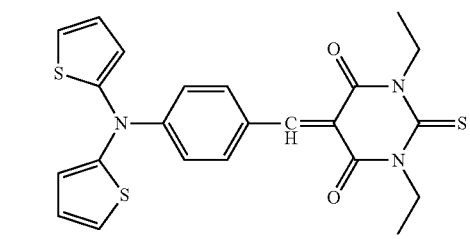
78
-continued
(50)
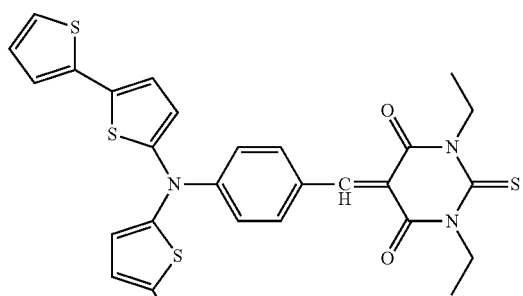
(51)
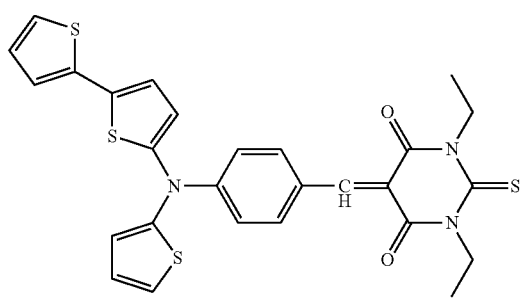
(52)
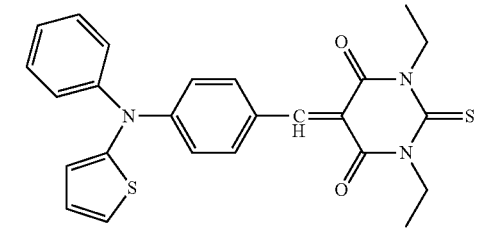
(53)
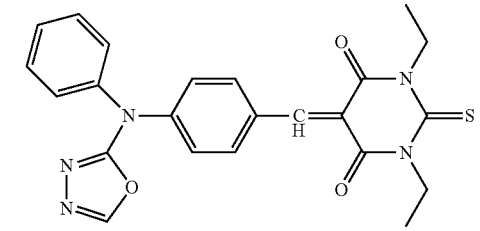
(54)
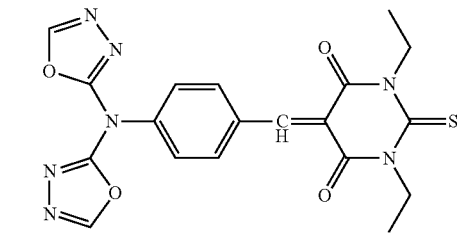

(55) 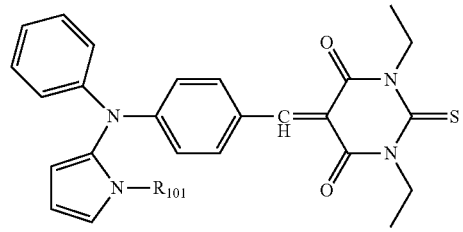
(56) 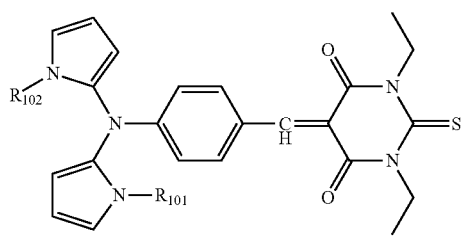
(57) 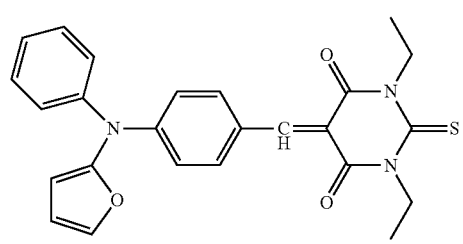
(58) 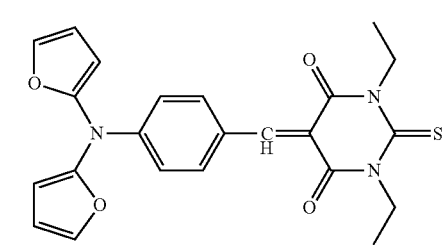
(59) 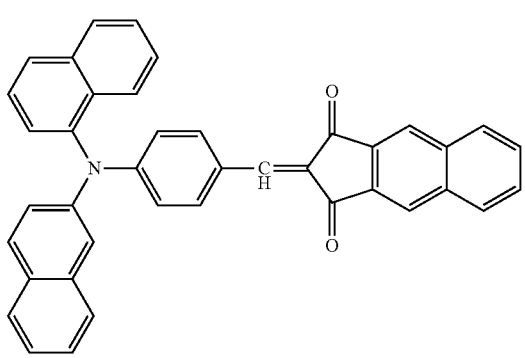
(60) 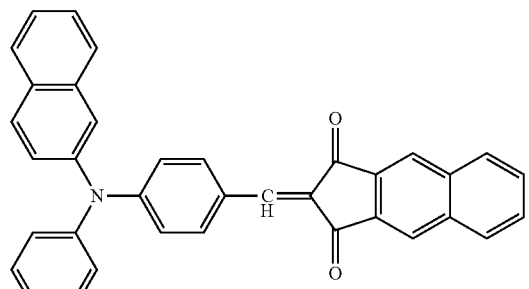
(61) 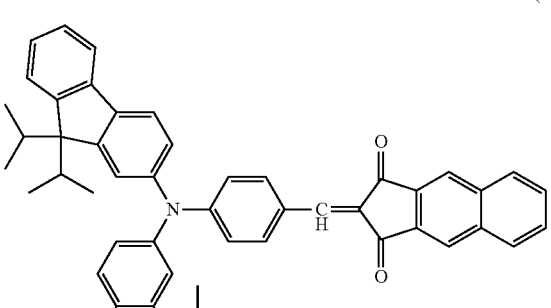
(62) 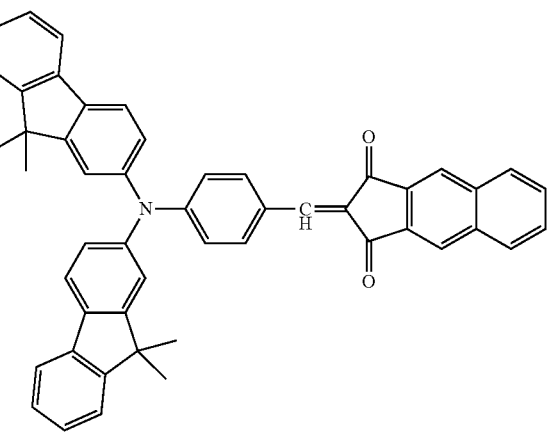
(63) 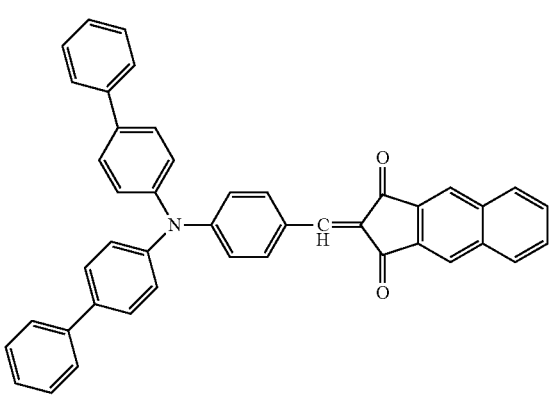

(64)
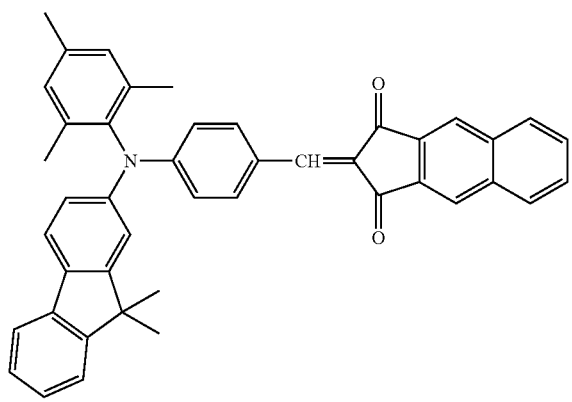

(65)
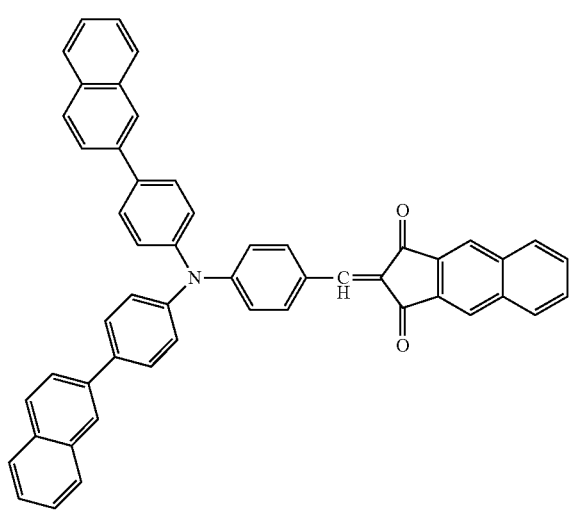

(66)

(67)
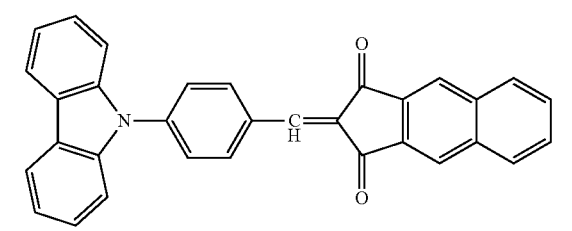

(68)
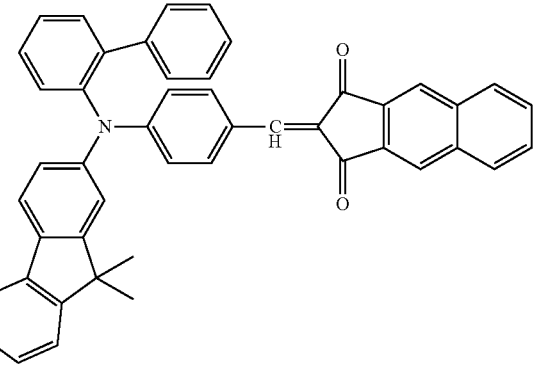

(69)
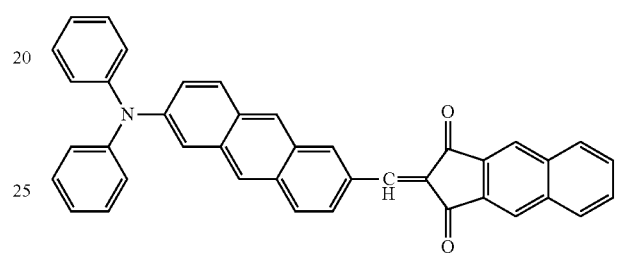

(70)
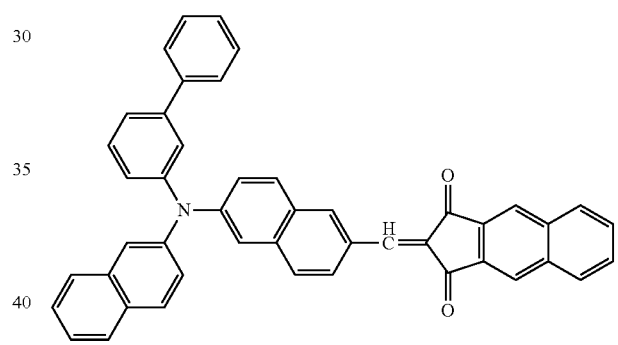

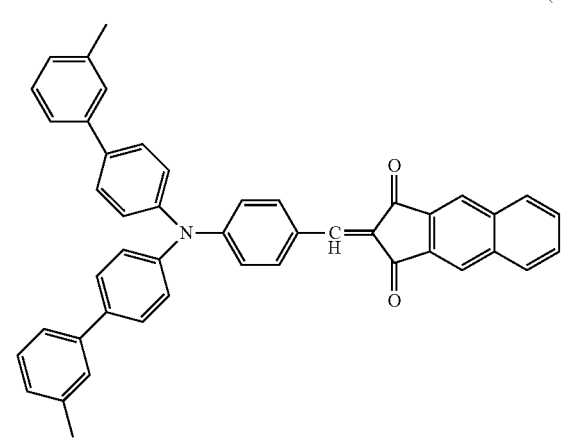

In the compounds illustrated above, each of $R_{101}$ and $R_{102}$ independently represents a hydrogen atom or a substituent. Examples of the substituent include the substituent W, and the substituent is preferably an alkyl group or an aryl group.

The n-type organic semiconductor (compound) is an acceptor-type organic semiconductor (compound) and indicates an organic compound having a property of readily accepting an electron, mainly typified by an electron-transporting organic compound. More specifically, this is an organic compound having a larger electron affinity when two organic compounds are used in contact.

Accordingly, for the acceptor-type organic compound, any organic compound can be used as long as it is an organic compound having an electron accepting property. Examples thereof include a fused aromatic carbocyclic compound (naphthalene, anthracene, fullerene, phenanthrene, tetracene, pyrene, perylene, fluoranthene, and derivatives thereof), a 5- to 7-membered heterocyclic compound containing a nitrogen atom, an oxygen atom or a sulfur atom (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, tribenzazepine), a polyarylene compound, a fluorene compound, a cyclopentadiene compound, a silyl compound, and a metal complex having a nitrogen-containing heterocyclic compound as a ligand. The acceptor-type organic semiconductor is not limited to these compounds and, as described above, any organic compound having an electron affinity larger than that of the organic compound used as the donor-type organic compound may be used as the acceptor-type organic semiconductor.

A fullerene or a fullerene derivative is preferably used as the n-type organic semiconductor.

The fullerene indicates fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, a mixed fullerene or a fullerene nanotube, and the fullerene derivative indicates a compound obtained by adding a substituent to such a fullerene. The substituent is preferably an alkyl group, an aryl group or a heterocyclic group.

The following compounds are preferred as the fullerene derivative.

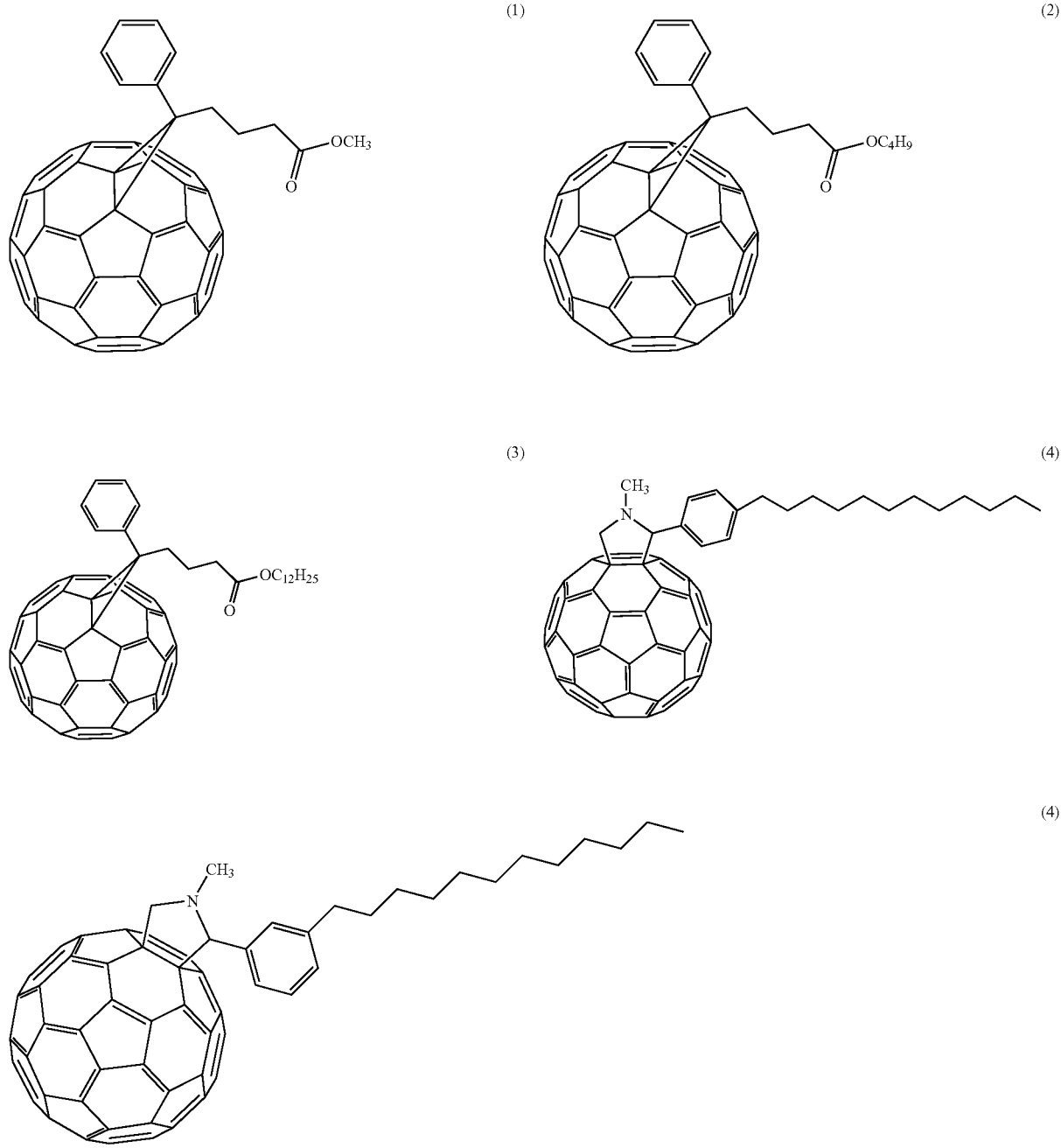

-continued

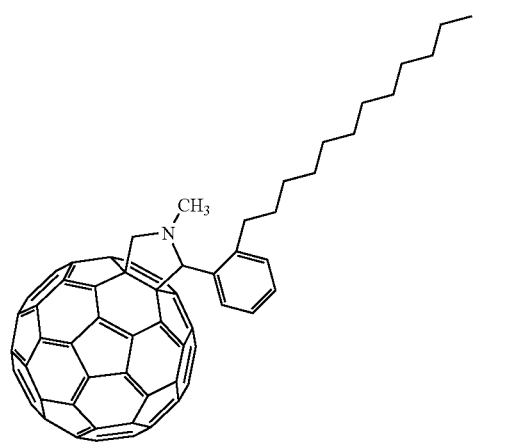
(6)

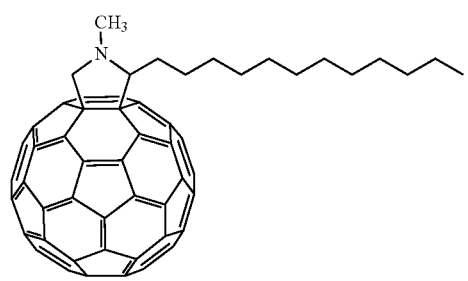
(7)

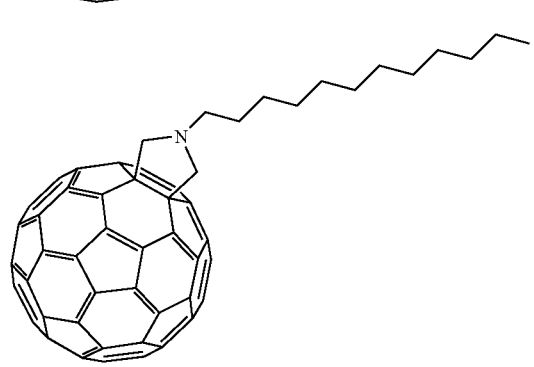
(8)

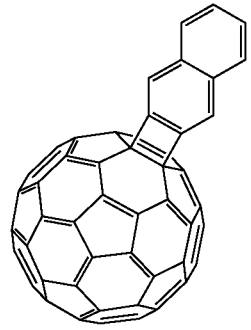
(9)

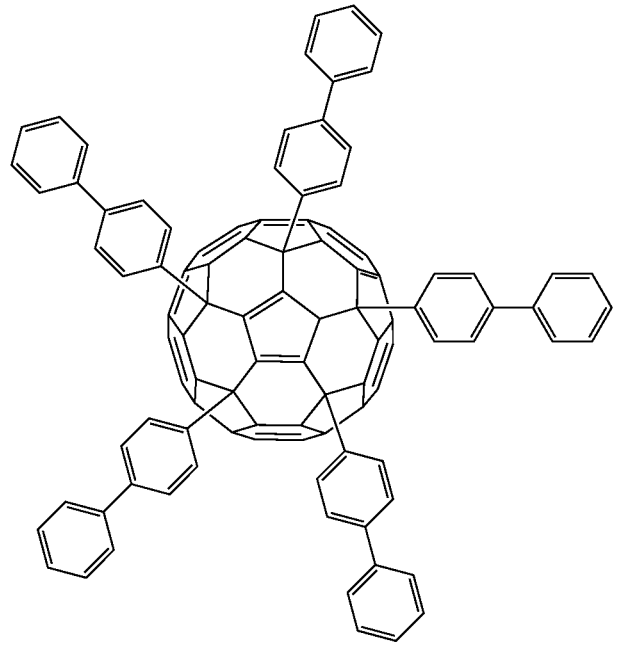
(10)

As for the fullerene and fullerene derivative, the compounds described, for example, in *Kikan Kagaku Sosetsu* (*Scientific Review Quarterly*), No. 43, edited by The Chemical Society of Japan (1999), JP-A-10-167994, JP-A-11-255508, JP-A-11-255509, JPA-2002-241323 and JP-A-2003-196881 may be also used.

The content of the fullerene or fullerene derivative in a mixed layer with a p-type material is preferably 50% or more (molar ratio), more preferably 200% or more (molar ratio), still more preferably 300% or more (molar ratio), based on the amount of other materials forming the mixed film.

The photoelectric conversion layer can be formed by vapor deposition. The vapor deposition may be either physical vapor deposition (PVD) or chemical vapor deposition (CVD), but physical vapor deposition such as vacuum deposition is preferred. In the case of depositing the film by vacuum deposition, the production conditions such as vacuum degree and deposition temperature can be set according to conventional methods.

The thickness of the photoelectric conversion layer is preferably from 10 to 1,000 nm, more preferably from 50 to 800 nm, still more preferably from 100 to 500 nm. With a thickness of 10 nm or more, a suitable dark current-reducing effect is obtained, and with a thickness of 1,000 nm or less, a suitable photoelectric conversion efficiency is obtained.

The present invention also relates to a production method of a photoelectric conversion element, comprising a step of depositing each of a photoelectric conversion layer and an electron blocking layer by vacuum heating deposition (vacuum deposition).

[Photosensor]

The photoelectric conversion element is roughly classified into a photocell and a photosensor, and the photoelectric conversion element of the present invention is suited for a photosensor. The photosensor may be a photosensor using the above-described photoelectric conversion element alone or may be in the mode of a line sensor where the photoelectric conversion elements are linearly arranged, or a two-dimensional sensor where the photoelectric conversion elements are arranged on a plane. The photoelectric conversion element of the present invention functions as an imaging device of, in the line sensor, converting the optical image information into electric signals by using an optical system and a drive part like a scanner or the like and, in the two-dimensional sensor, forming an image of optical image information on a sensor by means of an optical system and converting it into electric signals like an imaging module.

The photocell is a power generating unit and therefore, the efficiency of converting light energy into electric energy is an important performance, but the dark current that is a current in a dark place does not become a problem in function. Furthermore, a heating step in the later stage, such as placement of a color filter, is not required. In the photosensor, high-precision conversion of light/dark signals into electric signals is an important performance and in turn; the efficiency of converting light quantity into a current is also an important performance, but a signal when output in a dark place works out to a noise and therefore, a low dark current is required. In addition, resistance to a process in the later stage is also important.

[Imaging Device]

Configuration examples of the imaging device comprising the photoelectric conversion element are described below. In the following configuration examples, the members and the like having the same configuration/action as the members described above are indicated by the same or like symbols or numerical references in the figure, and their description is simplified or omitted.

The imaging device is a device of converting optical information of an image into electric signals, where a plurality of photoelectric conversion elements are arranged in the same plane on a matrix and where light signals can be converted into electric signals in each photoelectric conversion element (pixel) and each pixel can sequentially output the electric signals to the outside of the imaging device. Therefore, the imaging device is composed of one photoelectric conversion element and one or more transistors per one pixel.

(First Configuration Example of Imaging Device)

Figure 2:
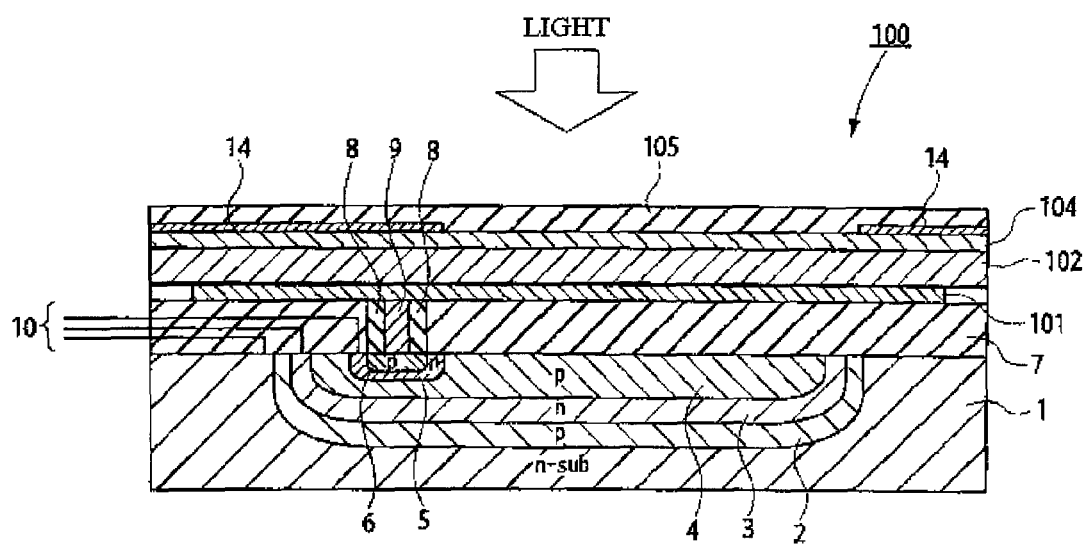
FIG. 2 A schematic cross-sectional view of one pixel portion of an imaging device.

FIG. 2 is a schematic cross-sectional view of one pixel portion of an imaging device.

In the imaging device 100, a large number of pixels each constituting one pixel are disposed in an array manner in the same plane, and one-pixel data of the image data can be produced by the signals obtained from the one pixel.

One pixel of the imaging device shown in FIG. 2 is composed of an n-type silicon substrate 1, a transparent insulating film 7 formed on the n-type silicon substrate 1, and a photoelectric conversion element consisting of a lower electrode 101 formed on the insulating film 7, a photoelectric conversion layer 102 formed on the lower electrode 101 and a transparent electrode material-containing upper electrode 104 formed on the photoelectric conversion layer 102. A light-shielding film 14 having provided therein an opening is formed on the photoelectric conversion element, and a transparent insulating film 105 is formed on the upper electrode 104. Incidentally, a mode where a light-shielding part 104 is formed in the insulating film 7 is also preferred.

Inside the n-type silicon substrate 1, a p-type impurity region (hereinafter simply referred to as "p region") 4, an n-type impurity region (hereinafter simply referred to as "n region") 3, and a p region 2 are formed in order of increasing the depth. In the p region 4, a high-concentration p region 6 is formed in the surface part of the portion light-shielded by the light-shielding film 14, and the p region 6 is surrounded by an n region 5.

The depth of the pn junction plane between the p region 4 and the n region 3 from the surface of the n-type silicon substrate 1 is set to a depth at which blue light is absorbed (about 0.2 μm). Therefore, the p region 4 and the n region 3 form a photodiode (B photodiode) of absorbing blue light and accordingly accumulating electric charges.

The depth of the pn junction plane between the p region 2 and the n-type silicon substrate 1 from the surface of the n-type silicon substrate 1 is set to a depth at which red light is absorbed (about 2 μm). Therefore, the p region 2 and the n-type silicon substrate 1 form a photodiode (R photodiode) of absorbing red light and accordingly accumulating electric charges.

The p region 6 is electrically connected to the lower electrode 101 via a connection part 9 formed in the opening bored through the insulating film 7. A hole trapped by the lower electrode 101 recombines with an electron in the p region 6 and therefore, the number of electrons accumulated in the p region 6 on resetting decreases according to the number of holes trapped. The connection part 9 is electrically insulated by an insulating film 8 from the surroundings except for the lower electrode 101 and the p region 6.

The electrons accumulated in the p region 2 are converted into signals according to the electric charge amount by an MOS circuit (not shown) composed of a p-channel MOS transistor formed inside the n-type silicon substrate 1, the electrons accumulated in the p region 4 are converted into signals according to the electric charge amount by an MOS circuit (not shown) composed of a p-channel MOS transistor formed inside the n region 3, the electrons accumulated in the p region 6 are converted into signals according to the electric charge amount by an MOS circuit (not shown) composed of a p-channel MOS transistor formed inside the n region 5, and these signals are output to the outside of the imaging device 100. Each MOS circuit is connected to a signal read-out pad (not shown) by wiring 10. Incidentally, when an extractor electrode is provided in the p region 2 and p region 4 and a predetermined reset potential is applied, each region is depleted and the capacitance of each pn junction part becomes an infinitely small value, whereby the capacitance produced in the junction plane can be made extremely small.

Thanks to such a configuration, G light can be photoelectrically converted by the photoelectric conversion layer 102, and B light and R light can be photoelectrically converted by the B photodiode and the R photodiode, respectively, in the n-type silicon substrate 1. Also, since G light is first absorbed in the upper part, excellent color separation is achieved between B-G and between G-R. This is a greatly excellent point in comparison with an imaging device of a type where three PD are stacked inside a silicon substrate and all of BGR lights are separated inside the silicon substrate. Incidentally, a mode where with respect to the substrate 1 and respective regions 2 to 6, the p type and n type are reversed and an electron is trapped by the lower electrode 101, may be also employed. Also, a mode where the regions 2 and 3 are omitted and a color filter is formed above or below the insulating film 105, causing the color filter to perform color separation of BGR, and where the light corresponding to each pixel is photoelectrically converted by the photoelectric conversion layer 102 and BGR lights are detected in respective pixels, may be employed. In this case, it is preferred for the lower electrode 101 not to transmit BGR lights, and, for example, Al, Mo or TiN is preferably used.

(Second Configuration Example of Imaging Device)

Figure 3:
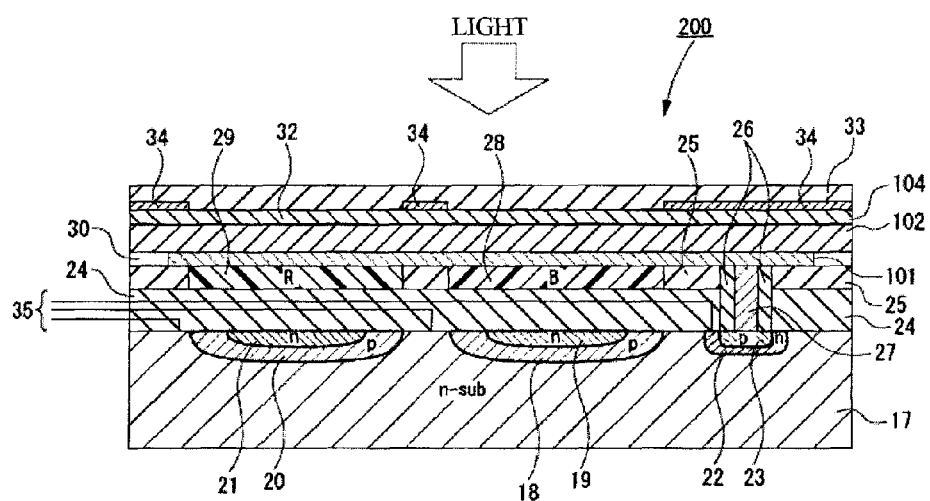
FIG. 3 A schematic cross-sectional view of one pixel portion of an imaging device in another configuration example.

In this implementation mode, instead of a configuration where two photodiodes are stacked inside a silicon substrate 1 as in the imaging device of FIG. 3, two photodiodes are arrayed in the direction perpendicular to the incident direction of incident light so as to detect lights of two colors in the inside of the p-type silicon substrate.

FIG. 3 is a schematic cross-sectional view of one pixel portion of an imaging device of this configuration example.

Incidentally, similarly to the imaging device example of FIG. 2, a mode where the p type and the n type of respective regions in FIG. 3 are reversed and an electron is trapped by the lower electrode 101, may be also employed.

One pixel of the imaging device 200 shown in FIG. 3 is composed of an n-type silicon substrate 17 and a photoelectric conversion element consisting of a lower electrode 101 formed above the n-type silicon substrate 17, a photoelectric conversion layer 102 formed on the lower electrode 101, and an upper electrode 104 formed on the photoelectric conversion layer 102. A light-shielding film 34 having provided therein an opening is formed on the photoelectric conversion element, and a transparent insulating film 33 is formed on the upper electrode 104. Here, a mode where the light-shielding part 34 is formed in the insulating film 24 is also preferred.

On the surface of the n-type silicon substrate 17 below the opening of the light-shielding film 34, a photodiode consisting of an n region 19 and a p region 18 and a photodiode consisting of an n region 21 and a p region 20 are formed to lie in juxtaposition on the surface of the n-type silicon substrate 17. An arbitrary plane direction on the n-type silicon substrate 17 surface becomes the direction perpendicular to the incident direction of incident light.

Above the photodiode consisting of an n region 19 and a p region 18, a color filter 28 capable of transmitting B light is formed via a transparent insulating film 24, and the lower electrode 101 is formed thereon. Above the photodiode consisting of an n region 21 and a p region 20, a color filter 29 capable of transmitting R light is formed via the transparent insulating film 24, and the lower electrode 101 is formed thereon. The peripheries of color filters 28 and 29 are covered with a transparent insulating film 25.

The photodiode consisting of an n region 19 and a p region 18 functions as an in-substrate photoelectric conversion part that absorbs B light transmitted through the color filter 28, accordingly generates electrons and accumulates the generated electrons in the p region 18. The photodiode consisting of an n region 21 and a p region 20 functions as an in-substrate photoelectric conversion part that absorbs R light transmitted through the color filter 29, accordingly generates electrons and accumulates the generated holes in the p region 20.

In the portion light-shielded by the light-shielding film 34 on the n-type silicon substrate 17 surface, a p region 23 is formed, and the periphery of the p region 23 is surrounded by an n region 22.

The p region 23 is electrically connected to the lower electrode 101 via a connection part 27 formed in the opening bored through the insulating films 24 and 25. A hole trapped by the lower electrode 101 recombines with an electron in the p region 23 and therefore, the number of electrons accumulated in the p region 23 on resetting decreases according to the number of holes trapped. The connection part 27 is electrically insulated by an insulating film 26 from the surroundings except for the lower electrode 101 and the p region 23.

The electrons accumulated in the p region 18 are converted into signals according to the electric charge amount by an MOS circuit (not shown) composed of a p-channel MOS transistor formed inside the n-type silicon substrate 17, the electrons accumulated in the p region 20 are converted into signals according to the electric charge amount by an MOS circuit (not shown) composed of a p-channel MOS transistor formed inside the n-type silicon substrate 17, the electrons accumulated in the p region 23 are converted into signals according to the electric charge amount by an MOS circuit (not shown) composed of an n-channel MOS transistor formed inside the n region 22, and these signals are output to the outside of the imaging device 200. Each MOS circuit is connected to a signal read-out pad (not shown) by wiring 35.

In this connection, instead of MOS circuits, the signal read-out part may be composed of CCD and an amplifier, that is, may be a signal read-out part where electrons accumulated in the p region 18, p region 20 and p region 23 are read out into CCD formed inside the n-type silicon substrate 17 and then transferred to an amplifier by the CCD and signals according to the electrons transferred are output from the amplifier.

In this way, the signal read-out part includes a CCD structure and a CMOS structure, but in view of power consumption, high-speed reading, pixel addition, partial reading and the like, CMOS is preferred.

Incidentally, in the imaging device of FIG. 3, color separation of R light and B light is performed by color filters 28 and 29, but instead of providing color filters 28 and 29, the depth of the pn junction plane between the p region 20 and the n region 21 and the depth of the pn junction plane between the p region 18 and the n region 19 may be adjusted to absorb R light and B light by respective photodiodes.

Also, an inorganic photoelectric conversion part composed of an inorganic material that absorbs light transmitted through the photoelectric conversion layer 102, generates electric charges according to the light and accumulates the electric charges, may be formed between the n-type silicon substrate 17 and the lower electrode 101 (for example, between the insulating film 24 and the n-type silicon substrate 17). In this case, an MOS circuit for reading out signals according to the electric charges accumulated in a charge accumulation region of the inorganic photoelectric conversion part may be provided inside the n-type silicon substrate 17, and wiring 35 may be connected also to this MOS circuit.

It is also possible to employ a configuration where one photodiode is provided inside the n-type silicone substrate 17 and a plurality of photoelectric conversion parts are stacked above the n-type silicon substrate 17; a configuration where a plurality of photodiodes are provided inside the n-type silicon substrate 17 and a plurality of photoelectric conversion parts are stacked above the n-type silicon substrate 17; or when a color image need not be formed, a configuration where one photodiode is provided inside the n-type silicon substrate 17 and only one photoelectric conversion part is stacked.

(Third Configuration Example of Imaging Device)

The imaging device of this implementation mode has a configuration where a photodiode is not provided inside the silicon substrate but a plurality of (here, three) photoelectric conversion elements are stacked above the silicon substrate.

Figure 4:
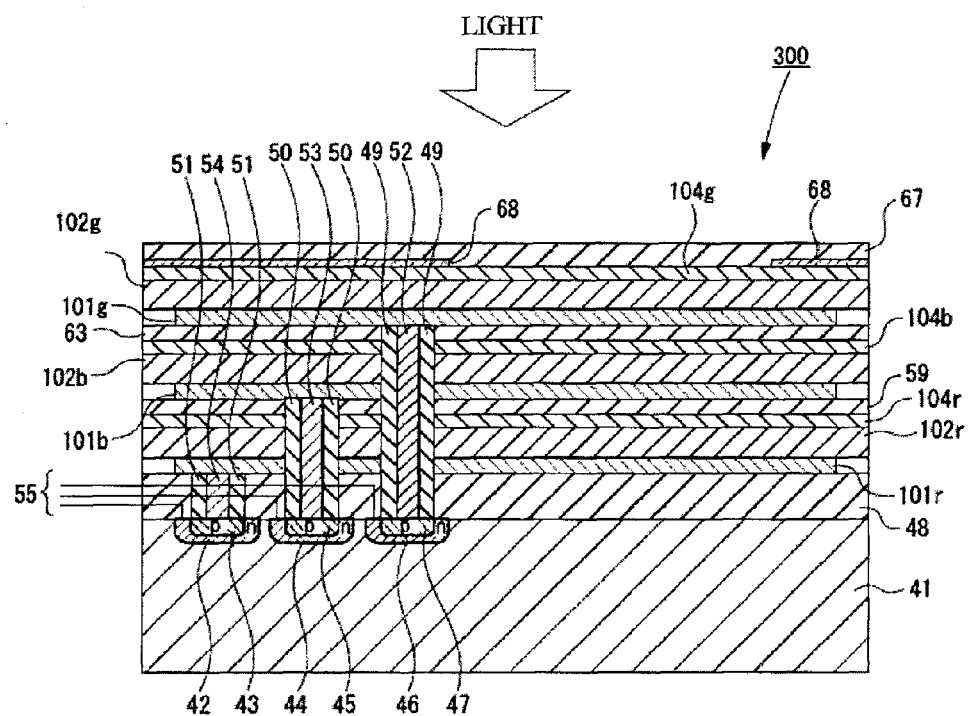
FIG. 4 A schematic cross-sectional view of one pixel portion of an imaging device in another configuration example.

FIG. 4 is a schematic cross-sectional view of one pixel portion of the imaging device of this configuration example. Incidentally, similarly to the imaging device example of FIGS. 2 and 3, a mode where the p type and the n type of respective regions 42 to 47 in FIG. 4 are reversed and an electron is trapped by the lower electrodes 101r, 101g and 101b, may be also employed.

The imaging device 300 shown in FIG. 4 has a configuration where an R photoelectric conversion element, a B photoelectric conversion element, and a G photoelectric conversion element are stacked in order above a silicon substrate 41.

The R photoelectric conversion element is composed of, above the silicon substrate 41, a lower electrode 101r, a photoelectric conversion layer 102r formed on the lower electrode 101r, and an upper electrode 104r formed on the photoelectric conversion layer 102r.

The B photoelectric conversion element is composed of a lower electrode 101b stacked on the upper electrode 104r of the R photoelectric conversion element, a photoelectric conversion layer 102b formed on the lower electrode 101b, and an upper electrode 104b formed on the photoelectric conversion layer 102b.

The G photoelectric conversion element is composed of a lower electrode 101g stacked on the upper electrode 104b of the B photoelectric conversion element, a photoelectric conversion layer 102g formed on the lower electrode 101g, and an upper electrode 104g formed on the photoelectric conversion layer 102g. The imaging device of this configuration example has a configuration where the R photoelectric conversion element, the B photoelectric conversion element and the G photoelectric conversion element are stacked in this order.

A transparent insulating film 59 is formed between the upper electrode 104r of the R photoelectric conversion element and the lower electrode 101b of the B photoelectric conversion element, and a transparent insulating film 63 is formed between the upper electrode 104b of the B photoelectric conversion element and the lower electrode 101g of the G photoelectric conversion element. A light-shielding film 68 is formed in the region excluding an opening on the upper electrode 104g of the G photoelectric conversion element, and a transparent insulating film 67 is formed to cover the upper electrode 104g and the light-shielding film 68.

The lower electrode, the photoelectric conversion layer and the upper electrode contained in each of the R, G and B photoelectric conversion elements can have the same configuration as that in the photoelectric conversion element described above. However, the photoelectric conversion layer 102g contains an organic material capable of absorbing green light and accordingly generating electrons and holes, the photoelectric conversion layer 102b contains an organic material capable of absorbing blue light and accordingly generating electrons and holes, and the photoelectric conversion layer 102r contains an organic material capable of absorbing red light and accordingly generating electrons and holes.

In the portion light-shielded by the light-shielding film 68 on the silicon substrate 41 surface, p regions 43, 45 and 47 are formed, and the peripheries of these regions are surrounded by n regions 42, 44 and 46, respectively.

The p region 43 is electrically connected to the lower electrode 101r via a connection part 54 formed in an opening bored through an insulating film 48. A hole trapped by the lower electrode 101r recombines with an electron in the p region 43 and therefore, the number of electrons accumulated in the p region 43 on resetting decreases according to the number of holes trapped. The connection part 54 is electrically insulated by an insulating film 51 from the surroundings except for the lower electrode 101r and the p region 43.

The p region 45 is electrically connected to the lower electrode 101b via a connection part 53 formed in an opening penetrating through the insulating film 48, the R photoelectric conversion element and the insulating film 59. A hole trapped by the lower electrode 101b recombines with an electron in the p region 45 and therefore, the number of electrons accumulated in the p region 45 on resetting decreases according to the number of holes trapped. The connection part 53 is electrically insulated by an insulating film 50 from the surroundings except for the lower electrode 101b and the p region 45.

The p region 47 is electrically connected to the lower electrode 101g via a connection part 52 formed in an opening penetrating through the insulating film 48, the R photoelectric conversion element, the insulating film 59, the B photoelectric conversion element and the insulating film 63. A hole trapped by the lower electrode 101g recombines with an electron in the p region 47 and therefore, the number of electrons accumulated in the p region 47 on resetting decreases according to the number of holes trapped. The connection part 52 is electrically insulated by an insulating film 49 from the surroundings except for the lower electrode 101g and the p region 47.

The electrons accumulated in the p region 43 are converted into signals according to the electric charge amount by an MOS circuit (not shown) composed of a p-channel MOS transistor formed inside the n region 42, the electrons accumulated in the p region 45 are converted into signals according to the electric charge amount by an MOS circuit (not shown) composed of a p-channel MOS transistor formed inside the n region 44, the electrons accumulated in the p region 47 are converted into signals according to the electric charge amount by an MOS circuit (not shown) composed of a p-channel MOS transistor formed inside the n region 46, and these signals are output to the outside of the imaging device 300. Each MOS circuit is connected to a signal read-out pad (not shown) by wiring 55. Incidentally, instead of MOS circuits, the signal read-out part may be composed of CCD and an amplifier, that is, may be a signal read-out part where electrons accumulated in the p regions 43, 45 and 47 are read out into CCD formed inside the silicon substrate 41 and then transferred to an amplifier by the CCD and signals according to the holes are output from the amplifier.

In the description above, the photoelectric conversion layer capable of absorbing B light means a layer which can absorb at least light at a wavelength of 400 to 500 nm and in which the absorption factor at a peak wavelength in the wavelength region above is preferably 50% or more. The photoelectric conversion layer capable of absorbing G light means a layer which can absorb at least light at a wavelength of 500 to 600 nm and in which the absorption factor at a peak wavelength in the wavelength region above is preferably 50% or more. The photoelectric conversion layer capable of absorbing R light means a layer which can absorb at least light at a wavelength of 600 to 700 nm and in which the absorption factor at a peak wavelength in the wavelength region above is preferably 50% or more.

[Driving Method]

The present invention also relates to a method for driving the photoelectric conversion element, photosensor or imaging device of the present invention, comprising applying a voltage by using an electrode in contact with said electron blocking layer as a cathode and another electrode as an anode.
[Substituent W]

The substituent W is described below.

The substituent W includes a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (may be also called a heteroring group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyl group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group ($—B(OH)_2$), a phosphato group ($—OPO(OH)_2$), a sulfato group ($—OSO_3H$) and other known substituents.

More preferably, W represents, for example, the following (1) to (48):

(1) a halogen atom,
such as fluorine atom, chlorine atom, bromine atom and iodine atom;
(2) an alkyl group,
a linear, branched or cyclic, substituted or unsubstituted alkyl group, including (2-a) to (2-e):
(2-a) an alkyl group,
preferably an alkyl group having a carbon number of 1 to 30 (e.g., methyl, ethyl, n-propyl, isopropyl, tert-butyl, n-octyl, eicosyl, 2-chloroethyl, 2-cyanoethyl, 2-ethylhexyl),
(2-b) a cycloalkyl group,
preferably a substituted or unsubstituted cycloalkyl group having a carbon number of 3 to 30 (e.g., cyclohexyl, cyclopentyl, 4-n-dodecylcyclohexyl),
(2-c) a bicycloalkyl group,
preferably a substituted or unsubstituted bicycloalkyl group having a carbon number of 5 to 30 (e.g., bicyclo[1,2,2]heptan-2-yl, bicyclo[2,2,2]octan-3-yl),
(2-d) a tricycloalkyl group,
preferably a substituted or unsubstituted tricycloalkyl group having a carbon number of 7 to 30 (e.g., 1-adamantyl),
(2-e) a polycyclic cycloalkyl group having a larger number of ring structures,
here, the alkyl group in the substituents described below (for example, the alkyl group in an alkylthio group) indicates an alkyl group having such a concept but further includes an alkenyl group and an alkynyl group;
(3) an alkenyl group,
a linear, branched or cyclic, substituted or unsubstituted alkenyl group, including (3-a) to (3-c),
(3-a) an alkenyl group,
preferably a substituted or unsubstituted alkenyl group having a carbon number of 2 to 30 (e.g., vinyl, allyl, prenyl, geranyl, oleyl),
(3-b) a cycloalkenyl group,
preferably a substituted or unsubstituted cycloalkenyl group having a carbon number of 3 to 30 (e.g., 2-cyclopenten-1-yl, 2-cyclohexen-1-yl),
(3-c) a bicycloalkenyl group,
a substituted or unsubstituted bicycloalkenyl group, preferably a substituted or unsubstituted bicycloalkenyl group having a carbon number of 5 to 30 (e.g., bicyclo[2,2,1]hept-2-en-1-yl, bicyclo[2,2,2]oct-2-en-4-yl);
(4) an alkynyl group,
preferably a substituted or unsubstituted alkynyl group having a carbon number of 2 to 30 (e.g., ethynyl, propargyl, trimethylsilylethynyl);
(5) an aryl group,
preferably a substituted or unsubstituted aryl group having a carbon number of 6 to 30 (e.g., phenyl, p-tolyl, naphthyl, m-chlorophenyl, o-hexadecanoylaminophenyl, ferrocenyl);
(6) a heterocyclic group,
preferably a monovalent group obtained by removing one hydrogen atom from a 5- or 6-membered substituted or unsubstituted, aromatic or non-aromatic heterocyclic compound, more preferably a 5- or 6-membered aromatic heterocyclic group having a carbon number of 2 to 50 (e.g., 2-furyl, 2-thienyl, 2-pyrimidinyl, 2-benzothiazolyl, 2-carbazolyl, 3-carbazolyl, 9-carbazolyl; the heterocyclic group may be also a cationic heterocyclic group such as 1-methyl-2-pyridinio and 1-methyl-2-quinolinio);
(7) a cyano group;
(8) a hydroxy group;
(9) a nitro group;
(10) a carboxy group;
(11) an alkoxy group,
preferably a substituted or unsubstituted alkoxy group having a carbon number of 1 to 30 (e.g., methoxy, ethoxy, isopropoxy, tert-butoxy, n-octyloxy, 2-methoxyethoxy);
(12) an aryloxy group,
preferably a substituted or unsubstituted aryloxy group having a carbon number of 6 to 30 (e.g., phenoxy, 2-methylphenoxy, 4-tert-butylphenoxy, 3-nitrophenoxy, 2-tetradecanoylaminophenoxy);
(13) a silyloxy group,
preferably a silyloxy group having a carbon number of 3 to 20 (e.g., trimethylsilyloxy, tert-butyldimethylsilyloxy);
(14) a heterocyclic oxy group,
preferably a substituted or unsubstituted heterocyclic oxy group having a carbon number of 2 to 30 (e.g., 1-phenyltetrazol-5-oxy, 2-tetrahydropyranyloxy);
(15) an acyloxy group,
preferably a formyloxy group, a substituted or unsubstituted alkylcarbonyloxy group having a carbon number of 2 to 30, and a substituted or unsubstituted arylcarbonyloxy group having a carbon number of 6 to 30 (e.g., formyloxy, acetyloxy, pivaloyloxy, stearoyloxy, benzoyloxy, p-methoxyphenylcarbonyloxy);
(16) a carbamoyloxy group,
preferably a substituted or unsubstituted carbamoyloxy group having a carbon number of 1 to 30 (e.g., N,N-dimethylcarbamoyloxy, N,N-diethylcarbamoyloxy, morpholinocarbonyloxy, N,N-di-n-octylaminocarbonyloxy, N-n-octylcarbamoyloxy);
(17) an alkoxycarbonyloxy group,
preferably a substituted or unsubstituted alkoxycarbonyloxy group having a carbon number of 2 to 30 (e.g., methoxycarbonyloxy, ethoxycarbonyloxy, tert-butoxycarbonyloxy, n-octylcarbonyloxy);

(18) an aryloxycarbonyloxy group,
preferably a substituted or unsubstituted aryloxycarbonyloxy group having a carbon number of 7 to 30 (e.g., phenoxycarbonyloxy, p-methoxyphenoxycarbonyloxy, p-n-hexadecyloxyphenoxycarbonyloxy);

(19) an amino group,
preferably an amino group, a substituted or unsubstituted alkylamino group having a carbon number of 1 to 30, and a substituted or unsubstituted anilino group having a carbon number of 6 to 30 (e.g., amino, methylamino, dimethylamino, anilino, N-methyl-anilino, diphenylamino);

(20) an ammonio group,
preferably an ammonio group and an ammonio group substituted with a substituted or unsubstituted alkyl, aryl or heterocyclic group having a carbon number of 1 to 30 (e.g., trimethylammonio, triethylammonio, diphenylmethylammonio);

(21) an acylamino group,
preferably a formylamino group, a substituted or unsubstituted alkylcarbonylamino group having a carbon number of 1 to 30, and a substituted or unsubstituted arylcarbonylamino group having a carbon number of 6 to 30 (e.g., formylamino, acetylamino, pivaloylamino, lauroylamino, benzoylamino, 3,4,5-tri-n-octyloxyphenylcarbonylamino);

(22) an aminocarbonylamino group,
preferably a substituted or unsubstituted aminocarbonylamino group having a carbon number of 1 to 30 (e.g., carbamoylamino, N,N-dimethylaminocarbonylamino, N,N-diethylaminocarbonylamino, morpholinocarbonylamino);

(23) an alkoxycarbonylamino group,
preferably a substituted or unsubstituted alkoxycarbonylamino group having a carbon number of 2 to 30 (e.g., methoxycarbonylamino, ethoxycarbonylamino, tert-butoxycarbonylamino, n-octadecyloxycarbonylamino, N-methyl-methoxycarbonylamino);

(24) an aryloxycarbonylamino group,
preferably a substituted or unsubstituted aryloxycarbonylamino group having a carbon number of 7 to 30 (e.g., phenoxycarbonylamino, p-chlorophenoxycarbonylamino, m-n-octyloxyphenoxycarbonylamino);

(25) a sulfamoylamino group,
preferably a substituted or unsubstituted sulfamoylamino group having a carbon number of 0 to 30 (e.g., sulfamoylamino, N,N-dimethylaminosulfonylamino, N-n-octylaminosulfonylamino);

(26) an alkyl- or arylsulfonylamino group,
preferably a substituted or unsubstituted alkylsulfonylamino having a carbon number of 1 to 30 and a substituted or unsubstituted arylsulfonylamino having a carbon number of 6 to (e.g., methylsulfonylamino, butylsulfonylamino, phenylsulfonylamino, 2,3,5-trichlorophenylsulfonylamino, p-methylphenylsulfonylamino);

(27) a mercapto group;

(28) an alkylthio group,
preferably a substituted or unsubstituted alkylthio group having a carbon number of 1 to 30 (e.g., methylthio, ethylthio, n-hexadecylthio);

(29) an arylthio group,
preferably a substituted or unsubstituted arylthio group having a carbon number of 6 to 30 (e.g., phenylthio, p-chlorophenylthio, m-methoxyphenylthio);

(30) a heterocyclic thio group,
preferably a substituted or unsubstituted heterocyclic thio group having a carbon number of 2 to 30 (e.g., 2-benzothiazoylthio, 1-phenyltetrazol-5-ylthio);

(31) a sulfamoyl group,
preferably a substituted or unsubstituted sulfamoyl group having a carbon number of 0 to 30 (e.g., N-ethylsulfamoyl, N-(3-dodecyloxypropyl)sulfamoyl, N,N-dimethylsulfamoyl, N-acetylsulfamoyl, N-benzoylsulfamoyl, N—(N'-phenylcarbamoyl)sulfamoyl);

(32) a sulfo group;

(33) an alkyl- or arylsulfinyl group,
preferably a substituted or unsubstituted alkylsulfinyl group having a carbon number of 1 to 30 and a substituted or unsubstituted arylsulfinyl group having a carbon number of 6 to 30 (e.g., methylsulfinyl, ethylsulfinyl, phenylsulfinyl, p-methylphenylsulfinyl);

(34) an alkyl- or arylsulfonyl group,
preferably a substituted or unsubstituted alkylsulfonyl group having a carbon number of 1 to 30 and a substituted or unsubstituted arylsulfonyl group having a carbon number of 6 to 30, e.g., methylsulfonyl, ethylsulfonyl, phenylsulfonyl, p-methylphenylsulfonyl);

(35) an acyl group,
preferably a formyl group, a substituted or unsubstituted alkylcarbonyl group having a carbon number of 2 to 30, a substituted or unsubstituted arylcarbonyl group having a carbon number of 7 to 30, and a substituted or unsubstituted heterocyclic carbonyl group having a carbon number of 4 to 30 and being bonded to the carbonyl group through a carbon atom (e.g., acetyl, pivaloyl, 2-chloroacetyl, stearoyl, benzoyl, p-n-octyloxyphenylcarbonyl, 2-pyridylcarbonyl, 2-furylcarbonyl);

(36) an aryloxycarbonyl group,
preferably a substituted or unsubstituted aryloxycarbonyl group having a carbon number of 7 to 30 (e.g., phenoxycarbonyl, o-chlorophenoxycarbonyl, m-nitrophenoxycarbonyl, p-tert-butylphenoxycarbonyl);

(37) an alkoxycarbonyl group,
preferably a substituted or unsubstituted alkoxycarbonyl group having a carbon number of 2 to 30 (e.g., methoxycarbonyl, ethoxycarbonyl, tert-butoxycarbonyl, n-octadecyloxycarbonyl);

(38) a carbamoyl group,
preferably a substituted or unsubstituted carbamoyl group having a carbon number of to 30 (e.g., carbamoyl, N-methylcarbamoyl, N,N-dimethylcarbamoyl, N,N-di-n-octylcarbamoyl, N-(methylsulfonyl)carbamoyl);

(39) an aryl or heterocyclic azo group,
preferably a substituted or unsubstituted arylazo group having a carbon number of 6 to 30 and a substituted or unsubstituted heterocyclic azo group having a carbon number of 3 to 30 (e.g., phenylazo, p-chlorophenylazo, 5-ethylthio-1,3,4-thiadiazol-2-ylazo);

(40) an imido group,
preferably N-succinimido and N-phthalimido;

(41) a phosphino group,
preferably a substituted or unsubstituted phosphino group having a carbon number of 2 to 30 (e.g., dimethylphosphino, diphenylphosphino, methylphenoxyphosphino);

(42) a phosphinyl group,
preferably a substituted or unsubstituted phosphinyl group having a carbon number of 2 to 30 (e.g., phosphinyl, dioctyloxyphosphinyl, diethoxyphosphinyl);

(43) a phosphinyloxy group,
preferably a substituted or unsubstituted phosphinyloxy group having a carbon number of 2 to 30 (e.g., diphenyloxyphosphinyloxy, dioctyloxyphosphinyloxy);

(44) a phosphinylamino group,
preferably a substituted or unsubstituted phosphinylamino group having a carbon number of 2 to 30 (e.g., dimethoxyphosphinylamino, dimethylaminophosphinylamino);
(45) a phospho group;
(46) a silyl group,
preferably a substituted or unsubstituted silyl group having a carbon number of 3 to (e.g., trimethylsilyl, triethylsilyl, triisopropylsilyl, tert-butyldimethylsilyl, phenyldimethylsilyl);
(47) a hydrazino group,
preferably a substituted or unsubstituted hydrazino group having a carbon number of 0 to 30 (e.g., trimethylhydrazino); and
(48) a ureido group,
preferably a substituted or unsubstituted ureido group having a carbon number of 0 to 30 (e.g., N,N-dimethylureido).

Among the substituent W, those having a hydrogen atom may be further substituted with the above-described group by removing the hydrogen atom. Examples of such a substituent include a —CONHSO$_2$— group (a sulfonylcarbamoyl group or a carbonylsulfamoyl group), a —CONHCO— group (a carbonylcarbamoyl group), and an —SO$_2$NHSO$_2$— group (a sulfonylsulfamoyl group). More specifically, the substituent includes an alkylcarbonylaminosulfonyl group (e.g., acetylaminosulfonyl), an arylcarbonylaminosulfonyl group (e.g., benzoylaminosulfonyl), an alkylsulfonylaminocarbonyl group (e.g., methylsulfonylaminocarbonyl), and an arylsulfonylaminocarbonyl group (e.g., p-methylphenylsulfonylaminocarbonyl).

[Ring R]

The ring R includes an aromatic or non-aromatic hydrocarbon ring, a heterocyclic ring, and a polycyclic condensed ring formed by further combining these rings. Examples thereof include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring, and a phenazine ring.

EXAMPLES

Synthesis of Compound a-2 (A-1)

Compound a-2 that is the compound represented by formula (F-1) can be produced according to the following reaction formula.

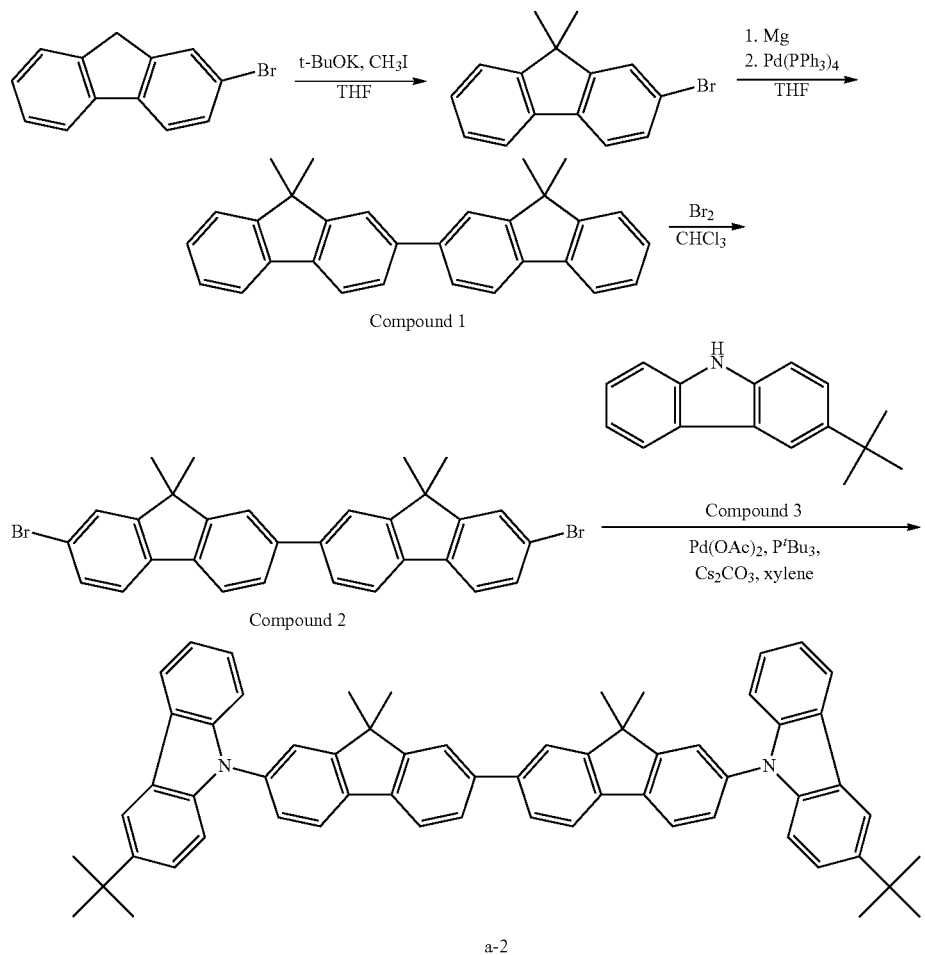

a-2

2-Bromofluorene (89.0 g, 0.363 mol) was dissolved in 1.3 liter of THF and after cooling to 5° C., potassium tert-butoxide (102 g, 0.908 mol) was added, methyl iodide (565 ml, 0.908 mol) was added dropwise at 5° C. and after the dropwise addition, the resulting solution was stirred at room temperature for 5 hours to obtain 2-bromo-9,9-dimethyl-fluorene in a yield 87%. In a nitrogen atmosphere, magnesium powder (3.51 g, 0.144 mol) was added to 50 ml of THF, and the mixture was refluxed at the boiling point. A 250 ml THF solution of 2-bromo-9,9-dimethyl-fluorene (75.0 g, 0.275 mol) was added dropwise, and the resulting solution was stirred for 1 hour. Thereafter, tetrakis(triphenylphosphine) palladium (1.59 g, 1.38 mmol) was added, and the mixture was refluxed at the boiling point for 2 hours to obtain Compound 1 in a yield of 82%. A 500 ml chloroform solution of Compound 1 (43.8 g, 0.113 mol) was added dropwise to bromine (39.8 g, 0.249 mol), and the resulting solution was stirred for 3 hours to synthesize Compound 2 in a yield of 78%. Compound 2 (1.10 g, 2.02 mmol), palladium acetate (22.7 mg, 0.101 mmol), tri(tert-butyl)phosphine (61.3 mg, 0.303 mmol), cesium carbonate (2.63 g, 8.08 mmol) and Compound 3 (991 mg, 4.44 mmol) were dissolved in 11 ml of xylene, and the reaction was allowed to proceed under reflux at the boiling point for 4 hours in a nitrogen atmosphere. Ethyl acetate and water were added to the reaction mixture to separate the organic phase, and the organic phase was washed with water and saturated saline and then concentrated under reduced pressure. The obtained reaction mixture was purified by recrystallization and sublimation purification to obtain Compound a-2 in a yield of 66%. Incidentally, Compound A-1 used in Examples corresponds to this Compound a-2. $^1$H-NMR (400 MHz, in CDCl$_3$): δ (ppm)=1.50 (s, 18H), 1.65 (s, 12H), 7.28-7.32 (m, 2H), 7.40-7.46 (m, 4H), 7.49 (d, J=8.2, 2H), 7.53 (dd, J=8.7, 1.9 Hz, 2H), 7.57 (dd, J=8.0, 1.8 Hz, 2H), 7.66 (d, J=1.8 Hz, 2H), 7.74 (dd, J=7.9, 1.6 Hz, 2H), 7.77 (s, 2H), 7.89 (d, J=7.8 Hz, 2H), 7.96 (d, J=8.0 Hz, 2H), 8.18-8.18 (m, 6H).

Synthesis of Compound a-3 (A-2)

Compound a-3 that is the compound represented by formula (F-1) can be produced according to the following reaction formula.

Compound 2 (1.10 g, 2.02 mmol), palladium acetate (22.7 mg, 0.101 mmol), tri(tert-butyl)phosphine (61.3 mg, 0.303 mmol), cesium carbonate (2.63 g, 8.08 mmol) and Compound 4 (1.24 g, 4.44 mmol) were dissolved in 11 ml of xylene, and the reaction was allowed to proceed under reflux at the boiling point for 4 hours in a nitrogen atmosphere. Ethyl acetate and water were added to the reaction mixture to separate the organic phase, and the organic phase was washed with water and saturated saline and then concentrated under reduced pressure. The obtained reaction mixture was purified by recrystallization and sublimation purification to obtain Compound a-3 in a yield of 61%. Incidentally, Compound A-2 used in Examples corresponds to this Compound a-3. $^1$H-NMR (400 MHz, in CDCl$_3$): δ (ppm)=1.49 (s, 36H), 7.44 (d, J=7.6 Hz, 4H), 7.51 (dd, J=8.4, 1.9 Hz, 4H), 7.56 (dd, J=8.0, 1.9 Hz, 2H), 7.65 (d, J=1.4 Hz, 2H), 7.73 (dd, J=7.8, 1.8 Hz, 2H), 7.77 (d, J=1.2 Hz, 2H), 7.88 (d, J=7.8 Hz, 2H), 7.95 (d, J=8.0 Hz, 2H), 8.17 (d, J=1.6 Hz, 4H).

Synthesis of Compound a-4 (A-3)

Compound a-4 that is the compound represented by formula (F-1) can be produced according to the following reaction formula.

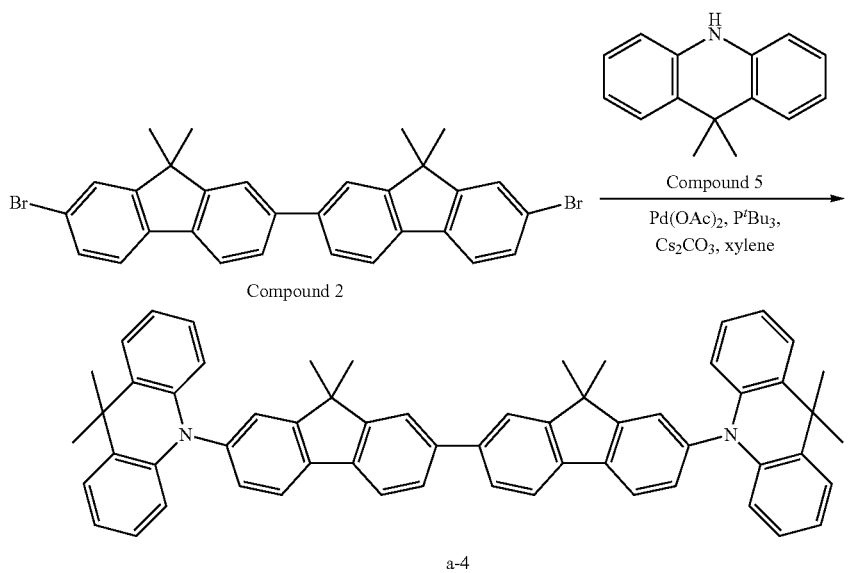

Compound 2 (1.10 g, 2.02 mmol), palladium acetate (22.7 mg, 0.101 mmol), tri(tert-butyl)phosphine (61.3 mg, 0.303 mmol), cesium carbonate (2.63 g, 8.08 mmol) and 2.1-equivalent Compound 5 (888 mg, 4.24 mmol) were dissolved in 10 ml of xylene, and the reaction was allowed to proceed under reflux at the boiling point for 4 hours in a nitrogen atmosphere. Ethyl acetate and water were added to the reaction mixture to separate the organic phase, and the organic phase was washed with water and saturated saline and then concentrated under reduced pressure. The obtained reaction mixture was purified by recrystallization, sublimation purification or the like to obtain Compound a-4 in a yield of 42%. Incidentally, Compound A-3 used in Examples corresponds to this Compound a-4. $^1$H-NMR (400 MHz, in CDCl$_3$): δ (ppm)=1.61 (s, 12H), 1.73 (s, 12H), 6.38 (dd, J=8.1, 1.2 Hz, 4H), 6.92-7.02 (m, 8H), 7.32 (dd, J=7.9, 1.8 Hz, 2H), 7.43 (d, J=1.6 Hz, 2H), 7.48 (dd, J=7.6, 1.6 Hz, 4H), 7.73 (dd, J=7.9, 1.6 Hz, 2H), 7.77 (s, 2H), 7.88 (d, J=7.8 Hz, 2H), 8.00 (d, J=7.9 Hz, 2H).

Synthesis of Compound a-5 (A-4)

Compound a-5 that is the compound represented by formula (F-1) can be produced according to the following reaction formula.

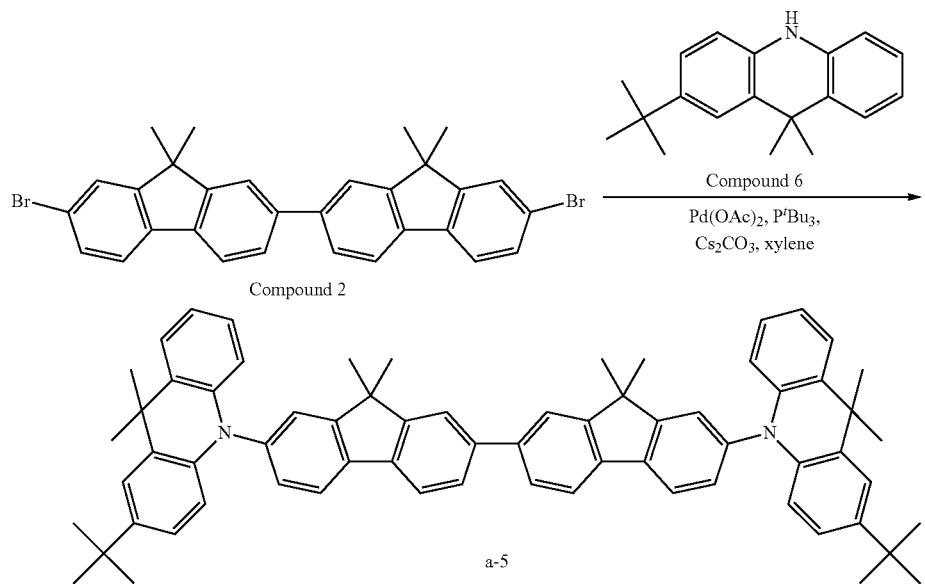

Compound 2 (1.10 g, 2.02 mmol), palladium acetate (22.7 mg, 0.101 mmol), tri(tert-butyl)phosphine (61.3 mg, 0.303 mmol), cesium carbonate (2.63 g, 8.08 mmol) and Compound 6 (1.13 g, 4.24 mmol) were dissolved in 10 ml of xylene, and the reaction was allowed to proceed under reflux at the boiling point for 4 hours in a nitrogen atmosphere. Ethyl acetate and water were added to the reaction mixture to separate the organic phase, and the organic phase was washed with water and saturated saline and then concentrated under reduced pressure. The obtained reaction mixture was purified by recrystallization, sublimation purification or the like to obtain Compound a-5 in a yield of 44%. Incidentally, Compound A-4 used in Examples corresponds to this Compound a-5.
$^1$H-NMR (400 MHz, in CDCl$_3$): δ (ppm)=1.32 (s, 18H), 1.61 (s, 12H), 1.73 (s, 12H), 6.31-6.37 (m, 4H), 6.91-6.99 (m, 4H), 7.02 (dd, J=8.6, 2.1 Hz, 2H), 7.32 (dd, J=7.9, 1.6 Hz, 2H), 7.42 (d, J=1.5 Hz, 2H), 7.47 (d, J=8.5 Hz, 2H), 7.51 (d, J=2.1 Hz, 2H), 7.73 (d, J=7.8 Hz, 2H), 7.77 (s, 2H), 7.88 (d, J=7.8 Hz, 2H), 7.99 (d, J=7.9 Hz, 2H).

Synthesis of Compound a-6 (A-5)

Compound a-6 that is the compound represented by formula (F-1) can be produced according to the following reaction formula.

point for 4 hours in a nitrogen atmosphere. Ethyl acetate and water were added to the reaction mixture to separate the organic phase, and the organic phase was washed with water and saturated saline and then concentrated under reduced pressure. The obtained reaction mixture was purified by recrystallization, sublimation purification or the like to obtain Compound a-6 in a yield of 35%. Incidentally, Compound A-5 used in Examples corresponds to this Compound a-6.
$^1$H-NMR (400 MHz, in CDCl$_3$): δ (ppm)=1.32 (s, 18H), 1.60 (s, 12H), 1.76 (s, 12H), 6.29 (d, J=8.6 Hz, 4H), 7.00 (dd, J=8.6, 2.2 Hz, 4H), 7.31 (dd, J=7.9, 1.8 Hz, 2H), 7.43 (d, J=1.6 Hz, 2H), 7.50 (d, J=2.2 Hz, 4H), 7.73 (d, J=7.9, 1.5 Hz, 2H), 7.77 (s, 2H), 7.88 (d, J=7.8 Hz, 2H), 7.97 (d, J=7.9 Hz, 2H).

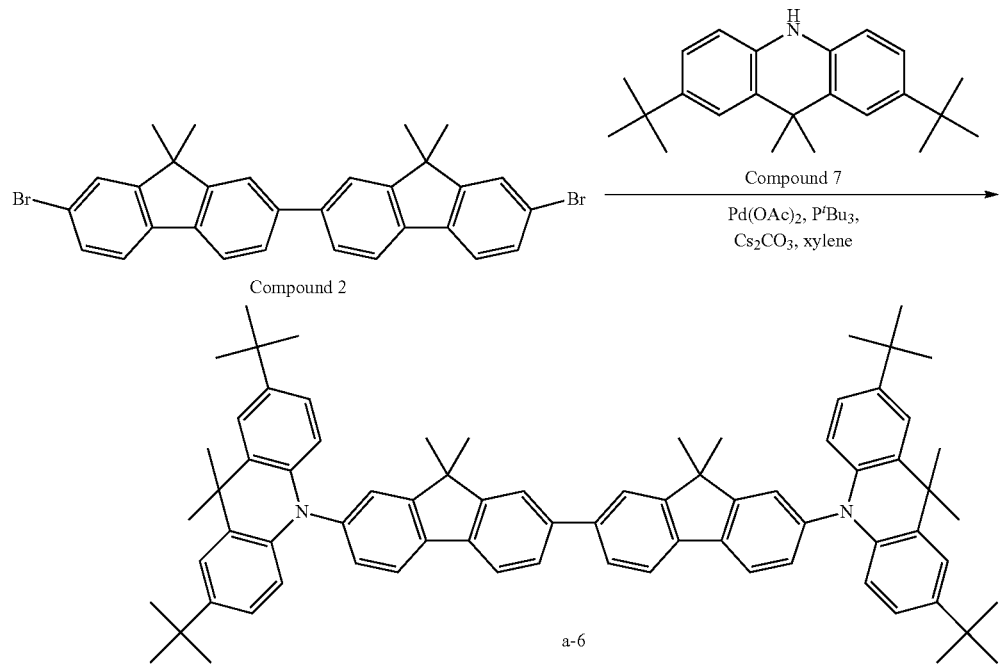

Compound 2 (1.10 g, 2.02 mmol), palladium acetate (22.7 mg, 0.101 mmol), tri(tert-butyl)phosphine (61.3 mg, 0.303 mmol), cesium carbonate (2.63 g, 8.08 mmol) and Compound 7 (1.36 g, 4.24 mmol) were dissolved in 10 ml of xylene, and the reaction was allowed to proceed under reflux at the boiling Synthesis of Compound a-8 (A-6)

Compound a-8 that is the compound represented by formula (F-1) can be produced according to the following reaction formula.

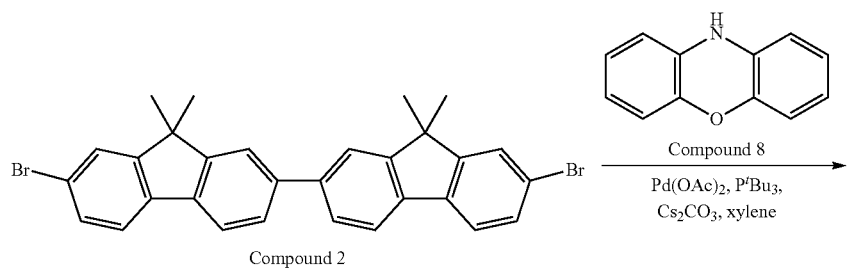

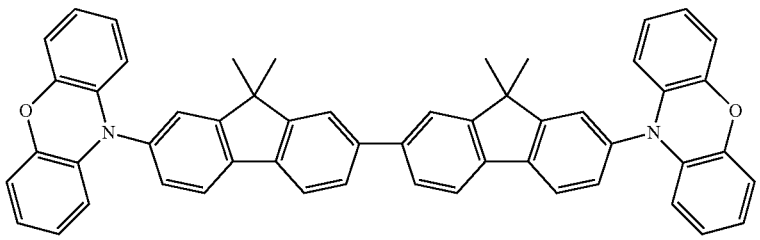

a-8

Compound 2 (1.10 g, 2.02 mmol), palladium acetate (22.7 mg, 0.101 mmol), tri(tert-butyl)phosphine (61.3 mg, 0.303 mmol), cesium carbonate (2.63 g, 8.08 mmol) and Compound 8 (778 mg, 4.24 mmol) were dissolved in 10 ml of xylene, and the reaction was allowed to proceed under reflux at the boiling point for 4 hours in a nitrogen atmosphere. Ethyl acetate and water were added to the reaction mixture to separate the organic phase, and the organic phase was washed with water and saturated saline and then concentrated under reduced pressure. The obtained reaction mixture was purified by recrystallization, sublimation purification or the like to obtain Compound a-8 in a yield of 44%. Incidentally, Compound A-6 used in Examples corresponds to this Compound a-8. $^1$H-NMR (400 MHz, in CDCl$_3$): δ (ppm)=1.59 (s, 12H), 6.02 (d, J=7.2 Hz, 4H), 6.59-6.72 (m, 12H), 7.33 (dd, J=7.9, 1.7 Hz, 2H), 7.44 (d, J=1.5 Hz, 2H), 7.72 (dd, J=7.9, 1.6 Hz, 2H), 7.74 (d, J=1.2 Hz, 2H), 7.86 (d, J=7.8 Hz, 2H), 7.96 (d, J=7.9 Hz, 2H).

Synthesis of Compound a-20

Compound a-20 that is the compound represented by formula (F-1) can be produced according to the following reaction formula.

Compound 2 (1.10 g, 2.02 mmol), palladium acetate (22.7 mg, 0.101 mmol), tri(tert-butyl)phosphine (61.3 mg, 0.303 mmol), cesium carbonate (2.63 g, 8.08 mmol) and Compound 9 (845 mg, 4.24 mmol) were dissolved in 10 ml of xylene, and the reaction was allowed to proceed under reflux at the boiling point for 4 hours in a nitrogen atmosphere. Ethyl acetate and water were added to the reaction mixture to separate the organic phase, and the organic phase was washed with water and saturated saline and then concentrated under reduced pressure. The obtained reaction mixture was purified by recrystallization and sublimation purification to obtain Compound a-20 in a yield of 48%. $^1$H-NMR (400 MHz, in CDCl$_3$): δ (ppm)=1.61 (s, 12H), 6.31 (d, J=8.0, 1.4 Hz, 4H), 6.80-6.89 (m, 8H), 7.04 (dd, J=7.3, 1.8 Hz, 4H), 7.40 (dd, J=7.9, 1.8 Hz, 2H), 7.49 (d, J=1.7 Hz, 2H), 7.72 (dd, J=7.9, 1.6 Hz, 2H), 7.76 (d, J=1.2 Hz, 2H), 7.87 (d, J=7.9 Hz, 2H), 7.98 (d, J=8.0 Hz, 2H).

Synthesis of Compound e-5 (A-13)

Compound e-5 that is the compound represented by formula (F-1) can be produced according to the following reaction formula.

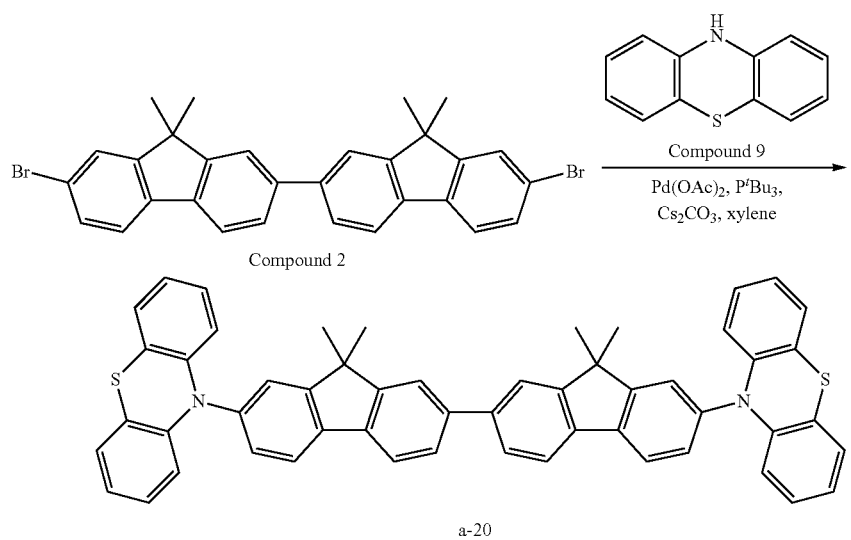

a-20

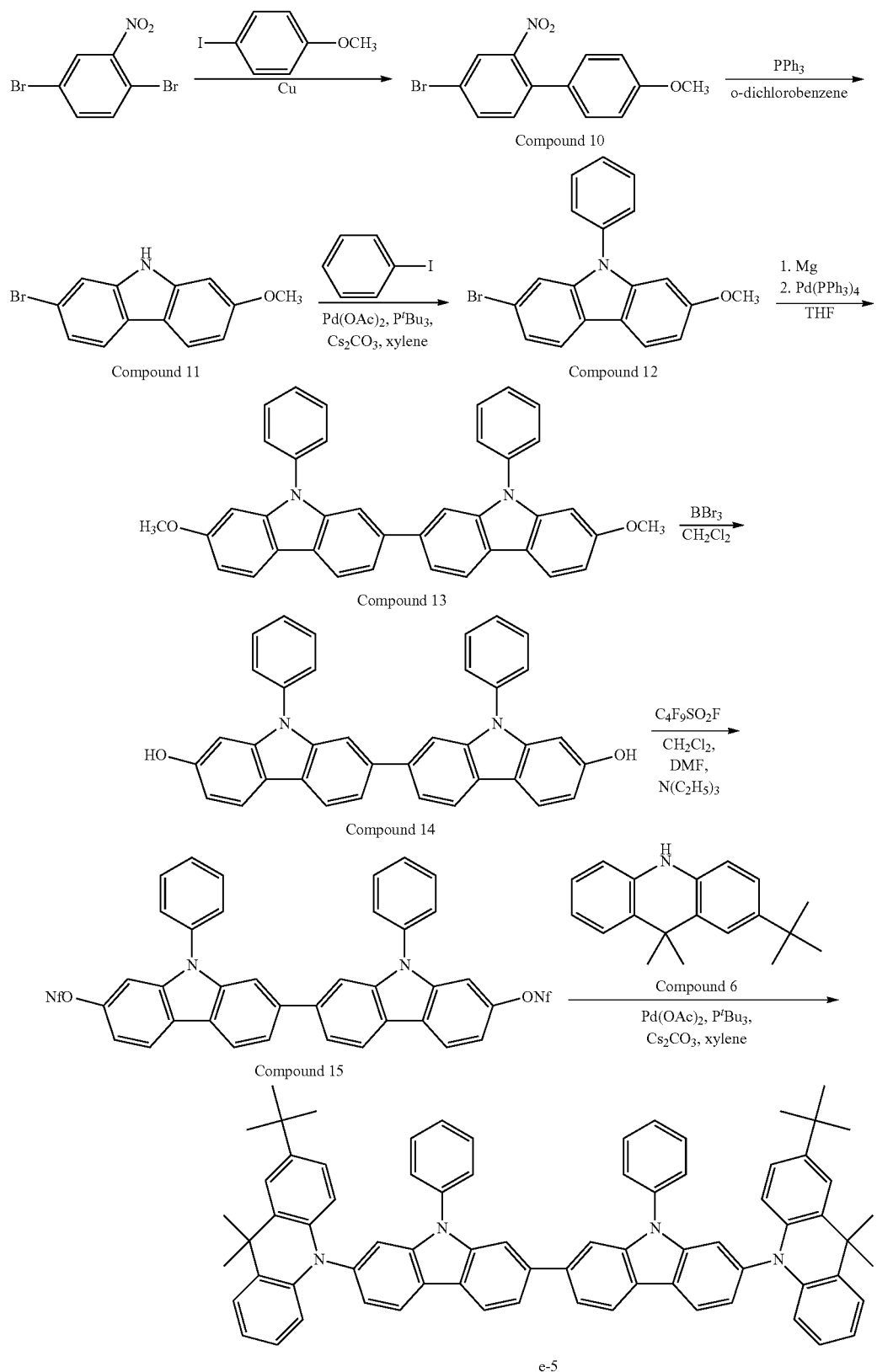
1,4-Dibromo-2-nitrobenzene (23.2 g, 0.0825 mol) and copper powder (15.6 g, 0.248 mol) were added to 4-iodoanisole (25.1 g, 0.107 mol), and the mixture was stirred at 175° C. for 3 hours to obtain Compound 10 in a yield of 44%.

Compound 10 (11.1 g, 36.0 mmol) and triphenylphosphine (23.6 g, 90.0 mmol) were dissolved in 70 ml of o-dichlorobenzene, and the reaction was allowed to proceed under reflux at the boiling point for 5 hours in a nitrogen atmosphere to obtain Compound 11 in a yield of 89%. Compound 11 (4.4 g, 0.15.9 mmol), palladium acetate (89.4 mg, 0.398 mmol), tri(tert-butyl)phosphine (241 mg, 119 mmol), cesium carbonate (15.5 g, 47.7 mmol) and iodotoluene (16.2 g, 79.5 mmol) were dissolved in 86 ml of xylene, and the reaction was allowed to proceed under reflux at the boiling point for 3 hours in a nitrogen atmosphere to synthesize Compound 12 (yield: 52%).

In a nitrogen atmosphere, magnesium (103 mg, 4.24 mmol) was added to 2 ml of THF, and the mixture was refluxed at the boiling point. A 8 ml THF solution of Compound 12 (2.90 g, 8.23 mmol) was added dropwise, and the resulting solution was stirred for 1 hour. Thereafter, tetrakis(triphenylphosphine) palladium (47.6 mg, 0.0412 mmol) was added, and the mixture was refluxed at the boiling point for 2 hours to obtain Compound 13 in a yield of 52%. Compound 13 (1.20 g, 2.20 mmol) was dissolved in 50 ml of methylene chloride and after adding dropwise 5.5 ml of a 1 mol/IBBr$_3$ methylene chloride solution at 0° C. in a nitrogen atmosphere, the reaction was allowed to proceed at room temperature for 3 hours.

After reaction quenching, ethyl acetate and water were added to the reaction mixture to separate the organic phase, and the organic phase was washed with water and saturated saline and then concentrated under reduced pressure. The concentrated reaction mixture dissolved in 30 ml of a mixed solvent of methylene chloride and N,N'-dimethylformamide (1:1) and after adding dropwise perfluorobutanesulfonyl fluoride (1.16 ml, 6.60 mmol) at 5° C. in a nitrogen atmosphere, the reaction was allowed to proceed at room temperature for 3 hours to obtain Compound 15 in a yield of 46%. Compound 15 (1.00 g, 0.925 mmol), palladium acetate (11.3 mg, 0.0463 mmol), tri(tert-butyl)phosphine (28.1 mg, 0.139 mmol), cesium carbonate (1.21 g, 3.70 mmol) and Compound 6 (540 mg, 2.03 mmol) were dissolved in 9 ml of xylene, and the reaction was allowed to proceed under reflux at the boiling point for 4 hours in a nitrogen atmosphere.

Ethyl acetate and water were added to the reaction mixture to separate the organic phase, and the organic phase was washed with water and saturated saline and then concentrated under reduced pressure. The obtained reaction mixture was purified by recrystallization and sublimation purification to obtain Compound e-5 in a yield of 39%. Incidentally, Compound A-13 used in Examples corresponds to this Compound e-5. $^1$H-NMR (400 MHz, in CDCl$_3$): δ (ppm)=1.30 (s, 18H), 1.72 (s, 12H), 6.25 (d, J=8.6 Hz, 2H), 6.30 (dd, J=8.3, 1.4 Hz, 2H), 6.86-6.94 (m, 4H), 6.97 (dd, J=8.9, 2.0 Hz, 2H), 7.23 (dd, J=6.4, 1.8 Hz, 2H), 7.38 (d, J=1.8 Hz, 2H), 7.43-7.49 (m, 6H), 7.57-7.59 (m, 8H), 7.65 (dd, J=8.5, 1.6 Hz, 2H), 7.72 (s, 2H), 8.24 (d, J=8.1 Hz, 2H), 8.37 (d, J=8.2 Hz, 2H).

Example 1

A device in the embodiment shown in FIG. 1A was fabricated. That is, amorphous ITO was deposited on a glass substrate by sputtering to a thickness of 30 nm, thereby forming a lower electrode, and Compound (A-1) was deposited thereon by vacuum heating deposition to a thickness of 100 nm to form an electron blocking layer. Thereafter, a layer formed by co-depositing Compound (1) and fullerene (C$_{60}$) to a thickness of 100 nm and 300 nm, respectively, in terms of a single layer was deposited thereon by vacuum heating deposition in a state of the substrate temperature being controlled to 25° C. to form a photoelectric conversion layer. Here, the vacuum deposition of the photoelectric conversion layer was performed at a vacuum degree of 4×10$^{-4}$ Pa or less.

Furthermore, amorphous ITO was deposited thereon as an upper electrode by sputtering to a thickness of 10 nm to form a transparent electrically conductive film. In this way, a solid-state imaging device having a photoelectric conversion element was fabricated.

Compounds used in Examples are shown below.

A-1

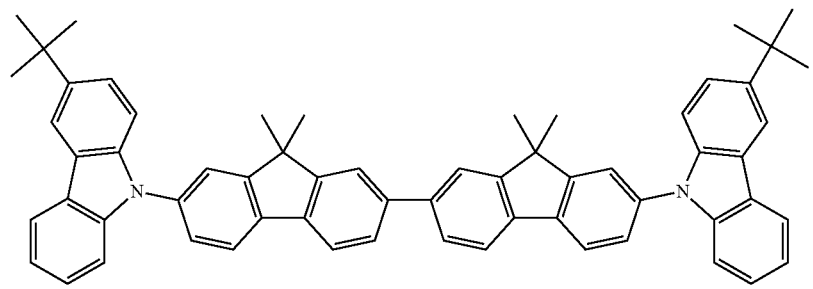

A-2

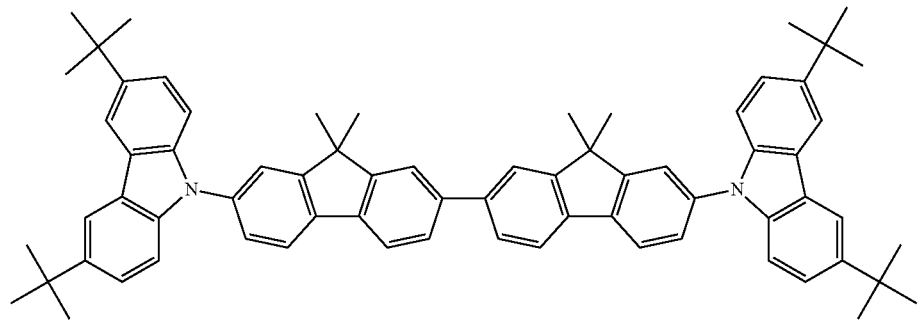

A-3
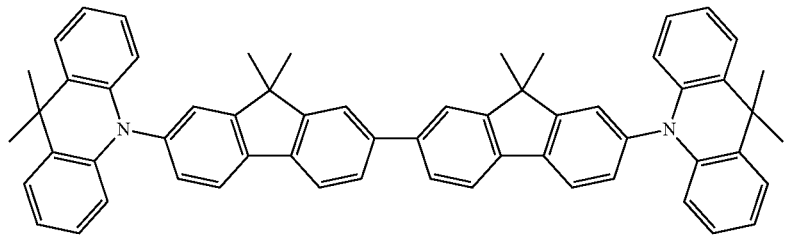
A-4
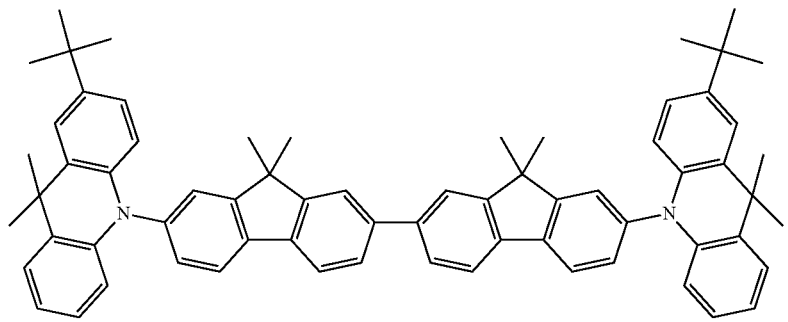
A-5
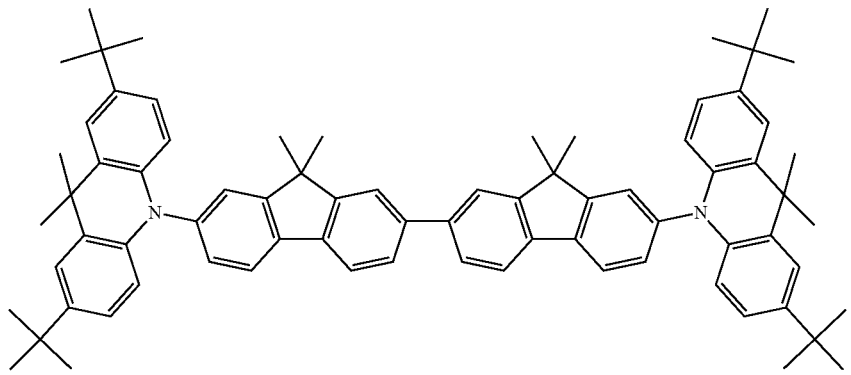
A-6
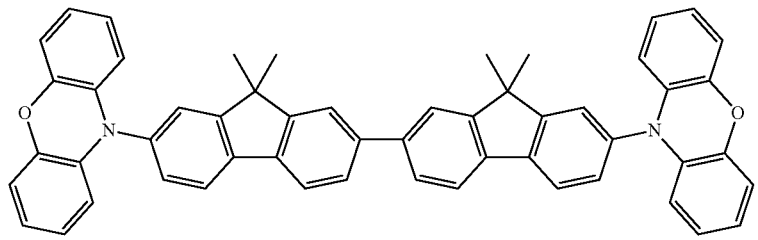
A-7
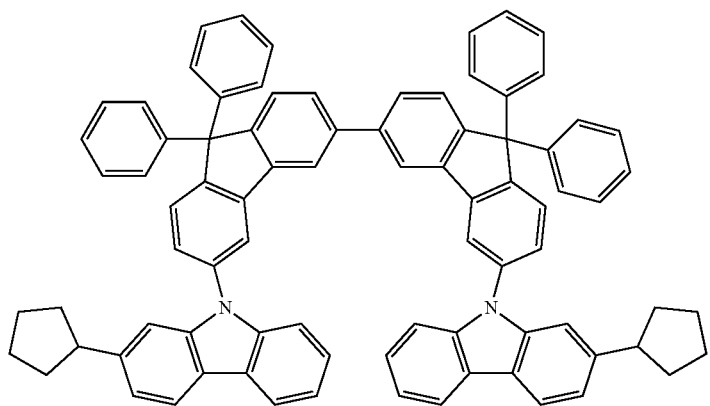

-continued
A-8
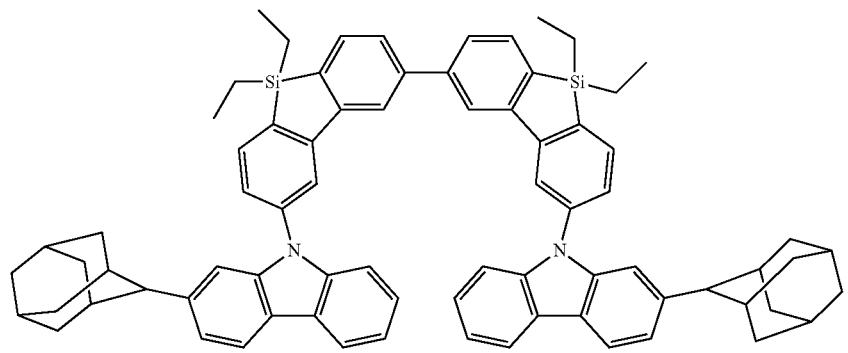
A-9
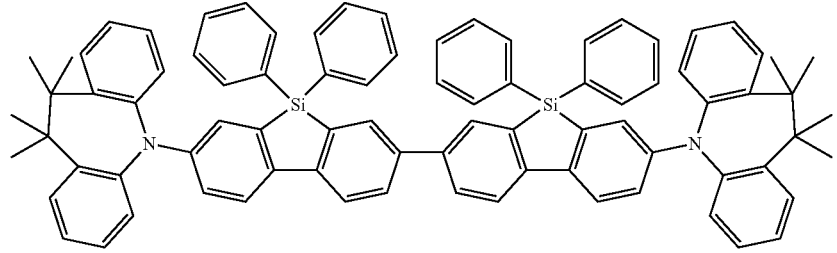
A-10
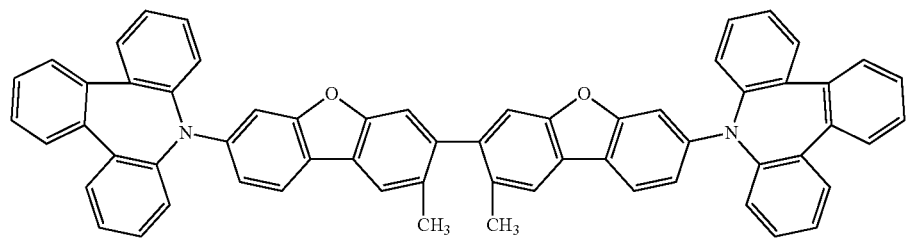
A-11
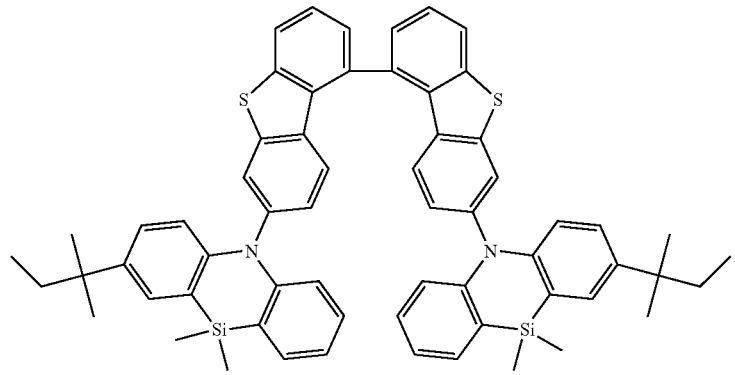
A-12
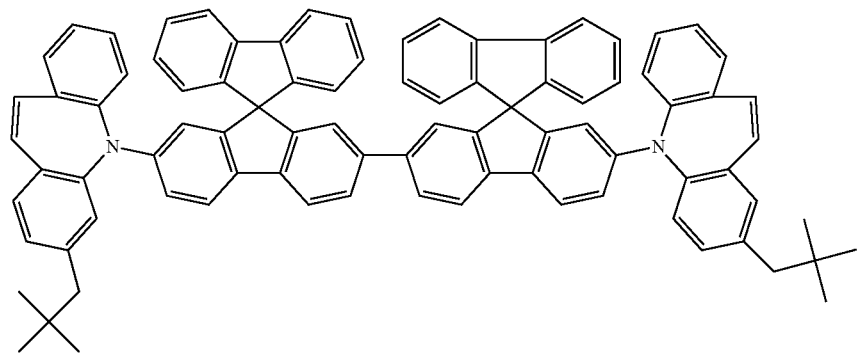

-continued
A-13
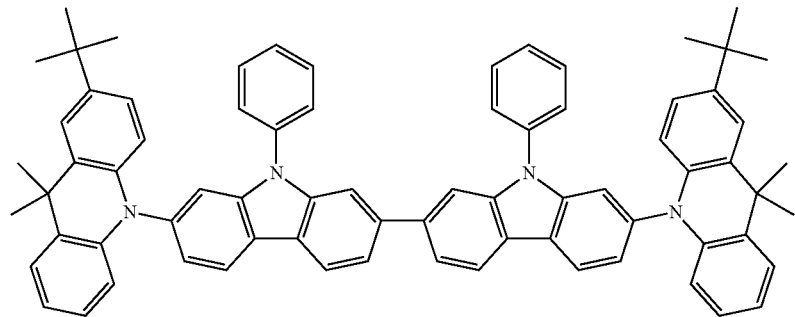
A-14
A-15
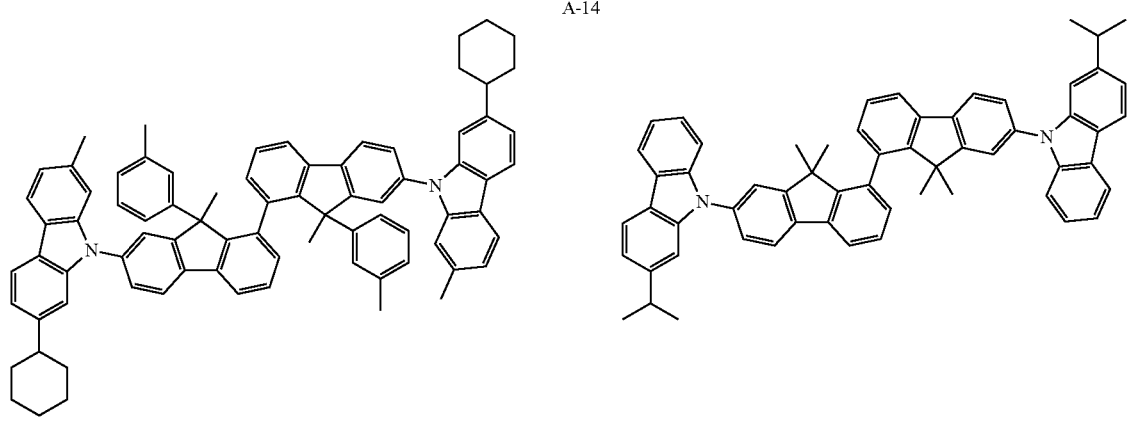
A-16
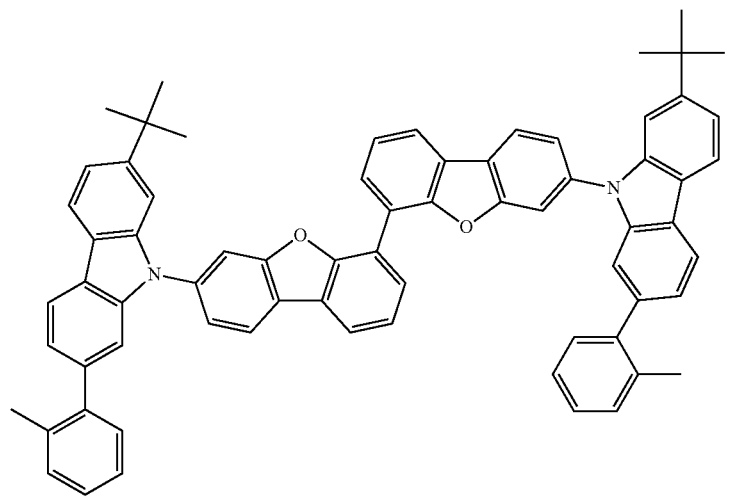
A-17
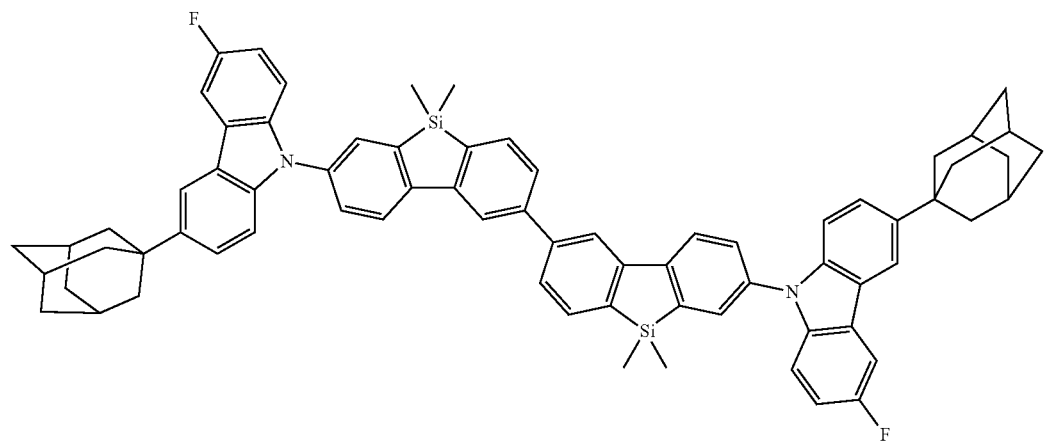

(70)

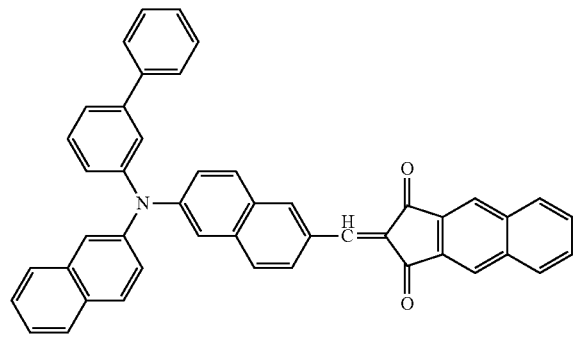

Compound (1)

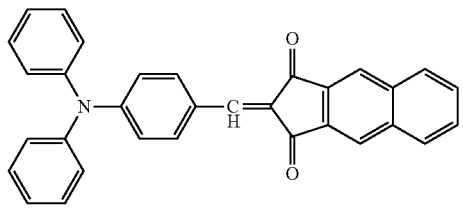

Example 2

A solid-state imaging device having a photoelectric conversion element was fabricated in the same manner as in Example 2 except that the film thickness of Compound (I) was changed to 30 nm.

Examples 3 to 19 and Comparative Examples 1 to 8

Solid-state imaging devices were fabricated in the same manner as in Example 1 except that the compound (A-1) used for the electron blocking layer was changed as shown in Table 1.

[Evaluation]

With respect to each of the devices obtained, whether or not the photoelectric conversion element functions was verified. A voltage was applied to the electrodes 101 and 104 in FIG. 2 of each device such that the electric field intensity became $2.5 \times 10^5$ V/cm, as a result, all devices showed a dark current of 100 nA/cm$^2$ or less in a dark place but exhibited a current of 10 μA/cm$^2$ or more in a bright place, revealing that the photoelectric conversion element functions.

The dark current value (relative value based on Example 1) of each of the devices obtained and the magnitude of increase in the dark current measured after holding each device in an environment of 200° C. and 210° C. for 30 minutes and returning it to room temperature, based on the dark current before heating, are shown in Table 1. Incidentally, the Ip of each material was determined by depositing each material as a single layer film and measuring it by means of AC-2 manufactured by Riken Keiki Co., Ltd., and the Ea was determined by subtracting the energy corresponding to the energy gap from the Ip. An energy-equivalent value of the wavelength at the long-wave end of spectral absorption spectrum of the single layer film above was used as the energy corresponding to the energy gap.

Compounds used in Comparative Examples are shown below.

C-1

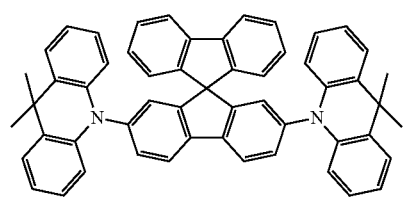

C-2

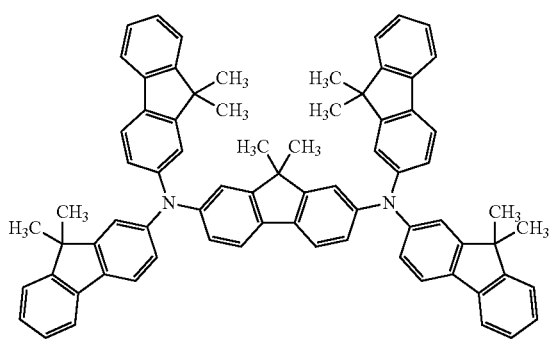

-continued
C-3
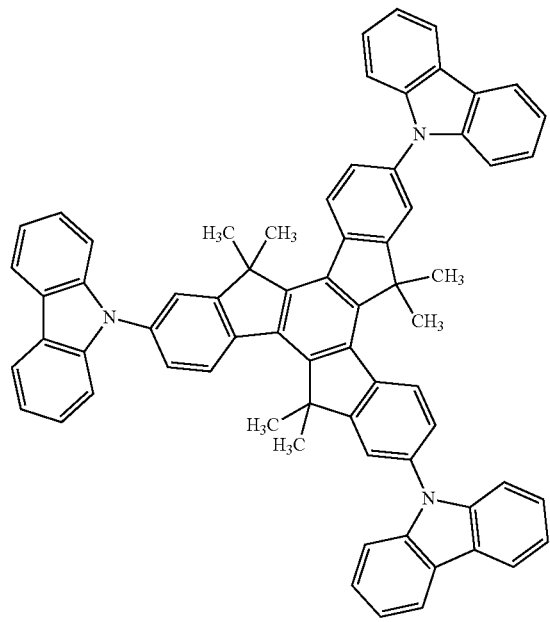
C-4
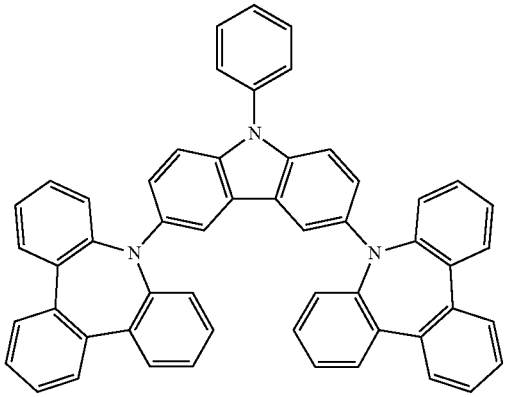
C-5
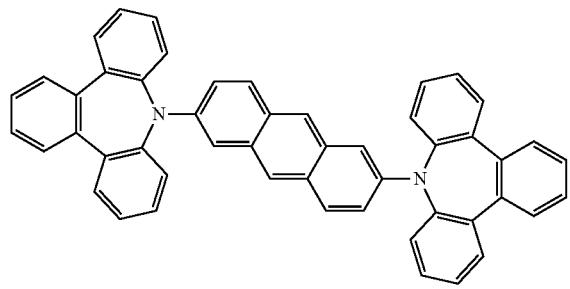
TPD
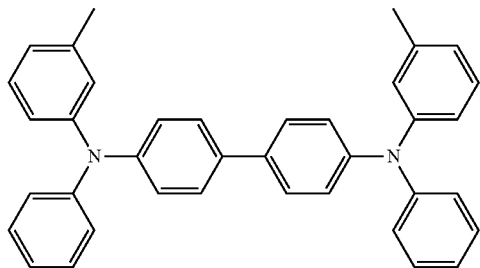
TPF
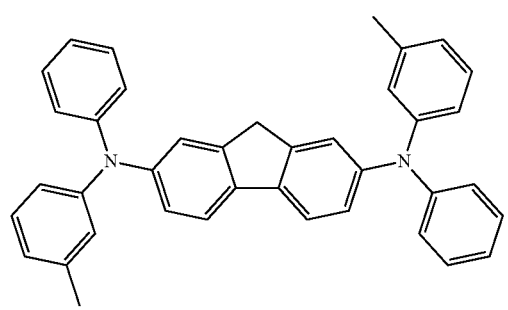
TPTE
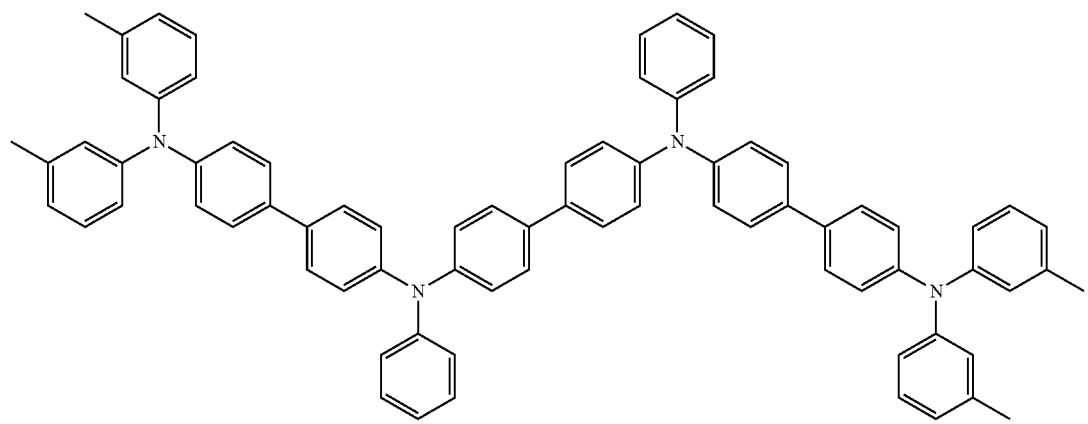

TABLE 1

| | Photoelectric Conversion Material | Electron Blocking Material | | | Dark Current Value (relative value) | Increase of Dark Current After Heating at 200° C. (times) | Increase of Dark Current After Heating at 210° C. (times) |
|---|---|---|---|---|---|---|---|
| | | Compound Species | Ip (ev) | Ea (ev) | | | |
| Example 1 | $C_{60}$/Compound(70) | A-1 | 5.7 | 1.8 | 1 | 0.9 | 3.0 |
| Example 2 | $C_{60}$/Compound(70) | A-1 | 5.7 | 1.8 | 1.5 | 1.3 | 4.8 |
| Example 3 | $C_{60}$/Compound(70) | A-2 | 5.7 | 1.8 | 1.4 | 0.1 | 0.1 |
| Example 4 | $C_{60}$/Compound(70) | A-3 | 5.5 | 1.7 | 1.4 | 0.9 | 2.2 |
| Example 5 | $C_{60}$/Compound(70) | A-4 | 5.5 | 1.7 | 4.2 | 0.1 | 0.12 |
| Example 6 | $C_{60}$/Compound(70) | A-5 | 5.6 | 1.8 | 4.9 | 0.05 | 0.10 |
| Example 7 | $C_{60}$/Compound(70) | A-6 | 5.6 | 1.7 | 3.2 | 1.2 | 2.5 |
| Example 8 | $C_{60}$/Compound(1) | A-6 | 5.6 | 1.7 | 3.8 | 2.1 | 6.2 |
| Example 9 | $C_{60}$/Compound(70) | A-7 | 5.7 | 1.9 | 3.3 | 4.0 | 8.0 |
| Example 10 | $C_{60}$/Compound(70) | A-8 | 5.7 | 1.9 | 0.9 | 0.8 | 1.1 |
| Example 11 | $C_{60}$/Compound(70) | A-9 | 5.5 | 1.8 | 5 | 2.1 | 7.2 |
| Example 12 | $C_{60}$/Compound(70) | A-10 | 5.6 | 1.8 | 2.7 | 2.9 | 5.5 |
| Example 13 | $C_{60}$/Compound(70) | A-11 | 5.7 | 1.7 | 1.9 | 1.6 | 3.3 |
| Example 14 | $C_{60}$/Compound(70) | A-12 | 5.7 | 1.8 | 4.7 | 0.8 | 3.4 |
| Example 15 | $C_{60}$/Compound(70) | A-13 | 5.5 | 2.1 | 3.9 | 1.3 | 2.2 |
| Example 16 | $C_{60}$/Compound(70) | A-14 | 5.7 | 1.8 | 1.4 | 1.1 | 4.5 |
| Example 17 | $C_{60}$/Compound(70) | A-15 | 5.7 | 1.8 | 1.5 | 1.2 | 5.6 |
| Example 18 | $C_{60}$/Compound(70) | A-16 | 5.7 | 2.0 | 1.5 | 2.2 | 5.8 |
| Example 19 | $C_{60}$/Compound(70) | A-17 | 5.8 | 2.0 | 0.8 | 1.83 | 8.3 |
| Comparative Example 1 | $C_{60}$/Compound(70) | TPD | 5.5 | 2.3 | 1.5 | 8000 | 20000 |
| Comparative Example 2 | $C_{60}$/Compound(70) | TPF | 5.1 | 1.9 | 50 | 300 | 750 |
| Comparative Example 3 | $C_{60}$/Compound(70) | TPTE | 5.2 | 2.2 | 3 | 500 | 900 |
| Comparative Example 4 | $C_{60}$/Compound(70) | C-1 | 5.6 | 2.4 | 10 | 50 | 100 |
| Comparative Example 5 | $C_{60}$/Compound(70) | C-2 | 5.1 | 2.1 | 50 | 2 | 10 |
| Comparative Example 6 | $C_{60}$/Compound(70) | C-3 | 5.8 | 2.8 | 30 | 0.9 | 3 |
| Comparative Example 7 | $C_{60}$/Compound(70) | C-4 | 4.9 | 2.1 | 7.0 | 5.3 | 31 |
| Comparative Example 8 | $C_{60}$/Compound(70) | C-5 | 4.9 | 2.4 | 65 | 8.1 | 20 |

It is seen that in Examples 1 to 19, the increase of the dark current after heating is small and the heat resistance is high compared with Comparative Examples 1 to 8. As compared with Comparative Examples 5 and 6, the relative value of dark current is small.

Furthermore, the same imaging device as the embodiment shown in FIG. 2 was fabricated. That is, amorphous ITO was deposited on a CMOS substrate by sputtering to a thickness of 30 nm and patterned by photolithography so that one pixel could be present for each photodiode (PD) on the CMOS substrate, thereby forming a lower electrode. Deposition of the electron blocking material and subsequent operations were performed in the same manner as in Examples 1 to 19 and Comparative Examples 1 to 8 to fabricate imaging devices. Evaluations thereof were also performed in the same manner, and the same results as in Table 1 were obtained. It was verified that also in an imaging device, the element based on Examples of the present invention exhibits a small dark current after heating and high heat resistance.

INDUSTRIAL APPLICABILITY

A photoelectric conversion element capable of functioning as a photoelectric conversion element when a compound having a specific structure is applied to the photoelectric conversion element, causing the element to exhibit a low dark current, and reducing the range of increase in the dark current even when the element is heat-treated, and an imaging device equipped with such a photoelectric conversion element, can be provided.

While the invention has been described in detail and with reference to specific embodiments thereof, it will be apparent to one skilled in the art that various changes and modifications can be made therein without departing from the spirit and scope of the invention.

This application is based on Japanese Patent Application (Patent Application No. 2009-134017) filed on Jun. 3, 2009, Japanese Patent Application (Patent Application No. 2010-17477) filed on Jan. 28, 2010, and Japanese Patent Application (Patent Application No. 2010-84412) filed on Mar. 31, 2010, the contents of which are incorporated herein by way of reference.

DESCRIPTION OF REFERENCE NUMERALS AND SIGNS

11 Lower electrode (electrically conductive film)
12 Photoelectric conversion layer (photoelectric conversion film)
15 Upper electrode (transparent electrically conductive film)
16A Electron blocking layer
16B Hole blocking layer
100, 200, 300, 400 Imaging device

The invention claimed is:

1. A photoelectric conversion element having a photoelectric conversion film which is sandwiched between a transparent electrically conductive film and an electrically conductive film and comprises a photoelectric conversion layer and an electron blocking layer, wherein said electron blocking layer comprises a compound represented by the following formula (F-1):

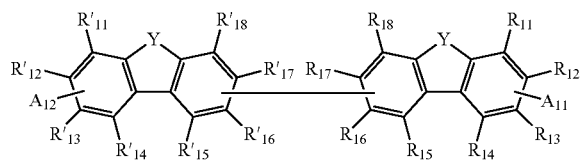
(F-1)

wherein each of $R_{11}$ to $R_{18}$ and $R'_{11}$ to $R'_{18}$ independently represents a hydrogen atom, a halogen atom, an alkyl group, an aryl group, a heterocyclic group, a hydroxyl group, an amino group or a mercapto group, which may further have a substituent, any one of $R_{15}$ to $R_{18}$ is connected to any one of $R'_{15}$ to $R'_{18}$ through a single bond, each of $A_{11}$ and $A_{12}$ independently represents a substituent represented by the following formula (A-1) and substitutes as any one of $R_{11}$ to $R_{14}$ and $R'_{11}$ to $R'_{14}$, and each Y independently represents a carbon atom, a nitrogen atom, an oxygen atom, a sulfur atom or a silicon atom, which may further have a substituent;

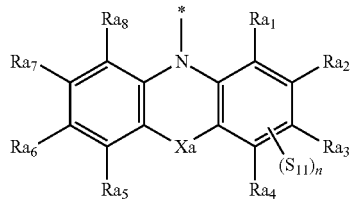
Formula (A-1)

wherein each of $Ra_1$ to $Ra_8$ independently represents a hydrogen atom, a halogen atom, an alkyl group, an aryl group or a heterocyclic group, which may further have a substituent, * represents the bonding position, Xa represents a single bond, an oxygen atom, a sulfur atom, an alkylene group, a silylene group, an alkenylene group, a cycloalkylene group, a cycloalkenylene group, an arylene group, a divalent heterocyclic group or an imino group, which may further have a substituent, each $S_{11}$ independently represents the following substituent $(S_{11})$ and substitutes as any one of $Ra_1$ to $Ra_8$, and each n independently represents an integer of 0 to 4;

Substituent $(S_{11})$

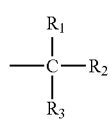

wherein each of $R_1$ to $R_3$ independently represents a hydrogen atom or an alkyl group.

2. The photoelectric conversion element as claimed in claim 1, wherein said compound represented by formula (F-1) is a compound represented by the following formula (F-2):

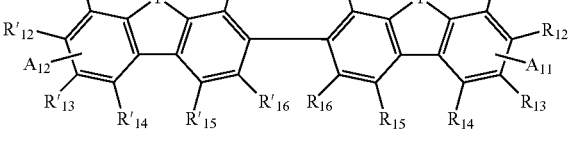
(F-2)

wherein each of $R_{11}$ to $R_{16}$, $R_{18}$, $R'_{11}$ to $R'_{16}$ and $R'_{18}$ independently represents a hydrogen atom, a halogen atom, an alkyl group, an aryl group, a heterocyclic group, a hydroxyl group, an amino group or a mercapto group, which may further have a substituent, each of $A_{11}$ and $A_{12}$ independently represents a substituent represented by the formula (A-1) and substitutes as any one of $R_{11}$ to $R_{14}$ and $R'_{11}$ to $R'_{14}$, and each Y independently represents a carbon atom, a nitrogen atom, an oxygen atom, a sulfur atom or a silicon atom, which may further have a substituent.

3. The photoelectric conversion element as claimed in claim 1, wherein in the formula (F-1) or the formula (F-2), the substituent represented by formula (A-1) substitutes on each of $R_{12}$ and $R'_{12}$ independently.

4. The photoelectric conversion element as claimed in claim 1, wherein in the formula (A-1), n represents an integer of 0 to 2.

5. The photoelectric conversion element as claimed in claim 1, wherein in the formula (A-1), at least either one of $Ra_3$ and $Ra_6$ each independently represents said substituent $(S_{11})$.

6. The photoelectric conversion element as claimed in claim 1, wherein in the formula (F-1) or the formula (F-2), Y represents —N($R_{20}$)—, wherein each $R_{20}$ independently represents an alkyl group, an aryl group or a heterocyclic group, which may further have a substituent.

7. The photoelectric conversion element as claimed in claim 1, wherein in the formula (F-1) or the formula (F-2), Y represents —C($R_{21}$)($R_{22}$)—, wherein each of $R_{21}$ and $R_{22}$ independently represents an alkyl group, an aryl group or a heterocyclic group, which may further have a substituent.

8. The photoelectric conversion element as claimed in claim 1, wherein ionization potential (Ip) of the compounds represented by formulae (F-1) and (F-2) is from 4.9 to 5.8 eV.

9. The photoelectric conversion element as claimed in claim 1, wherein molecular weight of the compounds represented by formulae (F-1) and (F-2) is from 500 to 2,000.

10. The photoelectric conversion element as claimed in claim 1, wherein said photoelectric conversion layer comprises an n-type organic semiconductor.

11. The photoelectric conversion element as claimed in claim 10, wherein said n-type organic semiconductor is a fullerene or a fullerene derivative.

12. The photoelectric conversion element as claimed in claim 1, wherein said photoelectric conversion film comprises a compound of the following formula (I):

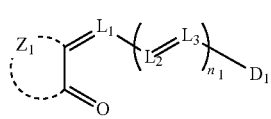
Formula (I)

wherein $Z_1$ represents an atomic group necessary for forming a 5- or 6-membered ring, each of $L_1$, $L_2$ and $L_3$ represents an unsubstituted methine group or a substituted methine group, $D_1$ represents an atomic group, and $n_1$ represents an integer of 0 or more.

13. The photoelectric conversion element as claimed in claim 1, wherein the electrically conductive film, the electron blocking layer, the photoelectric conversion layer and the transparent electrically conductive film are stacked in this order.

14. A method for producing the photoelectric conversion element claimed in claim 1, comprising a step of depositing each of said photoelectric conversion layer and said electron blocking layer by vacuum heating deposition.

15. A photosensor comprising the photoelectric conversion element claimed in claim 1.

16. An imaging device comprising the photoelectric conversion element claimed in claim 1.

17. A method for driving the photoelectric conversion element claimed in claim 1, comprising applying a voltage by using an electrode in contact with said electron blocking layer as a cathode and another electrode as an anode.

18. A compound represented by the following formula (F-1):

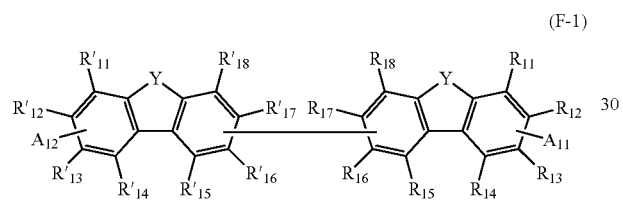

(F-1)

wherein each of $R_{11}$ to $R_{18}$ and $R'_{11}$ to $R'_{18}$ independently represents a hydrogen atom, a halogen atom, an alkyl group, an aryl group, a heterocyclic group, a hydroxyl group, an amino group or a mercapto group, which may further have a substituent, any one of $R_{15}$ to $R_{18}$ is connected to any one of $R'_{15}$ to $R'_{18}$ through a single bond, each of $A_{11}$ and $A_{12}$ independently represents a substituent represented by the following formula (A-1) and substitutes as any one of $R_{11}$ to $R_{14}$ and $R'_{11}$ to $R'_{14}$, and each Y independently represents a carbon atom, a nitrogen atom, an oxygen atom, a sulfur atom or a silicon atom, which may further have a substituent;

Formula (A-1)

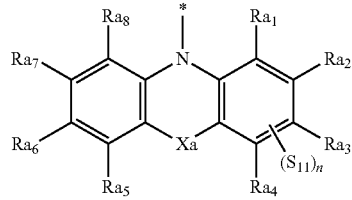

wherein each of $Ra_1$ to $Ra_8$ independently represents a hydrogen atom, a halogen atom, an alkyl group, an aryl group or a heterocyclic group, which may further have a substituent, * represents the bonding position, Xa represents a single bond, an oxygen atom, a sulfur atom, an alkylene group, a silylene group, an alkenylene group, a cycloalkylene group, a cycloalkenylene group, an arylene group, a divalent heterocyclic group or an imino group, which may further have a substituent, each $S_{11}$ independently represents the following substituent ($S_{11}$) and substitutes as any one of $Ra_1$ to $Ra_8$, and n represents an integer of 0 to 4;

Substituent ($S_{11}$)

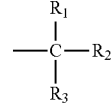

wherein each of $R_1$ to $R_3$ independently represents a hydrogen atom or an alkyl group.

* * * * *